(12) United States Patent  
Godo et al.

(10) Patent No.: US 11,985,827 B2  
(45) Date of Patent: May 14, 2024

(54) SEMICONDUCTOR DEVICE, DRIVING METHOD OF SEMICONDUCTOR DEVICE, AND ELECTRONIC DEVICE

(71) Applicant: Semiconductor Energy Laboratory Co., Ltd., Atsugi (JP)

(72) Inventors: Hiromichi Godo, Isehara (JP); Hitoshi Kunitake, Isehara (JP); Kazuki Tsuda, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 131 days.

(21) Appl. No.: 17/790,517

(22) PCT Filed: Jan. 6, 2021

(86) PCT No.: PCT/IB2021/050053  
§ 371 (c)(1),  
(2) Date: Jul. 1, 2022

(87) PCT Pub. No.: WO2021/144661  
PCT Pub. Date: Jul. 22, 2021

(65) Prior Publication Data  
US 2023/0044659 A1 Feb. 9, 2023

(30) Foreign Application Priority Data

Jan. 17, 2020 (JP) .................................. 2020-005825  
Feb. 5, 2020 (JP) .................................. 2020-017652

(51) Int. Cl.  
*H10B 43/27* (2023.01)  
*G11C 16/00* (2006.01)  
(Continued)

(52) U.S. Cl.  
CPC .......... *H10B 43/27* (2023.02); *G11C 16/0483* (2013.01); *G11C 16/08* (2013.01); *H10B 41/27* (2023.02)

(58) Field of Classification Search  
None  
See application file for complete search history.

(56) References Cited

U.S. PATENT DOCUMENTS 7,936,004 B2 5/2011 Kito et al.  
8,551,838 B2 10/2013 Kito et al.  
(Continued)

FOREIGN PATENT DOCUMENTS

JP 2007-266143 A 10/2007  
JP 2015-056443 A 3/2015  
(Continued)

OTHER PUBLICATIONS

International Search Report (Application No. PCT/IB2021/050053) dated Apr. 13, 2021.  
(Continued)

*Primary Examiner* — Tan T. Nguyen  
(74) *Attorney, Agent, or Firm* — Eric J. Robinson; Robinson Intellectual Property Law Office, P.C.

(57) ABSTRACT

A novel semiconductor device is provided. A memory string, which extends in the Z direction and includes a conductor and an oxide semiconductor, intersects with a plurality of wirings CG extending in the Y direction. The conductor is placed along a center axis of the memory string, and the oxide semiconductor is concentrically placed outside the conductor. The conductor is electrically connected to the oxide semiconductor. An intersection portion of the memory string and the wiring CG functions as a transistor. In addition, the intersection portion functions as a memory cell.

22 Claims, 49 Drawing Sheets

(51) Int. Cl.
*G11C 16/04* (2006.01)
*G11C 16/08* (2006.01)
*H10B 41/27* (2023.01)

(56) References Cited

U.S. PATENT DOCUMENTS

| | | | |
|---|---|---|---|
| 8,569,823 | B2 | 10/2013 | Ino et al. |
| 9,064,735 | B2 | 6/2015 | Kito et al. |
| 9,064,969 | B2 | 6/2015 | Konno et al. |
| 9,748,260 | B2 | 8/2017 | Kito et al. |
| 10,211,219 | B2 | 2/2019 | Kito et al. |
| 10,593,693 | B2 | 3/2020 | Yamazaki et al. |
| 10,916,559 | B2 | 2/2021 | Kito et al. |
| 11,011,542 | B2 | 5/2021 | Yamazaki et al. |
| 11,133,336 | B2 | 9/2021 | Yakubo. et al. |
| 11,362,106 | B2 | 6/2022 | Kito et al. |
| 11,374,021 | B2 | 6/2022 | Kito et al. |
| 2012/0068250 | A1 | 3/2012 | Ino et al. |
| 2015/0371997 | A1* | 12/2015 | Higuchi ............ H10B 41/27 257/315 |
| 2016/0351576 | A1 | 12/2016 | Yamazaki et al. |
| 2019/0006386 | A1 | 1/2019 | Yamazaki et al. |
| 2020/0144308 | A1 | 5/2020 | Yakubo. et al. |
| 2020/0176473 | A1 | 6/2020 | Yamazaki et al. |
| 2021/0057446 | A1* | 2/2021 | Sawabe ............ H10B 43/27 |
| 2021/0242220 | A1 | 8/2021 | Yamazaki et al. |
| 2021/0280598 | A1* | 9/2021 | Nagashima .......... G03B 17/561 |
| 2021/0366926 | A1 | 11/2021 | Yamazaki et al. |

FOREIGN PATENT DOCUMENTS

| | | |
|---|---|---|
| JP | 2016-225614 A | 12/2016 |
| JP | 2019-012822 A | 1/2019 |
| JP | 2019-201214 A | 11/2019 |
| WO | WO-2010/106922 | 9/2010 |
| WO | WO-2019/003042 | 1/2019 |

OTHER PUBLICATIONS

Written Opinion (Application No. PCT/IB2021/050053) dated Apr. 13, 2021.

* cited by examiner

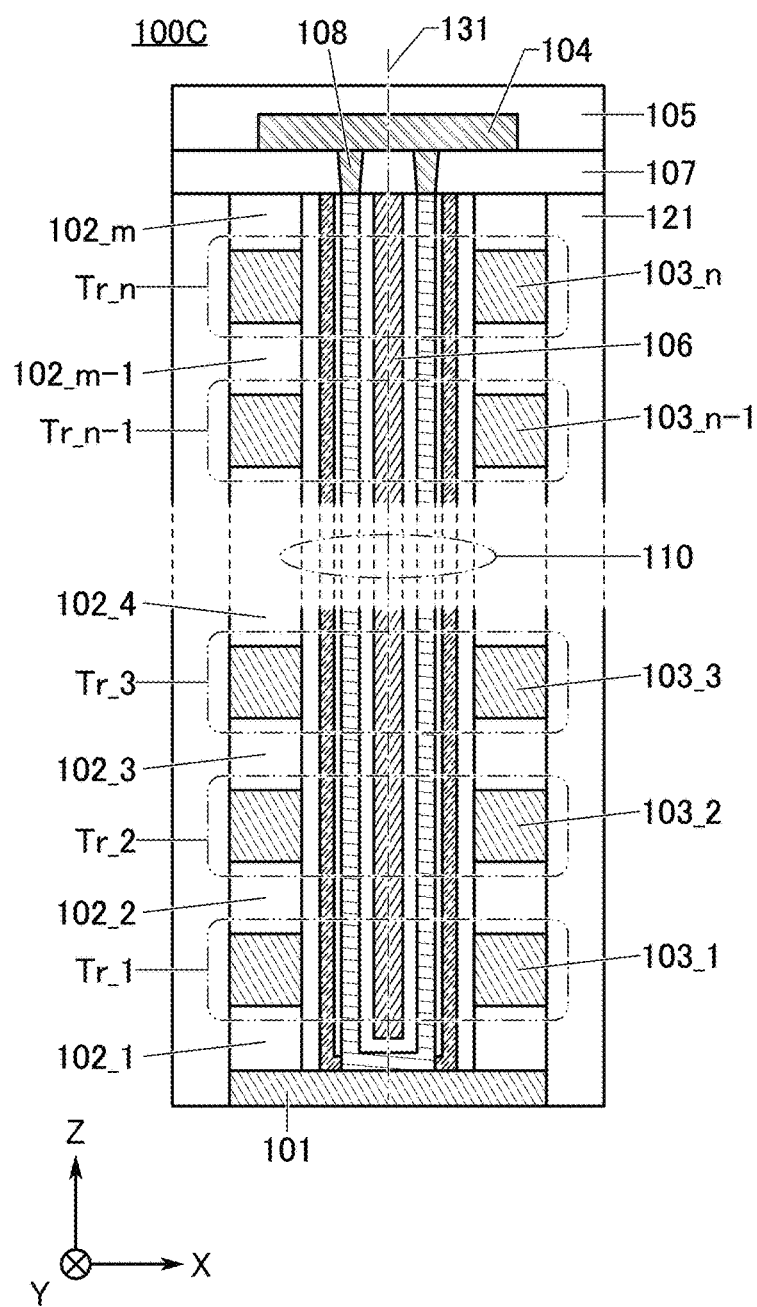
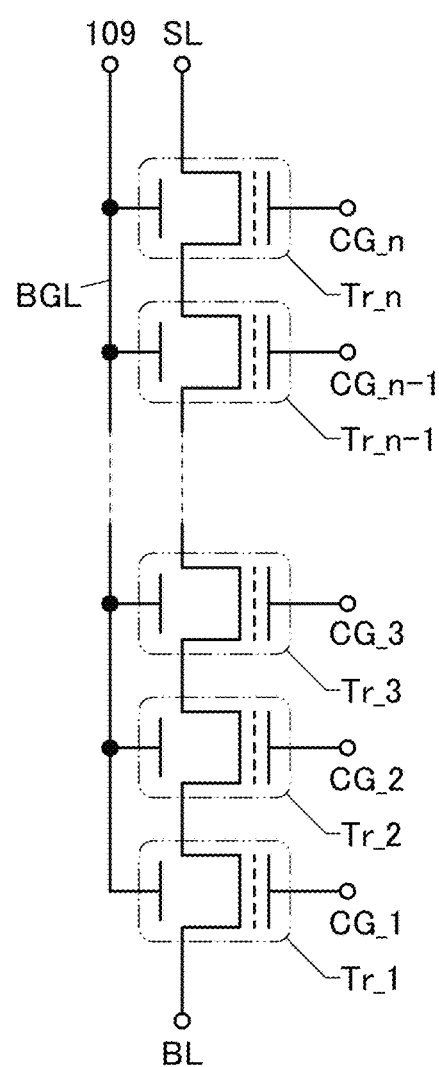

FIG. 11A
Intermediate state
New crystalline phase
| Amorphous | Crystalline | Crystal |
|---|---|---|
| ・completely amorphous | ・CAAC<br>・nc<br>・CAC<br><br>excluding single crystal and poly crystal | ・single crystal<br>・poly crystal |
FIG. 11B
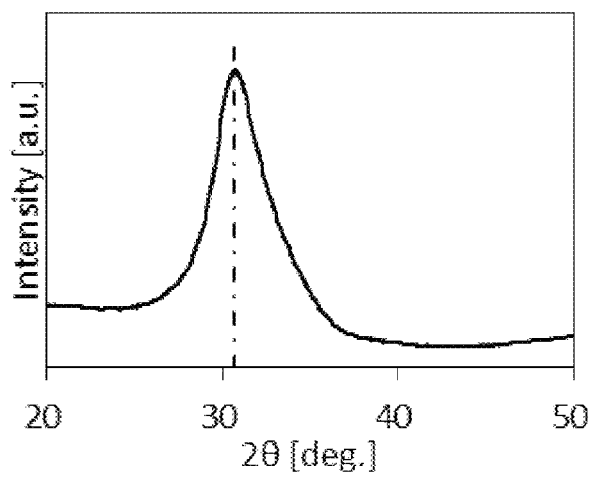
FIG. 11C
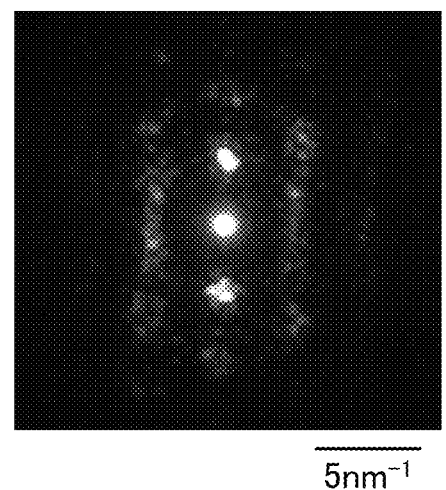

1150C

1150C

SEMICONDUCTOR DEVICE, DRIVING METHOD OF SEMICONDUCTOR DEVICE, AND ELECTRONIC DEVICE

TECHNICAL FIELD

One embodiment of the present invention relates to a semiconductor device and an electronic device.

Note that one embodiment of the present invention is not limited to the above technical field. The technical field of the invention disclosed in this specification and the like relates to an object, a method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display device, a liquid crystal display device, a light-emitting device, a power storage device, an imaging device, a memory device, a signal processing device, a processor, an electronic device, a system, a driving method thereof, a manufacturing method thereof, or a testing method thereof.

BACKGROUND ART

NAND flash memories have become widespread as large-capacity memory devices used in computers. In recent years, techniques of increasing the integration degree of NAND flash memories by placing memory cells three-dimensionally have become widespread (Patent Document 1). In this specification and the like, a NAND flash memory where memory cells are placed three-dimensionally is referred to as "3D-NAND."

Polycrystalline silicon is used for body portions of 3D-NAND memory strings in many cases. However, Patent Document 2 discloses an example in which an oxide semiconductor is used for a body portion of a memory string. Note that the body portion here refers to a channel of a transistor that forms the memory string or a semiconductor layer that functions as a source/drain.

REFERENCES

Patent Documents

[Patent Document 1] Japanese Published Patent Application No. 2007-266143
[Patent Document 2] Japanese Published Patent Application No. 2016-225614

SUMMARY OF THE INVENTION

Problems to be Solved by the Invention

An erase operation of 3D-NAND is performed by feeding holes to a body portion. As methods for feeding holes to a body portion, Patent Document 1 discloses (1) a method for generating holes by GIDL (Gate Induced Drain Leak), (2) a method for injecting holes from a P-well of a semiconductor substrate, and (3) a method for injecting holes from a contact layer formed using p-type polysilicon.

However, in the case where an oxide semiconductor is used for the body portion, none of the methods (1) to (3) can be used. For example, the method (1) cannot be used because the oxide semiconductor has a wide bandgap and GIDL is not generated. In addition, the methods (2) and (3) cannot be used because an energy barrier when holes are injected from p-type polysilicon into the oxide semiconductor is high. Accordingly, only simple replacement from polysilicon to the oxide semiconductor in the body portion fails to enable an erase operation of 3D-NAND.

An object of one embodiment of the present invention is to provide a novel memory device. Another object of one embodiment of the present invention is to provide a memory device that operates at high speed. Another object of one embodiment of the present invention is to provide a highly reliable memory device. Another object of one embodiment of the present invention is to provide a memory device with high memory capacity. Another object of one embodiment of the present invention is to provide a novel semiconductor device. Another object of one embodiment of the present invention is to provide a semiconductor device that operates at high speed. Another object of one embodiment of the present invention is to provide a highly reliable semiconductor device. Another object of one embodiment of the present invention is to provide a semiconductor device with high memory capacity.

Note that the objects of one embodiment of the present invention are not limited to the objects listed above. The objects listed above do not preclude the existence of other objects. Note that the other objects are objects that are not described in this section and are described below. The objects that are not described in this section will be derived from the description of the specification, the drawings, and the like and can be extracted as appropriate from the description by those skilled in the art. Note that one embodiment of the present invention achieves at least one of the objects listed above and the other objects. Note that one embodiment of the present invention does not necessarily achieve all the objects listed above and the other objects.

Means for Solving the Problems (1) One embodiment of the present invention is a semiconductor device that includes a first conductor extending in a first direction and a structure body extending in a second direction. The structure body includes a second conductor, an oxide semiconductor, a functional layer, a first insulator, a second insulator, and a third insulator. The second conductor is electrically connected to the oxide semiconductor. In an intersection portion of the first conductor and the structure body, the first insulator, the oxide semiconductor, the second insulator, the functional layer, and the third insulator are concentrically placed outside the second conductor. In the intersection portion, the third insulator is thicker than the second insulator.

(2) Another embodiment of the present invention is the semiconductor device that includes n-layers first conductors (n is an integer greater than or equal to 2) extending in a first direction and a structure body extending in a second direction. The structure body includes a second conductor, an oxide semiconductor, a functional layer, a first insulator, a second insulator, and a third insulator. The second conductor is electrically connected to the oxide semiconductor. In each of intersection portions of the n-layer first conductors and the structure body, the first insulator, the oxide semiconductor, the second insulator, the functional layer, and the third insulator are concentrically placed outside the second conductor. In each of the intersection portions, the third insulator is thicker than the second insulator.

The first direction is a direction orthogonal to the second direction. The intersection portion can function as a transistor. The intersection portion can function as a memory cell.

The functional layer can function as a charge accumulation layer. For the functional layer, an insulator or a semiconductor can be used. In the case where an insulator is used for the functional layer, for example, an insulator containing nitrogen and silicon is used. In the case where a semiconductor is used for the functional layer, for example, a semiconductor containing silicon is used. The oxide semiconductor preferably contains at least one of indium and zinc.

Another embodiment of the present invention is a driving method of the semiconductor device according to the above (2). The driving method of the semiconductor device includes a first operation of supplying a first potential to the n-layer first conductors and supplying a second potential to the second conductor and a second operation of supplying a third potential to an i-th-layer first conductor (i is an integer greater than or equal to 1 and less than or equal to n), supplying a fourth potential to each of the first conductors excluding the i-th-layer first conductor, and supplying the first potential to the second conductor. The second operation is performed after the first operation.

A potential difference between the first potential and the second potential is preferably greater than or equal to 2 times and less than or equal to 6 times a potential difference between the first potential and the fourth potential. A potential difference between the first potential and the third potential is preferably greater than or equal to 2 times and less than or equal to 4 times the potential difference between the first potential and the fourth potential.

Effect of the Invention

One embodiment of the present invention can provide a novel memory device. Alternatively, one embodiment of the present invention can provide a memory device that operates at high speed. Alternatively, one embodiment of the present invention can provide a highly reliable memory device. Alternatively, one embodiment of the present invention can provide a memory device with high memory capacity. Alternatively, one embodiment of the present invention can provide a novel semiconductor device. Alternatively, one embodiment of the present invention can provide a semiconductor device that can operate at high speed.

Alternatively, a highly reliable semiconductor device can be provided. Alternatively, one embodiment of the present invention can provide a semiconductor device with high memory capacity.

Note that the effects of one embodiment of the present invention are not limited to the effects listed above. The effects listed above do not preclude the existence of other effects. Note that the other effects are effects that are not described in this section and will be described below. The effects that are not described in this section will be derived from the description of the specification, the drawings, and the like and can be extracted as appropriate from the description by those skilled in the art. Note that one embodiment of the present invention has at least one of the effects listed above and the other effects. Accordingly, depending on the case, one embodiment of the present invention does not have the effects listed above in some cases.

BRIEF DESCRIPTION OF THE DRAWINGS

FIG. 6A is a cross-sectional view of a memory string. FIG. 6B is a circuit diagram of the memory string.

FIG. 11A is a diagram showing classifications of crystal structures. FIG. 11B is a diagram showing an XRD spectrum of a CAAC-IGZO film. FIG. 11C is an image showing a nanobeam electron diffraction pattern of a CAAC-IGZO film.

MODE FOR CARRYING OUT THE INVENTION

Figure 1A:
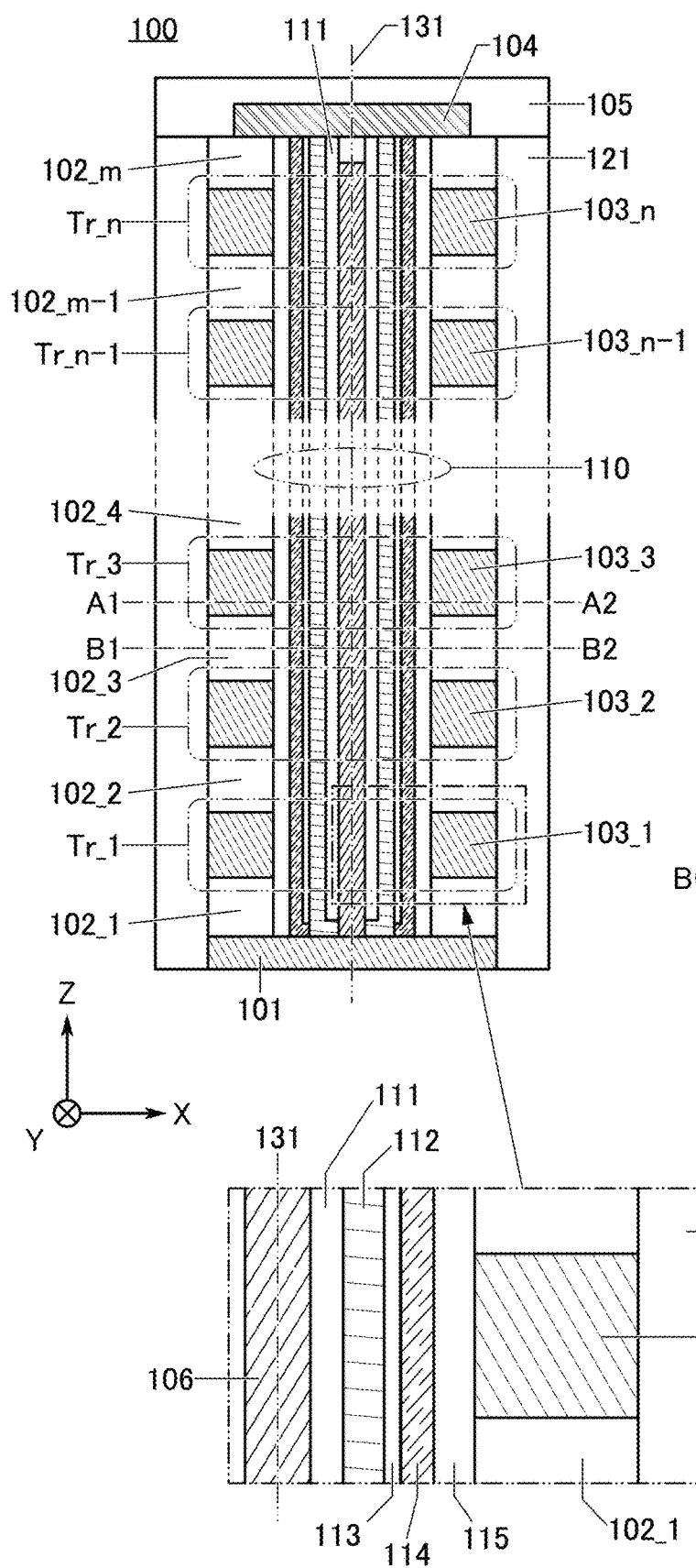
FIG. 1A is a cross-sectional view of a memory string.

In this specification and the like, a semiconductor device refers to a device that utilizes semiconductor characteristics, and means a circuit including a semiconductor element (a transistor, a diode, a photodiode, or the like), a device including the circuit, and the like. In addition, the semiconductor device also means all devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electronic device, and the like themselves might be semiconductor devices, or might include semiconductor devices.

Furthermore, in the case where this specification and the like state that X and Y are connected, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or text, a connection relation other than that shown in the drawings or the text is regarded as being disclosed in the drawings or the text. Each of X and Y denotes an object (e.g., a device, an element, a circuit, a wiring, an electrode, a terminal, a conductive film, a layer, or the like).

For example, in the case where X and Y are electrically connected, one or more elements that allow electrical connection between X and Y (e.g., a switch, a transistor, a capacitor, an inductor, a resistor, a diode, a display device, a light-emitting device, a load, and the like) can be connected between X and Y. Note that a switch has a function of being controlled to be in an on state or an off state. That is, a switch has a function of being in a conduction state (on state) or a non-conduction state (off state) to control whether or not current flows.

For example, in the case where X and Y are functionally connected, one or more circuits that allow functional connection between X and Y (e.g., a logic circuit (an inverter, a NAND circuit, a NOR circuit, or the like); a signal converter circuit (a digital-analog converter circuit, an analog-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; a control circuit; or the like) can be connected between X and Y. Note that for example, even when another circuit is sandwiched between X and Y, X and Y are functionally connected when a signal output from X is transmitted to Y.

Note that an explicit description that X and Y are electrically connected includes the case where X and Y are electrically connected (i.e., the case where X and Y are connected with another element or another circuit sandwiched therebetween) and the case where X and Y are directly connected (i.e., the case where X and Y are connected without another element or another circuit sandwiched therebetween).

In addition, it can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in that order." Alternatively, it can be expressed as "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in that order." Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order." When the connection order in a circuit configuration is defined by using an expression method similar to these examples, a source (or a first terminal or the like) and a drain (or a second terminal or the like) of a transistor can be distinguished from each other to specify the technical scope. Note that these expressions are just examples and expressions are not limited to these expressions. Here, each of X and Y denotes an object (e.g., a device, an element, a circuit, a wiring, an electrode, a terminal, a conductive film, a layer, or the like).

Note that even when a circuit diagram shows that independent components are electrically connected to each other, one component has functions of a plurality of components in some cases. For example, when part of a wiring also functions as an electrode, one conductive film has functions of both components: a function of the wiring and a function of the electrode. Thus, electrical connection in this specification also includes such a case where one conductive film has functions of a plurality of components, in its category.

In addition, in this specification and the like, for a "resistor," a circuit element, a wiring, or the like having a resistance value higher than 0Ω can be used, for example. Therefore, in this specification and the like, a "resistor" includes a wiring having a resistance value, a transistor in which current flows between its source and drain, a diode, a coil, and the like. Thus, the term "resistor" can be replaced with the term such as "resistance," "load," or "region having a resistance value"; inversely, the term "resistance," "load," or "region having a resistance value" can be replaced with the term such as "resistor." The resistance value can be, for example, preferably greater than or equal to 1 mΩ and less than or equal to 10Ω, further preferably greater than or equal to 5 mΩ and less than or equal to 5Ω, still further preferably greater than or equal to 10 mΩ and less than or equal to 1Ω. As another example, the resistance value may be greater than or equal to 1Ω and less than or equal to 1×10$^9$Ω.

In the case where a wiring is used for a resistor, the resistance value is sometimes determined depending on the length of the wiring. Alternatively, a conductor with resistivity different from that of a conductor used for a wiring is sometimes used for a resistor. Alternatively, the resistance value is sometimes determined by doping a semiconductor with an impurity.

In addition, in this specification and the like, a "capacitor" can be, for example, a circuit element having an electrostatic capacitance value higher than 0 F, a region of a wiring having an electrostatic capacitance value, parasitic capacitance, gate capacitance of a transistor, or the like. Therefore, in this specification and the like, a "capacitor" includes not only a circuit element that has a pair of electrodes and a dielectric between the electrodes, but also parasitic capacitance generated between wirings, gate capacitance generated between a gate and one of a source and a drain of a transistor, and the like. Furthermore, the term such as "capacitor," "parasitic capacitance," or "gate capacitance" can be replaced with the term such as "capacitance"; inversely, the term "capacitance" can be replaced with the term such as "capacitor," "parasitic capacitance," or "gate capacitance." Moreover, the term "pair of electrodes" of "capacitor" can be replaced with "pair of conductors," "pair of conductive regions," "pair of regions," and the like. Note that the electrostatic capacitance value can be greater than or equal to 0.05 fF and less than or equal to 10 pF, for example. As another example, the electrostatic capacitance value may be greater than or equal to 1 pF and less than or equal to 10 μF.

In addition, in this specification and the like, a transistor includes three terminals called a gate, a source, and a drain. The gate functions as a control terminal for controlling the conduction state of the transistor. Two terminals functioning as the source and the drain are input/output terminals of the transistor. One of the two input/output terminals serves as the source and the other serves as the drain depending on the conductivity type (n-channel type or p-channel type) of the transistor and the levels of potentials applied to the three terminals of the transistor. Thus, the terms "source" and "drain" can be replaced with each other in this specification and the like. Furthermore, in this specification and the like, expressions "one of a source and a drain" (or a first electrode or a first terminal) and "the other of the source and the drain" (or a second electrode or a second terminal) are used in the description of the connection relation of a transistor. Note that depending on the transistor structure, a transistor may include a back gate in addition to the above three terminals. In that case, in this specification and the like, one of the gate and the back gate of the transistor is sometimes referred to as a first gate, and the other of the gate and the back gate of the transistor is sometimes referred to as a second gate. Moreover, the terms "gate" and "back gate" can be replaced with each other in one transistor in some cases. In the case where a transistor includes three or more gates, the gates may be sometimes referred to as a first gate, a second gate, and a third gate, for example, in this specification and the like.

In addition, in this specification and the like, "node" can be referred to as a terminal, a wiring, an electrode, a conductive layer, a conductor, an impurity region, or the like depending on a circuit configuration, a device structure, or the like. Furthermore, a terminal, a wiring, or the like can be referred to as "node."

In addition, in this specification and the like, "voltage" and "potential" can be replaced with each other as appropriate. The "voltage" refers to a potential difference from a reference potential, and when the reference potential is a ground potential, for example, the "voltage" can be replaced with the "potential." Note that the ground potential does not necessarily mean 0 V. Moreover, potentials are relative values, and a potential applied to a wiring, a potential applied to a circuit and the like, and a potential output from a circuit and the like, for example, are changed with a change of the reference potential.

In addition, in this specification and the like, the terms "high-level potential" (also referred to as "H potential" or "H") and "low-level potential" (also referred to as "L potential" or "L") do not mean a particular potential. For example, in the case where two wirings are both described as "functioning as a wiring for supplying a high-level potential," the levels of the high-level potentials applied by these wirings are not necessarily equal to each other. Similarly, in the case where two wirings are both described as "functioning as a wiring for supplying a low-level potential," the levels of the low-level potentials applied by these wirings are not necessarily equal to each other.

"Current" is a charge transfer phenomenon (electrical conduction); for example, the description "electrical conduction of positively charged particles occurs" can be rephrased as "electrical conduction of negatively charged particles occurs in an opposite direction." Therefore, unless otherwise specified, "current" in this specification and the like refers to a charge transfer phenomenon (electrical conduction) accompanied by carrier movement. Examples of a carrier here include an electron, a hole, an anion, a cation, a complex ion, and the like, and the carrier differs between current flow systems (e.g., a semiconductor, a metal, an electrolyte solution, a vacuum, and the like). In addition, "direction of current" in a wiring or the like refers to a direction in which a positive carrier moves, and the amount of current is expressed as a positive value. In other words, a direction in which a negative carrier moves is opposite to the direction of current, and the amount of current is expressed as a negative value. Thus, in the case where the polarity of a current (or the direction of current) is not specified in this specification and the like, the description "current flows from element A to element B" can be rephrased as "current flows from element B to element A," for example. Furthermore, the description "current is input to element A" can be rephrased as "current is output from element A," for example.

In addition, ordinal numbers such as "first," "second," and "third" in this specification and the like are used to avoid confusion among components. Thus, the ordinal numbers do not limit the number of components. Furthermore, the ordinal numbers do not limit the order of components. For example, a "first" component in one embodiment in this specification and the like can be referred to as a "second" component in other embodiments, the scope of claims, or the like. Furthermore, a "first" component in one embodiment in this specification and the like can be omitted in other embodiments, the scope of claims, or the like.

In addition, in this specification and the like, terms for describing positioning, such as "over" and "under," are sometimes used for convenience to describe the positional relation between components with reference to drawings. Furthermore, the positional relation between components is changed as appropriate in accordance with a direction in which each component is described. Thus, the positional relation is not limited to the terms described in the specification and the like, and can be described with another term as appropriate depending on the situation. For example, the expression "an insulator positioned over (on) a top surface of a conductor" can be replaced with the expression "an insulator positioned under (on) a bottom surface of a conductor" when the direction of a drawing showing these components is rotated by 180°.

Furthermore, the term "over" or "under" does not necessarily mean that a component is placed directly above or directly below and in direct contact with another component. For example, the expression "electrode B over insulating layer A" does not necessarily mean that the electrode B is formed over and in direct contact with the insulating layer A, and does not exclude the case where another component is provided between the insulating layer A and the electrode B.

In addition, in this specification and the like, the terms "film," "layer," and the like can be interchanged with each other depending on the situation. For example, the term "conductive layer" can be changed into the term "conductive film" in some cases. As another example, the term "insulating film" can be changed into the term "insulating layer" in some cases. Alternatively, the term "film," "layer," or the like is not used and can be interchanged with another term depending on the case or the situation. For example, the term "conductive layer" or "conductive film" can be changed into the term "conductor" in some cases. Furthermore, for example, the term "insulating layer" or "insulating film" can be changed into the term "insulator" in some cases.

In addition, in this specification and the like, the term such as "electrode," "wiring," or "terminal" does not limit the function of a component. For example, an "electrode" is used as part of a "wiring" in some cases, and vice versa. Furthermore, the term "electrode" or "wiring" also includes the case where a plurality of "electrodes" or "wirings" are formed in an integrated manner, for example. For example, a "terminal" is used as part of a "wiring" or an "electrode" in some cases, and vice versa. Furthermore, the term "terminal" also includes the case where a plurality of "electrodes," "wirings," "terminals," or the like are formed in an integrated manner, for example. Therefore, for example, an "electrode" can be part of a "wiring" or a "terminal," and a "terminal" can be part of a "wiring" or an "electrode." Moreover, the term such as "electrode," "wiring," or "terminal" is sometimes replaced with the term such as "region."

In addition, in this specification and the like, the term such as "wiring," "signal line," or "power supply line" can be interchanged with each other depending on the case or the situation. For example, the term "wiring" can be changed into the term "signal line" in some cases. Furthermore, for example, the term "wiring" can be changed into the term such as "power source line" in some cases. Inversely, the term such as "signal line" or "power supply line" can be changed into the term "wiring" in some cases. The term such as "power source line" can be changed into the term such as "signal line" in some cases. Inversely, the term such as "signal line" can be changed into the term such as "power source line" in some cases. Moreover, the term "potential" that is applied to a wiring can be sometimes changed into the term such as "signal" depending on the case or the situation. Inversely, the term such as "signal" can be changed into the term "potential" in some cases.

In this specification and the like, an impurity in a semiconductor refers to an element other than a main component of a semiconductor layer, for example. For example, an element with a concentration of lower than 0.1 atomic % is an impurity. When an impurity is contained, for example, the density of defect states in a semiconductor is increased, carrier mobility is decreased, or crystallinity is decreased in some cases. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specifically, there are hydrogen (contained also in water), lithium, sodium, silicon, boron, phosphorus, carbon, nitrogen, and the like, for example. Specifically, in the case where the semiconductor is a silicon layer, examples of an impurity that changes characteristics of the semiconductor include oxygen, Group 1 elements except hydrogen, Group 2 elements, Group 13 elements, Group 15 elements, and the like.

In this specification and the like, a switch has a function of controlling whether current flows or not by being in a conduction state (an on state) or a non-conduction state (an off state). Alternatively, a switch has a function of selecting and changing a current path. For example, an electrical switch, a mechanical switch, or the like can be used. That is, a switch can be any element capable of controlling current, and is not limited to a certain element.

Examples of the electrical switch include a transistor (e.g., a bipolar transistor or a MOS transistor), a diode (e.g., a PN diode, a PIN diode, a Schottky diode, a MIM (Metal Insulator Metal) diode, a MIS (Metal Insulator Semiconductor) diode, or a diode-connected transistor), and a logic circuit in which such elements are combined. Note that in the case where a transistor is used as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical systems) technology. Such a switch includes an electrode that can be moved mechanically, and operates by controlling conduction and non-conduction with movement of the electrode.

In this specification and the like, in some cases, "on-state current" means a current that flows between a source and a drain when a transistor is in an on state. Furthermore, in some cases, "off-state current" means a current that flows between a source and a drain when a transistor is in an off state.

In this specification, "parallel" indicates a state where two straight lines are placed at an angle greater than or equal to −10° and less than or equal to 10°. Accordingly, the case where the angle is greater than or equal to −5° and less than or equal to 5° is also included. In addition, "approximately parallel" or "substantially parallel" indicates a state where two straight lines are placed at an angle greater than or equal to −30° and less than or equal to 30°. In addition, "perpendicular" indicates a state where two straight lines are placed at an angle greater than or equal to 80° and less than or equal to 100°. Accordingly, the case where the angle is greater than or equal to 85° and less than or equal to 95° is also included. Furthermore, "approximately perpendicular" or "substantially perpendicular" indicates a state where two straight lines are placed at an angle greater than or equal to 60° and less than or equal to 120°. The term "orthogonal" indicates a state where two straight lines are placed at an angle greater than or equal to 80° and less than or equal to 100°. Thus, the case where the angle is greater than or equal to 85° and less than or equal to 95° is also included.

In this specification and the like, the terms "identical," "the same," "equal," "uniform," and the like used in describing calculation values and measurement values or in describing objects, methods, events, and the like that can be converted into calculation values or measurement values allow for a margin of error of ±20% unless otherwise specified.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor.

In addition, in this specification and the like, a metal oxide containing nitrogen is also collectively referred to as a metal oxide in some cases. Furthermore, a metal oxide containing nitrogen may be referred to as a metal oxynitride.

In addition, in this specification and the like, one embodiment of the present invention can be constituted by combining, as appropriate, the structure described in each embodiment with the structures described in the other embodiments. Furthermore, in the case where a plurality of structure examples are described in one embodiment, the structure examples can be combined with each other as appropriate.

Note that content (or may be part of the content) described in one embodiment can be applied to, combined with, or replaced with at least one of another content (or may be part of the content) in the embodiment and content (or may be part of the content) described in one or a plurality of different embodiments.

Note that in each embodiment (or Example), content described in the embodiment is content described using a variety of diagrams or content described with text described in the specification.

Note that by combining a drawing (or may be part thereof) described in one embodiment with at least one of another part of the drawing, a different drawing (or may be part thereof) described in the embodiment, and a drawing (or may be part thereof) described in one or a plurality of different embodiments, much more drawings can be constituted.

Embodiments described in this specification are described with reference to the drawings. Note that the embodiments can be implemented in many different modes, and it will be readily understood by those skilled in the art that the modes and details can be changed in various ways without departing from the spirit and scope thereof. Therefore, the present invention should not be construed as being limited to the description in the embodiments. Note that in the structures of the invention in the embodiments, the same reference numerals are used in common for the same portions or portions having similar functions in different drawings, and repeated description thereof is omitted in some cases. Moreover, some components are omitted in a perspective view, a top view, and the like for easy understanding of the diagrams in some cases.

In addition, in the drawings in this specification, the size, the layer thickness, or the region is exaggerated for clarity in some cases. Therefore, embodiments of the present invention are not limited to the size, aspect ratio, and the like shown in the drawings. Note that the drawings schematically show ideal examples, and embodiments of the present invention are not limited to shapes, values, and the like shown in the drawings. For example, variation in signal, voltage, or current due to noise or variation in signal, voltage, or current due to difference in timing can be included.

In this specification and the like, when a plurality of components are denoted with the same reference numerals, and in particular need to be distinguished from each other, an identification sign such as "_1," "[i]," or "[m,n]" is sometimes added to the reference numerals. For example, one of two wirings CG is referred to as a wiring CG_1 and the other is referred to as a wiring CG_2 in some cases.

Embodiment 1

A memory string 100 according to one embodiment of the present invention is described using drawings. The memory string 100 is a semiconductor device that functions as a 3D-NAND memory device. Note that arrows indicating an X direction, a Y direction, and a Z direction are sometimes illustrated in drawings. The X direction, the Y direction, and the Z direction are directions intersecting with each other. More specifically, the X direction, the Y direction, and the Z direction are directions orthogonal to each other. In this specification and the like, one of the X direction, the Y direction, and the Z direction is referred to as a "first direction" in some cases. Another one of the directions is referred to as a "second direction" in some cases. The remaining one of the directions is referred to as a "third direction" in some cases. In FIG. 1 and the like, a direction perpendicular to a top surface of a conductor 101 is the Z direction.

<Structure Example of Memory String>

Figure 1B:
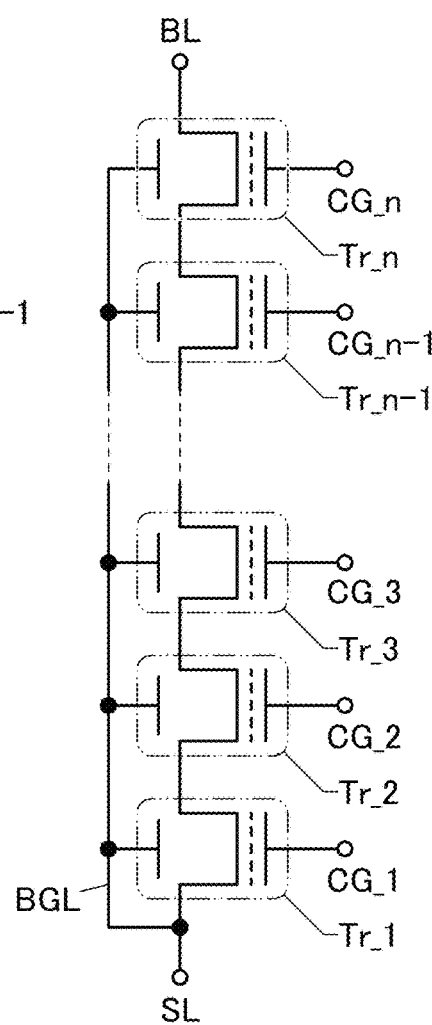
FIG. 1B is a circuit diagram of the memory string.
Figure 2A:
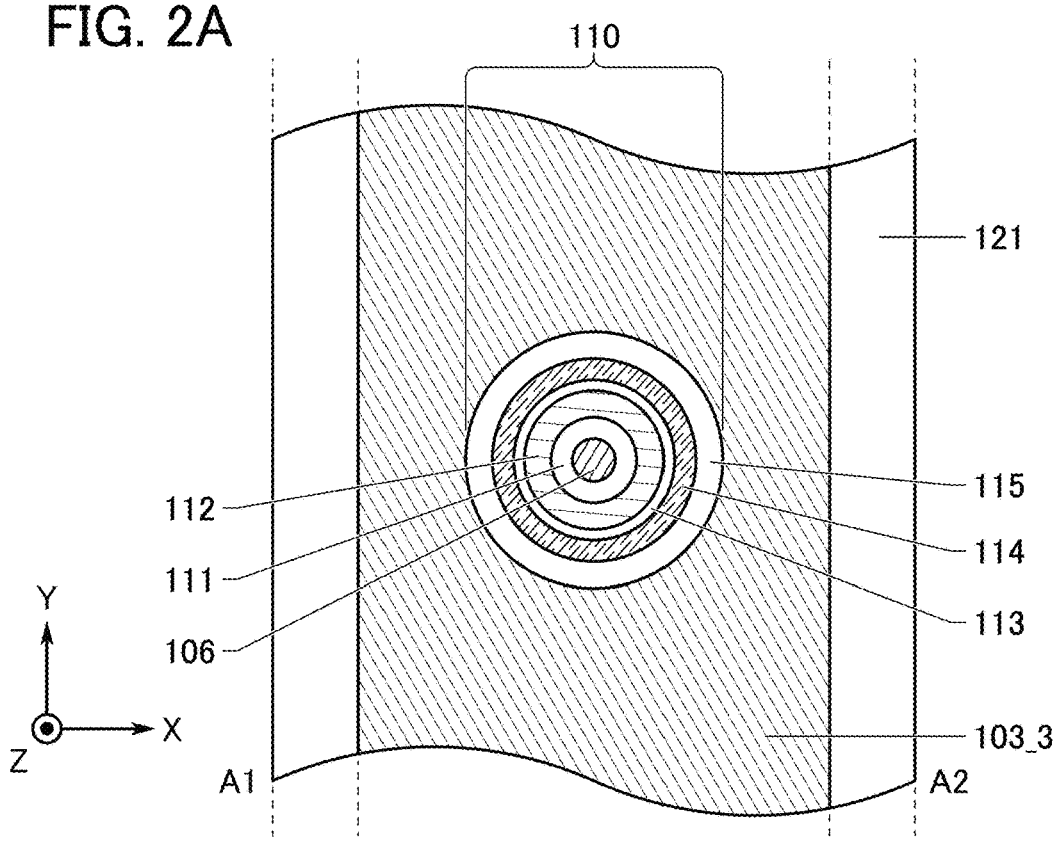
FIG. 2A and FIG. 2B are cross-sectional views of the memory string.
Figure 2B:
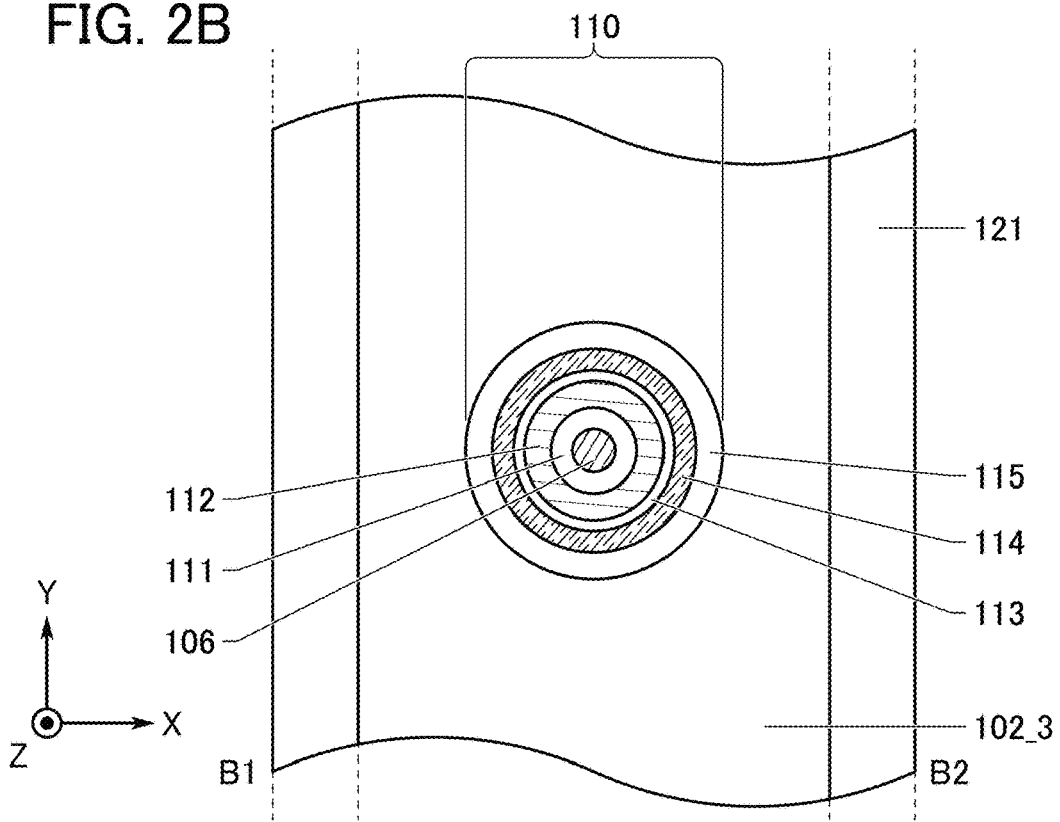

FIG. 1A is a cross-sectional view of the memory string 100 seen from the Y direction. Note that FIG. 1A illustrates a central axis 131 of the memory string 100 extending in the Z direction. In addition, FIG. 1B is an equivalent circuit diagram of the memory string 100. Furthermore, FIG. 2A is a cross-sectional view in which a portion A1-A2 represented by a dashed-dotted line in FIG. 1A is seen from the Z direction. FIG. 2B is a cross-sectional view in which a portion B1-B2 represented by a dashed-dotted line in FIG. 1A is seen from the Z direction.

The memory string 100 includes a conductor 101 placed above a substrate (not illustrated), m-layer insulators 102 (m is an integer greater than or equal to 2), and n-layer conductors 103 (n is an integer of greater than or equal to 2). The insulator 102 and the conductor 103 are alternately stacked above the substrate. In FIG. 1A and the like, the insulator 102 that is in a first layer is referred to as an insulator 102_1, and the insulator 102 that is in an m-th layer is referred to as an insulator 102_$m$. Similarly, the conductor 103 that is in a first layer is referred to as a conductor 103_1, and the conductor 103 that is in an n-th layer is referred to as a conductor 103_$n$. Note that in this embodiment and the like, the simple term "insulator 102" refers to any insulator 102. Similarly, the simple term "conductor 103" refers to any conductor 103.

The insulator 102 and the conductor 103 extend in the Y direction. The memory string 100 has a structure where the insulator 102 and the conductor 103 are alternately stacked. For example, in FIG. 1A, the insulator 102_1 is provided over the conductor 101, the conductor 103_1 is provided over the insulator 102_1, the insulator 102_2 is provided over the conductor 103_1, the conductor 103_2 is provided over the insulator 102_2, the insulator 102_3 is provided over the conductor 103_2, the conductor 103_3 is provided over the insulator 102_3, and the insulator 102_4 is provided over the conductor 103_3. In addition, the insulator 102_$m$ is provided over the conductor 103_$n$.

In addition, the memory string 100 includes a conductor 104, an insulator 105, a structure body 110, and an insulator 121. The structure body 110 extends along the Z direction. Furthermore, the structure body 110 is provided between the conductor 101 and the conductor 104 to penetrate through the insulator 102_1 to the insulator 102_$m$ and the conductor 103_1 to the conductor 103_$n$.

The structure body 110 has a columnar structure including a conductor 106, an insulator 111, a semiconductor 112, an insulator 113, a functional layer 114, and an insulator 115. Specifically, the conductor 106 extends along the central axis 131, and the insulator 111 is provided to be adjacent to a side surface of the conductor 106. The semiconductor 112 is provided to be adjacent to a side surface of the insulator 111. The insulator 113 is provided to be adjacent to the semiconductor 112. The functional layer 114 is provided to be adjacent to the insulator 113. Furthermore, the insulator 115 is provided to be adjacent to the functional layer 114. As illustrated in FIG. 2A and FIG. 2B, the insulator 111, the semiconductor 112, the insulator 113, and the functional layer 114 are provided concentrically outside the conductor 106.

Although FIG. 2 illustrates the case where the structure body 110 has a circular cross-sectional shape, the cross-sectional shape of the structure body 110 is not limited to a circle. The cross-section of the structure body 110 may have a triangular shape, a rectangular shape, or a polygonal shape with five or more corners. The cross-sectional shape of the structure body 110 may consist of a curved line or a combination of a straight line and a curved line.

The insulator 121 is provided to cover side surfaces of the insulator 102_1 to the insulator 102_$m$ and the conductor 103_1 to the conductor 103_$n$. The conductor 104 is provided over the insulator 102_$m$. The conductor 101 and the conductor 104 are electrically connected to the semiconductor 112. The conductor 101 is electrically connected to the conductor 106. Thus, the conductor 106 and the semiconductor 112 are electrically connected to each other. In addition, the insulator 105 is provided over the insulator 102_$m$, the insulator 121, and the conductor 104.

A region (an intersection portion) where the structure body 110 overlaps with the conductor 103 functions as a transistor Tr in a direction perpendicular to the Z direction. Thus, a region (an intersection portion) where the structure body 110 overlaps with the conductor 103 functions as a memory cell (also referred to as a "memory element") in the direction perpendicular to the Z direction.

In addition, the conductor 103 functions as a gate of the transistor Tr. The memory string 100 illustrated in FIG. 1A includes n regions (intersection portions) where the structure body 110 overlaps with the conductor 103. Thus, the memory string 100 illustrated in FIG. 1A includes n transistors Tr. Accordingly, the memory string 100 illustrated in FIG. 1A includes n memory cells. The conductor 106 can function as a back gate of the transistor Tr.

FIG. 2A corresponds to a cross-sectional view of the transistor Tr in the memory string 100 when seen from the Z direction.

In FIG. 1A, a first transistor Tr is referred to as a transistor Tr_1, and an n-th transistor Tr is referred to as a transistor Tr_n. Note that in this embodiment and the like, the simple term "transistor Tr" refers to any transistor Tr.

In general, a memory cell in which data is stored by holding charge in a charge accumulation layer has a stack structure of a block layer, a charge accumulation layer, a tunnel layer, and a semiconductor layer. Such a memory cell is sometimes referred to as various names depending on a stack structure from a control gate to a semiconductor. For example, in the case where a control gate, a block layer, a charge accumulation layer, a tunnel layer, and a semiconductor layer are formed using a metal, an oxide, a nitride, an oxide, and a semiconductor, respectively, such a memory cell is referred to as a MONOS (Metal Oxide Nitride Oxide Semiconductor) memory cell.

In addition, in the case where n-type silicon or p-type silicon is used for the control gate of the MONOS memory cell, such a memory cell is referred to as a SONOS (Silicon Oxide Nitride Oxide Semiconductor) memory cell.

Similarly, in the case where tantalum nitride and aluminum oxide are used for the control gate and the block layer, respectively, such a memory cell is referred to as a TANOS (Tantalum nitride Aluminium oxide Nitride Oxide Semiconductor) memory cell.

In addition, in the case where tantalum nitride and hafnium oxide are used for the control gate and the block layer, respectively, such a memory cell is referred to as a THNOS (Tantalum nitride Hafnium oxide Nitride Oxide Semiconductor) memory cell.

The transistor Tr according to one embodiment of the present invention functions as a MONOS memory cell, for example. The memory string 100 functions as a NAND memory device including n memory cells.

In addition, the conductor 103 functions as a memory cell control gate. Furthermore, the insulator 113 functions as a tunnel layer, the functional layer 114 functions as a charge accumulation layer, and the insulator 115 functions as a block layer. In other words, the block layer is provided on the control gate side, and the tunnel layer is provided on the semiconductor side.

As illustrated in FIG. 1B, the gate of the transistor Tr is electrically connected to a wiring CG. In FIG. 1B, the wiring CG that is electrically connected to a gate of the transistor Tr_1 is referred to as a wiring CG_1. Note that part or all of the conductor 103 may function as the wiring CG. Note that the wiring CG is also referred to as a "control gate" or a control gate line."

In addition, in adjacent transistors Tr among a transistor Tr_2 to a transistor Tr_n−1, a source of one of the adjacent transistors Tr is electrically connected to a drain of the other of the adjacent transistors Tr.

In addition, one of a source and a drain of the transistor Tr_1 is electrically connected to a wiring SL, and the other thereof is electrically connected to one of a source and a drain of the transistor Tr_2. One of a source and a drain of the transistor Tr_n is electrically connected to a wiring BL, and the other thereof is electrically connected to one of a source and a drain of the transistor Tr_n−1. The conductor 101 is electrically connected to the wiring SL, and the conductor 104 is electrically connected to the wiring BL. Note that the conductor 101 may function as the wiring SL, and the conductor 104 may function as the wiring BL.

The back gate of the transistor Tr (the transistor Tr_1 to the transistor Tr_n) is electrically connected to the wiring SL through a wiring BGL. Note that the conductor 106 can function as the wiring BGL.

A material whose bandgap is smaller than those of the insulator 113 and the insulator 115 is used for the functional layer 114 functioning as the charge accumulation layer. The thickness of the insulator 113 (the length in the direction that is perpendicular to the Z direction) is preferably greater than or equal to 1 nm and less than or equal to 10 nm. The thickness of the functional layer 114 is preferably greater than or equal to 5 nm and less than or equal to 20 nm. The thickness of the insulator 115 is preferably greater than or equal to 5 nm and less than or equal to 50 mm. In addition, the thickness of the insulator 113 is preferably smaller than that of the insulator 115. In other words, the thickness of the insulator 115 is preferably larger than that of the insulator 113.

For the functional layer 114, an insulator may be used. For example, silicon oxide is used for the insulator 113 and the insulator 115, and silicon nitride is used for the functional layer 114. Each of the insulator 113 to the insulator 115 may be a stack of a plurality of insulators. For example, the insulator 115 may be a stack of silicon oxide and aluminum oxide.

In addition, for example, silicon nitride may be used for the insulator 113 and the insulator 115. In that case, silicon nitride whose silicon content is higher than that of silicon nitride used for the insulator 113 and the insulator 115 may be used for the functional layer 114.

As described above, polycrystalline silicon is used for a body portion of a 3D-NAND memory string in many cases. Note that in the memory string 100 according to one embodiment of the present invention, the semiconductor 112 corresponds to a body portion. For the semiconductor 112, a single crystal semiconductor, a polycrystalline semiconductor, a microcrystalline semiconductor, an amorphous semiconductor, or the like can be used alone or in combination. As a semiconductor material, silicon, germanium, or the like can be used, for example. Alternatively, a compound semiconductor such as silicon germanium, silicon carbide, gallium arsenide, an oxide semiconductor, or a nitride semiconductor may be used.

The semiconductor 112 functions as a semiconductor layer where a channel of the transistor Tr is formed. The semiconductor used in the transistor may be a stack of semiconductors. In the case of stacking semiconductor layers, semiconductors having different crystal states may be used or different semiconductor materials may be used.

The transistor Tr is preferably a transistor using an oxide semiconductor, which is a kind of metal oxide, in its semiconductor layer where a channel is formed (also referred to as an "OS transistor"). An oxide semiconductor has a band gap of greater than or equal to 2 eV, and thus has extremely low off-state current. Thus, power consumption of the memory string 100 can be reduced. Accordingly, power consumption of a semiconductor device including the memory string 100 can be reduced.

In addition, a memory cell including an OS transistor can be referred to as an "OS memory." Furthermore, the memory string 100 including the memory cell can also be referred to as an "OS memory."

In addition, the on resistance of the OS transistor can be made smaller than that of a transistor using polycrystalline silicon for its semiconductor layer where a channel is formed. In other words, the conductivity of the body portion can be increased. When the OS transistor is used as the transistor Tr, the operation speed of the memory string 100 can be increased.

When an OS transistor having a back gate is used as an OS transistor functioning as a memory cell, more accurate erase operation of an OS memory can be achieved. Thus, the reliability of the OS memory in the erase operation can be increased. Note that the erase operation will be described later in detail.

In addition, the transistor using polycrystalline silicon has variation in the threshold voltage caused by a crystal grain boundary, whereas the OS transistor has little influence by a crystal grain boundary and small variation in the threshold voltage. Accordingly, when the OS transistor is used as the transistor Tr, malfunction caused by variation in the threshold voltage can be suppressed in the memory string 100.

In addition, the OS transistor operates stably even in a high-temperature environment and has small fluctuation in characteristics. For example, the off-state current hardly increases even in the high-temperature environment. Specifically, the off-state current hardly increases even at an environment temperature higher than or equal to room temperature and lower than or equal to 200° C. Furthermore, the on-state current is less likely to decrease even in the high-temperature environment. Thus, the memory string 100 including the OS memory achieves stable operation and high reliability even in the high temperature environment. Moreover, the OS transistor has high breakdown voltage between its source and drain. When the OS transistor is used as a transistor included in the memory string 100, it is possible to achieve the memory string 100 that operates stably and has high reliability even in the high temperature environment. Accordingly, the reliability of the semiconductor device including the memory string 100 can be increased.

A NAND memory device including the OS memory is referred to as an "OS NAND type" or an "OS NAND memory device." In addition, a 3D-NAND memory device including the OS memory is referred to as a "3D OS NAND type" or a "3D OS NAND memory device." Thus, the memory string 100 according to one embodiment of the present invention can be referred to as a 3D OS NAND memory device.

Figure 3A:
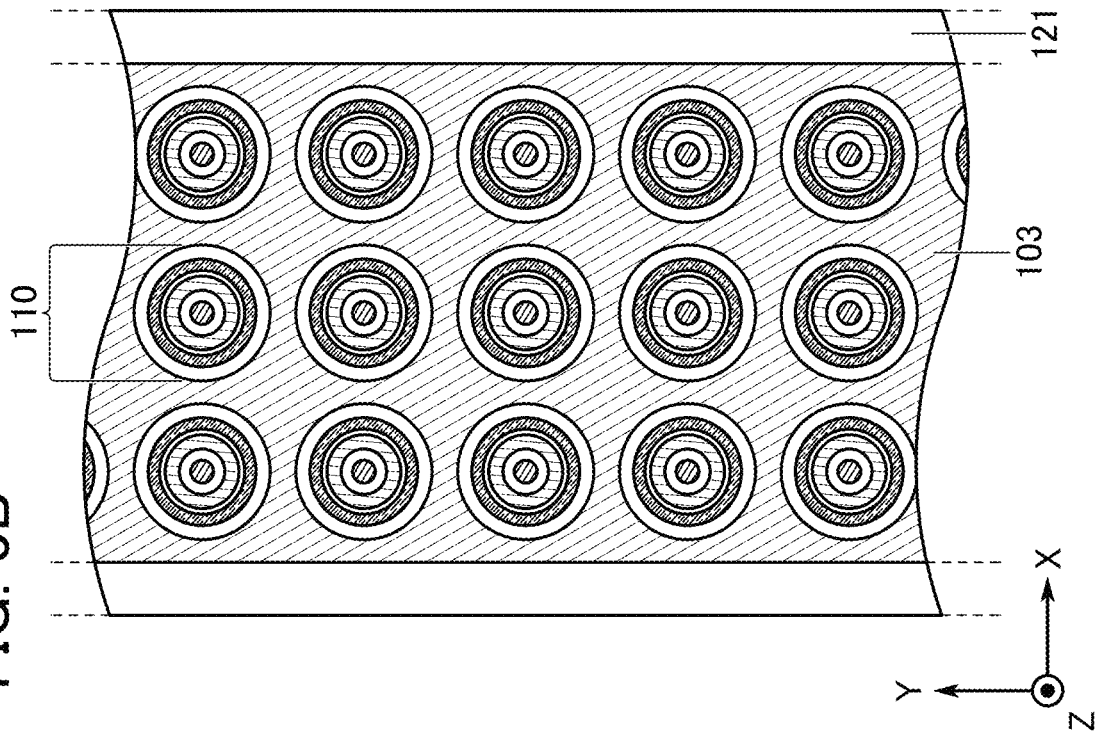
FIG. 3A and FIG. 3B are cross-sectional views of the memory string.
Figure 3B:
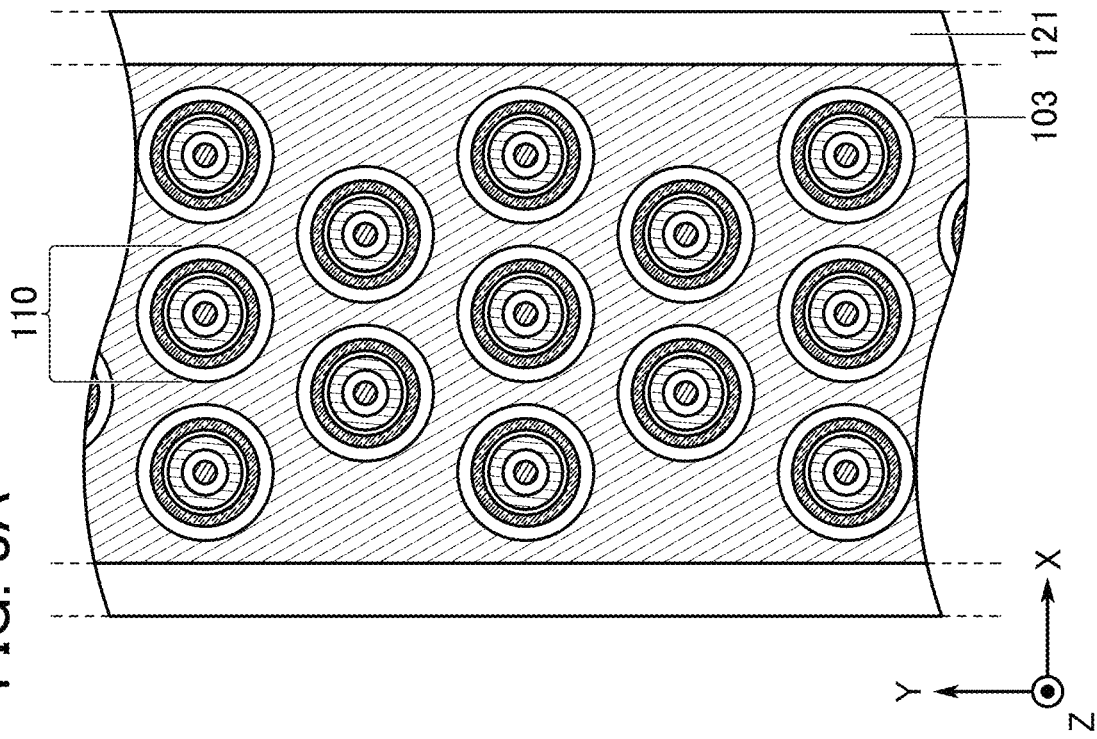

In addition, to increase the memory capacity of a semiconductor device using the memory string 100, a plurality of memory strings 100 are provided in a staggered arrangement (see FIG. 3A) or in a grid pattern (see FIG. 3B). FIG. 3 is a cross-sectional view corresponding to FIG. 2A.

MODIFICATION EXAMPLE 1

Figure 4A:
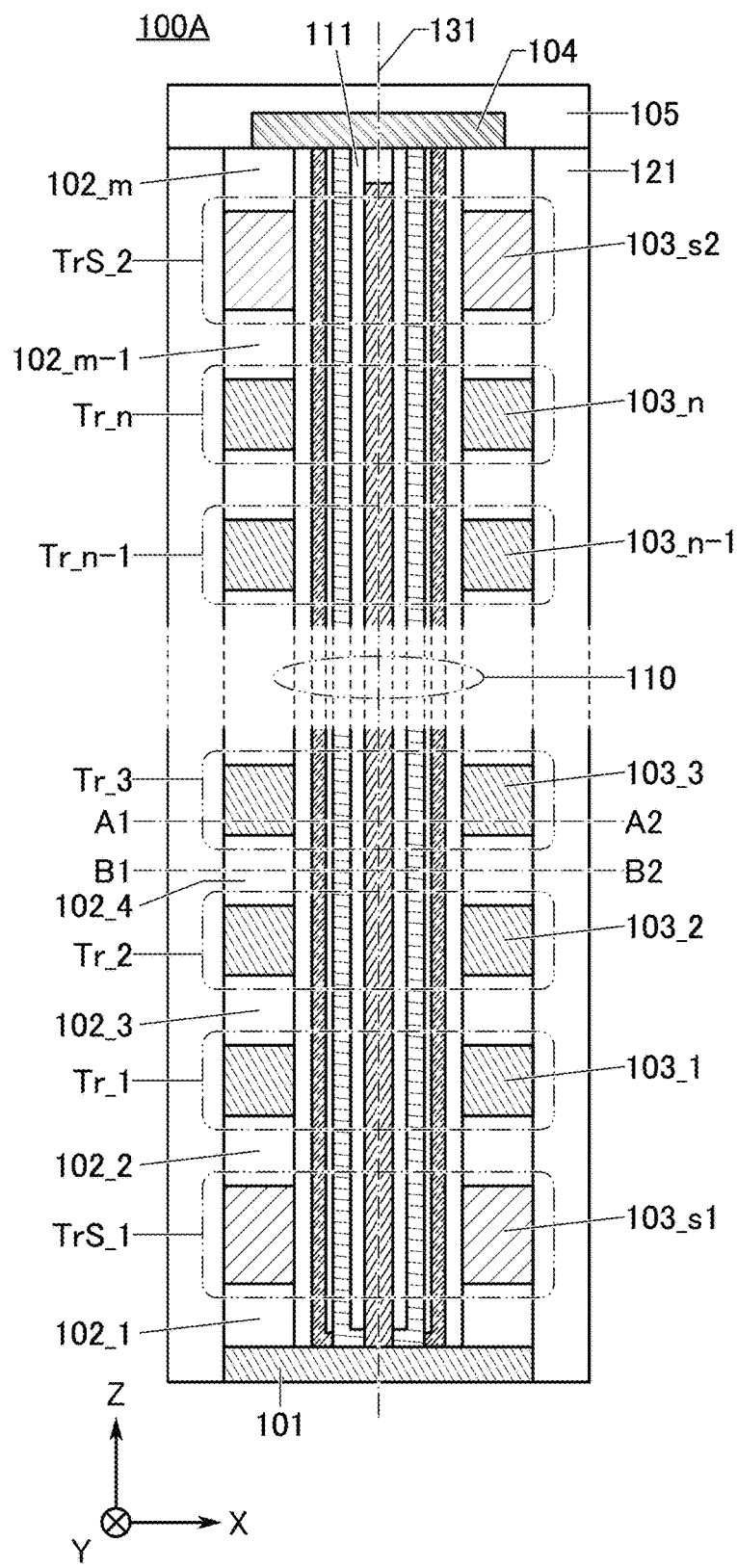
FIG. 4A is a cross-sectional view of a memory string.
Figure 4B:
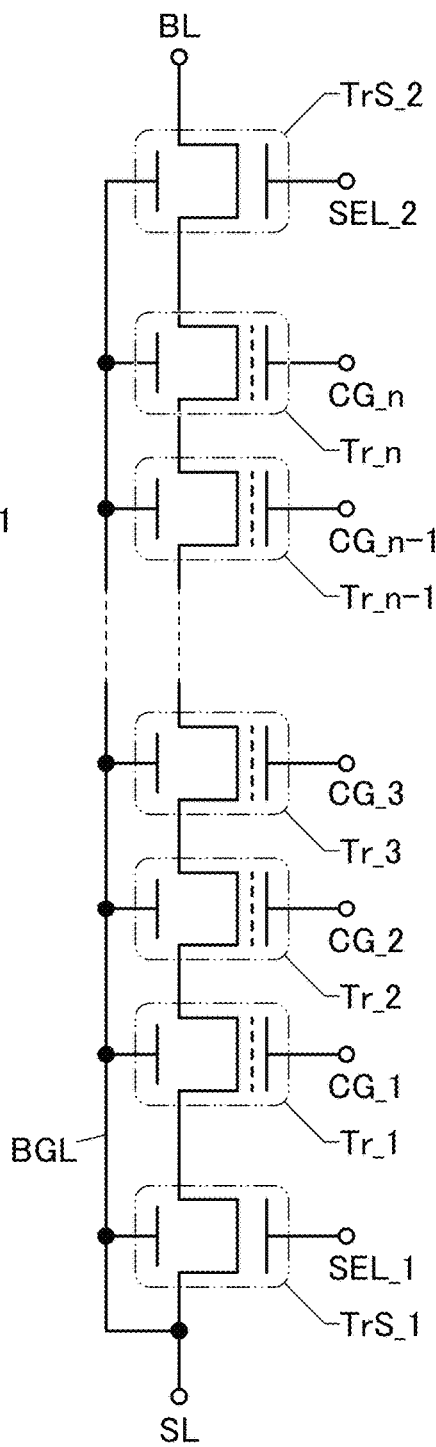
FIG. 4B is a circuit diagram of the memory string.

FIG. 4A illustrates a cross-sectional view of a memory string 100A, which is a modification example of the memory string 100. FIG. 4B is an equivalent circuit diagram of the memory string 100A.

The memory string 100A includes a transistor TrS_1 between the transistor Tr_1 and the conductor 101 and a transistor TrS_2 between the transistor Tr_n and the conductor 104. That is, one end of the memory string 100 is provided with the transistor TrS_1, and the other end thereof is provided with the transistor TrS_2.

In FIG. 4A, the conductor 103 functioning as a gate of the transistor TrS_1 is referred to as a conductor 103_s1, and the conductor 103 functioning as a gate of the transistor TrS_2 is referred to as the conductor 103_s2. The conductor 103_s1 is electrically connected to a wiring SEL_1, and the conductor 103_s2 is electrically connected to a wiring SEL_2 (see FIG. 4B).

In the memory string 100A, the conductor 103_s1 is provided between the insulator 102_1 and the insulator 102_2, and the conductor 103_1 is provided between the insulator 102_2 and the insulator 102_3. Furthermore, in the memory string 100A, the conductor 103_s2 is provided between the insulator 102_m and the insulator 102_m−1, and the conductor 103_n is provided between the insulator 102_m−1 and the insulator 102_m−2.

For example, in a structure in which one conductor 103 intersects with a plurality of memory strings as illustrated in FIG. 3, data included in a certain memory string cannot be read out accurately in some cases because of interference of data included in other memory strings. In addition, when data is written to the certain memory string, the data is also written to other memory strings in some cases.

When the transistor TrS functioning as a selection transistor is provided in at least one end portion, preferably both end portions of the memory string, data reading and writing can be performed only on a certain memory string. Accordingly, data reading and writing can be performed more accurately.

In the memory string 100A, the transistor TrS has the same structure as the transistor Tr. Note that since the transistor TrS functions as a selection transistor, a read operation, a write operation, or the like is not necessarily performed on the transistor TrS.

A material used for forming the conductor 103_s1 and the conductor 103_s2 may be the same material as or a material different from that of other conductors 103.

MODIFICATION EXAMPLE 2

Figure 5A:
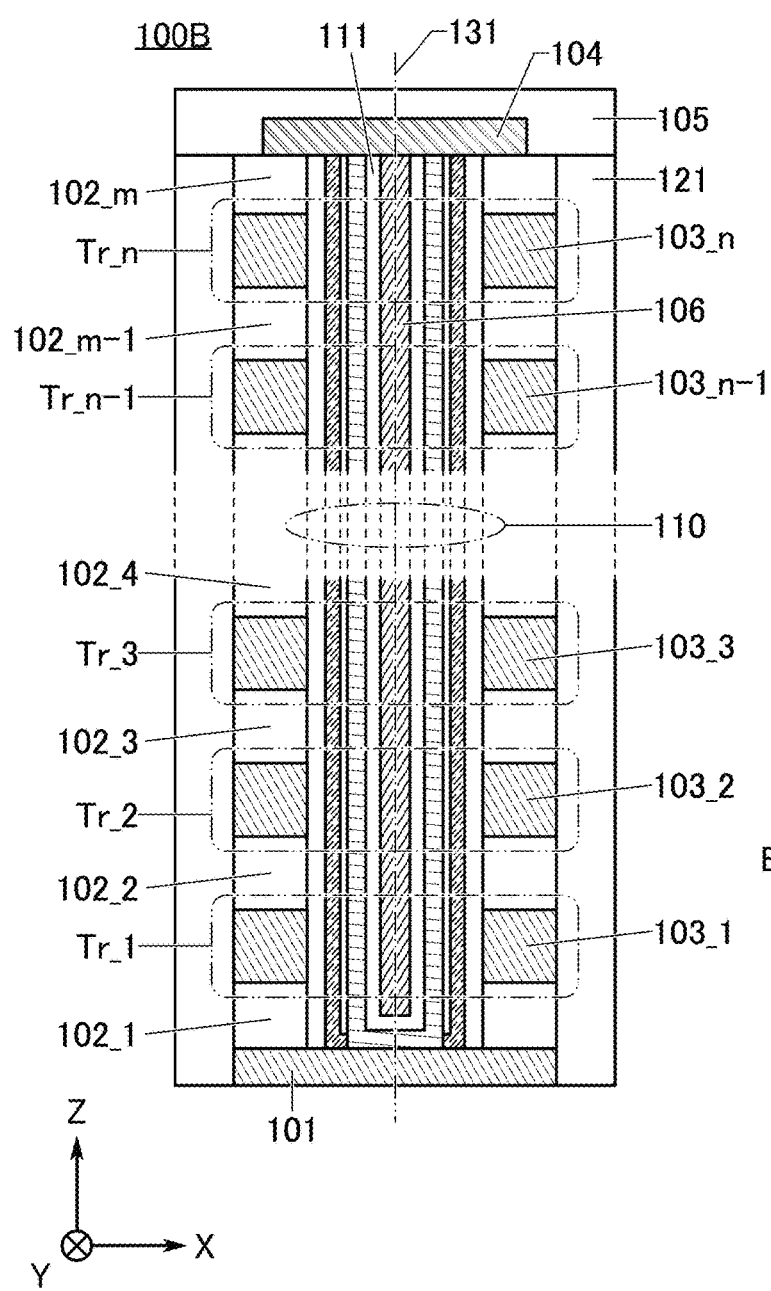
FIG. 5A is a cross-sectional view of a memory string.
Figure 5B:
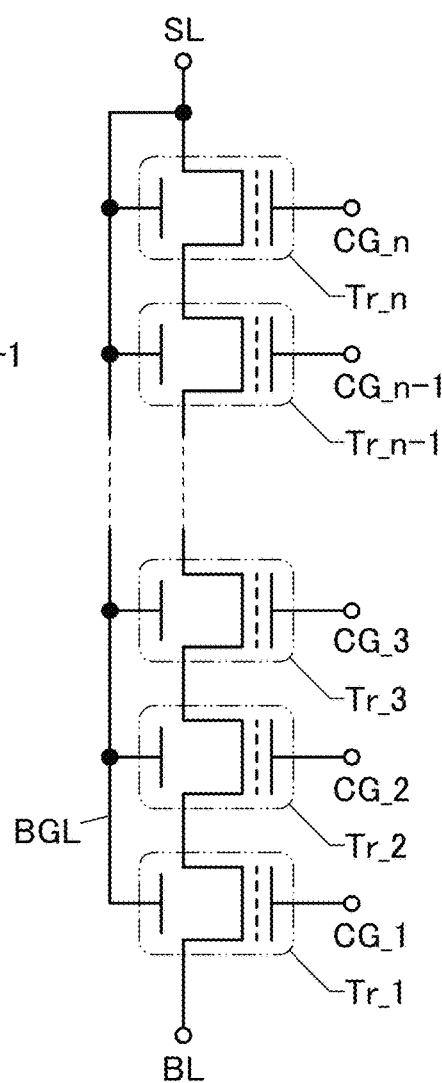
FIG. 5B is a circuit diagram of the memory string.

FIG. 5A illustrates a cross-sectional view of a memory string 100B, which is a modification example of the memory string 100. FIG. 5B is an equivalent circuit diagram of the memory string 100B.

As illustrated in FIG. 5, one of a source and a drain of the transistor Tr_1 may be electrically connected to the wiring BL, and the other thereof may be electrically connected to one of a source and a drain of the transistor Tr_2. One of a source and a drain of the transistor Tr_n may be electrically connected to the wiring SL, and the other thereof may be electrically connected to one of a source and a drain of the transistor Tr_n−1.

Thus, the conductor 101 is electrically connected to the wiring BL, and the conductor 104 is electrically connected to the wiring SL. Note that the conductor 101 may function as the wiring BL, and the conductor 104 may function as the wiring SL.

The back gate of the transistor Tr (the transistor Tr_1 to the transistor Tr_n) is electrically connected to the wiring SL. In the memory string illustrated in FIG. 5, the conductor 106 is not electrically connected to the conductor 101 but is electrically connected to the conductor 104.

MODIFICATION EXAMPLE 3

FIG. 6A illustrates a cross-sectional view of a memory string 100C, which is a modification example of the memory string 100. FIG. 6B is an equivalent circuit diagram of the memory string 100C.

The memory string 100C includes an insulator 107 and a conductor 108. The insulator 107 is provided over the insulator 102_m. The conductor 108 is provided to be embedded in part of the insulator 107. In the memory string 100C, the conductor 104 is provided over the insulator 107, and the insulator 105 is provided to cover the conductor 104. The semiconductor 112 is electrically connected to the conductor 104 through the conductor 108.

As illustrated in FIG. 6, the conductor 106 functioning as the wiring BGL is not necessarily connected to either the wiring SL or the wiring BL and may be electrically connected to a wiring 109 (not illustrated in FIG. 6A). With such a structure, a given potential can be supplied to the wiring BGL. The threshold voltage of the transistor Tr can be controlled by controlling the potential of the wiring BGL.

MODIFICATION EXAMPLE 4

Figure 7:
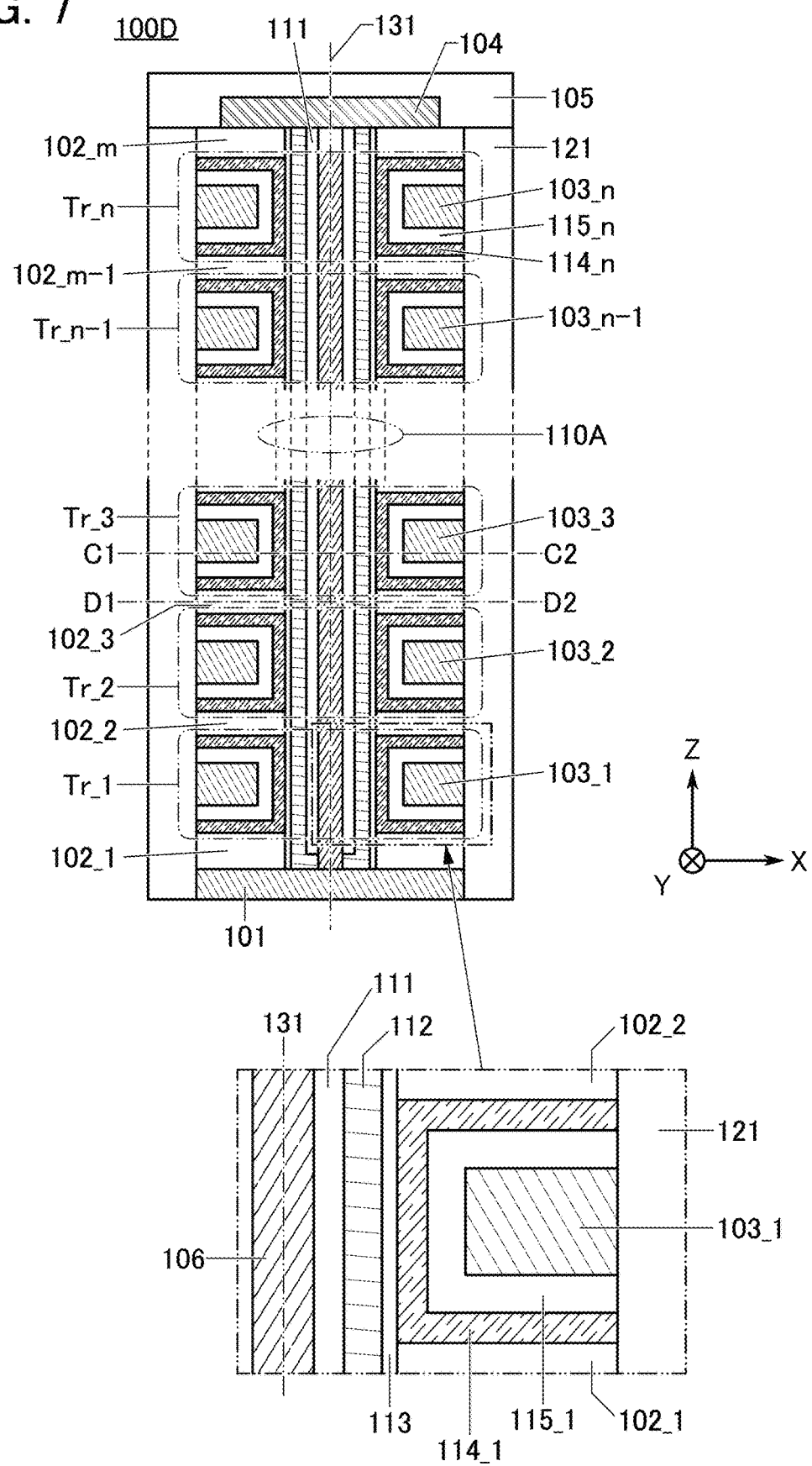
FIG. 7 is a cross-sectional view of a memory string.
Figure 8A:
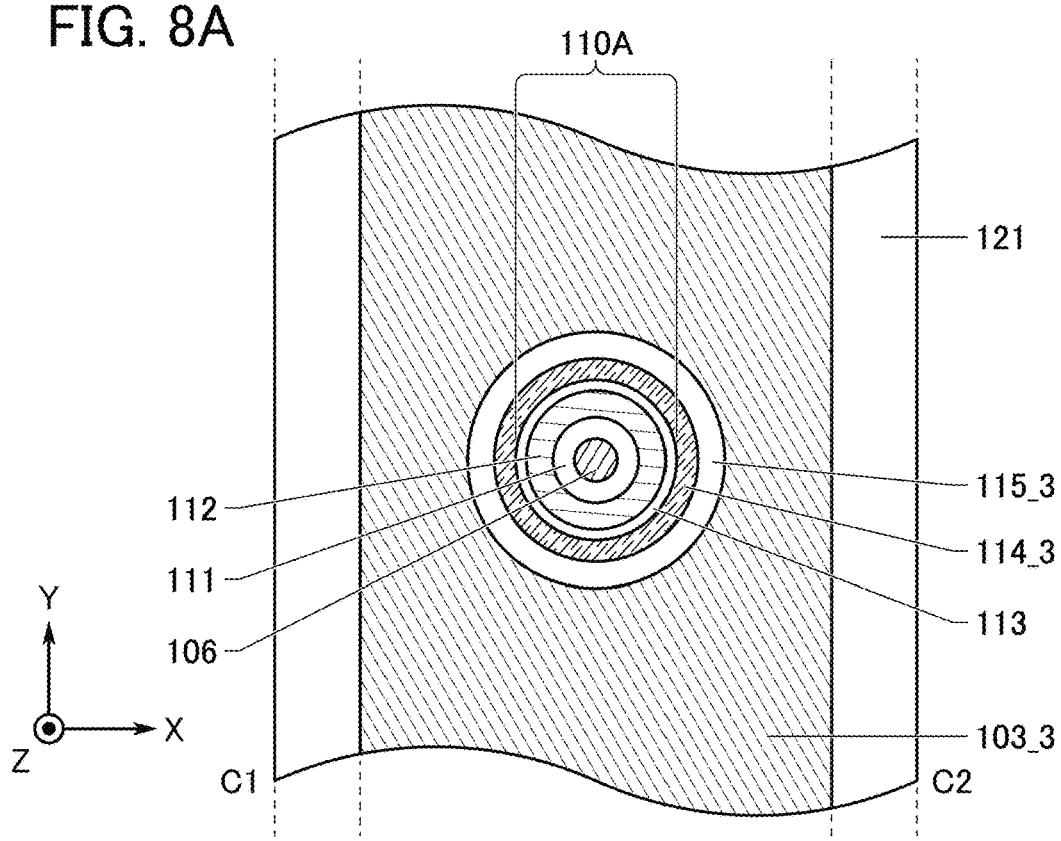
FIG. 8A and FIG. 8B are cross-sectional views of the memory string.
Figure 8B:
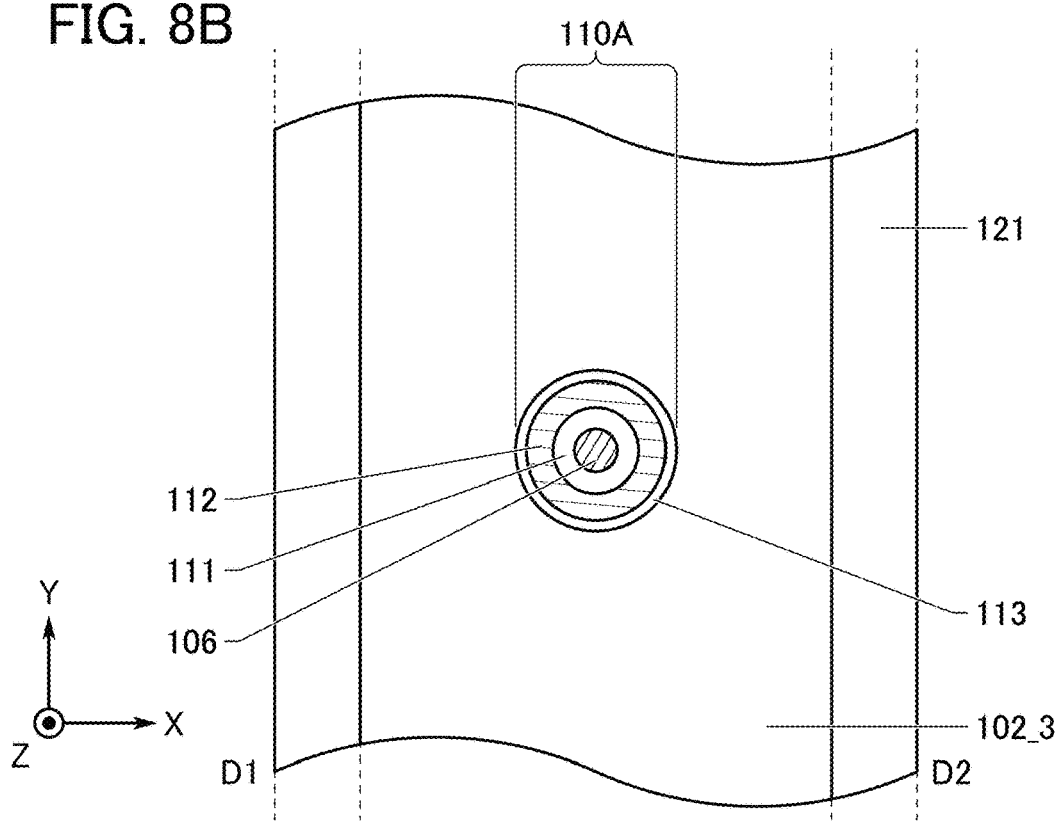

FIG. 7 illustrates a cross-sectional view of a memory string 100D, which is a modification example of the memory string 100. FIG. 8A is a cross-sectional view in which a portion C1-C2 represented by a dashed-dotted line in FIG. 7 is seen from the Z direction. FIG. 8B is a cross-sectional view in which a portion D1-D2 represented by a dashed-dotted line in FIG. 7 is seen from the Z direction. FIG. 8A corresponds to a cross-sectional view of the transistor Tr in the memory string 100D when seen from the Z direction.

The memory string 100D includes a structure body 110A instead of the structure body 110. The structure body 110A has a structure where the functional layer 114 and the insulator 115 are eliminated from the structure body 110. The functional layer 114 and the insulator 115 are provided for each transistor Tr.

In this embodiment and the like, the functional layer 114 included in the transistor Tr_1 is referred to as a functional layer 114_1. In addition, the insulator 115 included in the transistor Tr_1 is referred to as an insulator 115_1. Similarly, the functional layer 114 included in the transistor Tr_n is referred to as a functional layer 114_n, and the insulator 115 included in the transistor Tr_n is referred to as an insulator 115_n. Furthermore, the simple term "functional layer 114" refers to the functional layer 114 included in any transistor Tr. Similarly, the simple term "insulator 115" refers to the insulator 115 included in any transistor Tr.

For example, an insulator 115_3 is provided to be adjacent to the conductor 103_3. Thus, the insulator 115_3 has a region that overlaps with the structure body 110A in a direction perpendicular to the Z direction.

In addition, the insulator 115_3 has a region that overlaps with a lower surface of the conductor 103_3. The conductor 103_3 overlaps with the insulator 102_3 with the region therebetween.

In addition, the insulator 115_3 has a region that overlaps with an upper surface of the conductor 103_3. The conductor 103_3 overlaps with the insulator 102_4 with the region therebetween.

A functional layer 114_3 is provided to be adjacent to the insulator 115_3. The functional layer 114_3 has a region that overlaps with the structure body 110A in a direction perpendicular to the Z direction.

In addition, the functional layer 114_3 has a region that overlaps with the lower surface of the conductor 103_3 with part of the insulator 115_3 therebetween. The conductor 103_3 overlaps with the insulator 102_3 with the region therebetween.

In addition, the functional layer 114_3 has a region that overlaps with the upper surface of the conductor 103_3 with part of the insulator 115_3 therebetween. The conductor 103_3 overlaps with the insulator 102_4 with the region therebetween.

Accordingly, although the cross-sectional view illustrated in FIG. 8A is the same as the cross-sectional view illustrated in FIG. 2A, the cross-sectional view illustrated in FIG. 8B is different from the cross-sectional view illustrated in FIG. 2B.

In the memory string 100, the functional layer 114 is shared between the adjacent transistors Tr; thus, charge accumulated in the functional layer 114 might interfere with the adjacent transistor Tr. In contrast, in the memory string 100D, the functional layer 114 functioning as a charge accumulation layer is independently provided for each transistor Tr; thus, the possibility of interference with the adjacent transistors Tr can be reduced. Accordingly, noise can be reduced and the reliability of data retention can be increased. In addition, the memory string 100D facilitates, for example, retention of multilevel information compared to the memory string 100.

In the memory string 100D, a semiconductor may be used for the functional layer 114 functioning as an accumulation layer. With the use of a semiconductor for an accumulation layer, a floating-gate memory cell can be achieved. As a semiconductor material used for the accumulation layer, silicon, germanium, or the like can be used. Alternatively, a compound semiconductor such as silicon germanium, silicon carbide, gallium arsenide arsenic, an oxide semiconductor, or a nitride semiconductor may be used.

MODIFICATION EXAMPLE 5

Figure 9A:
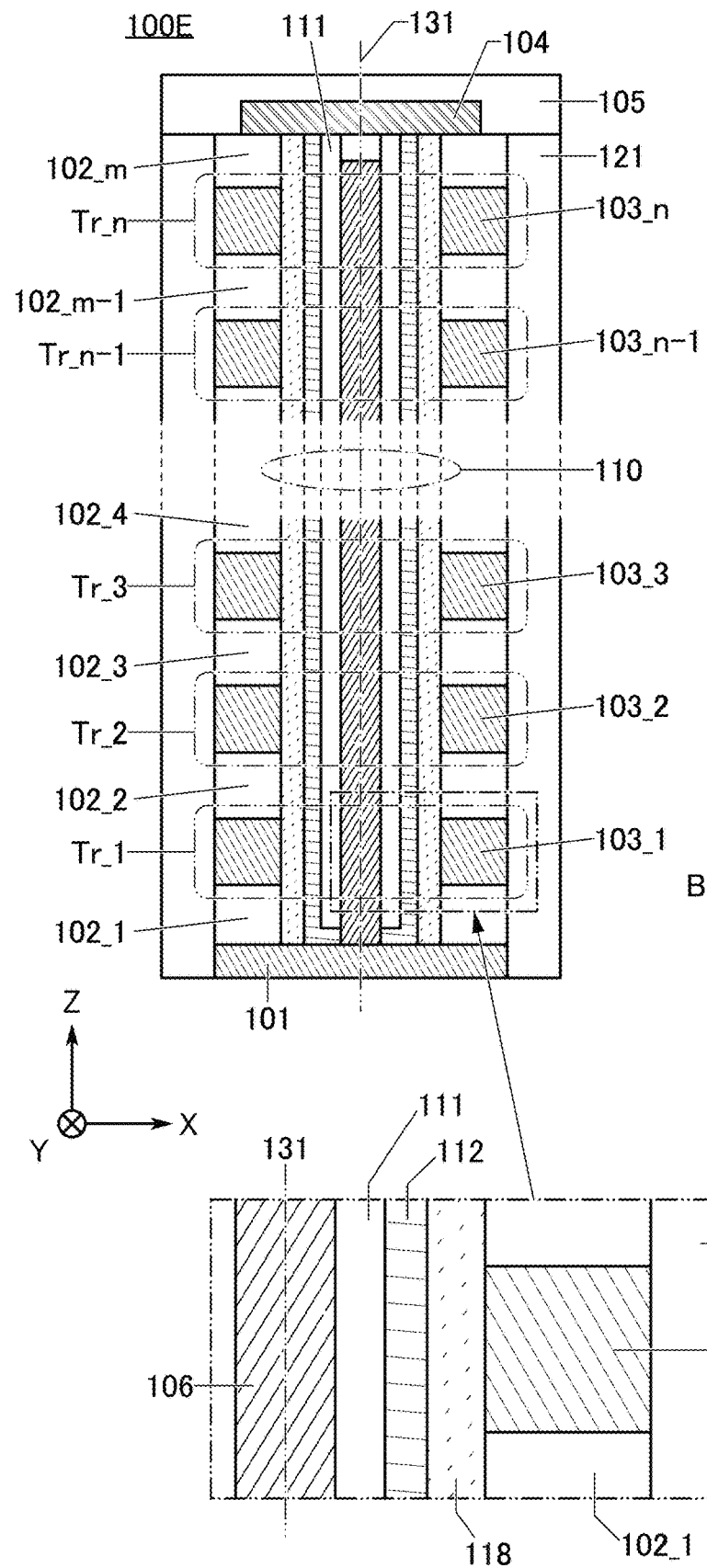
FIG. 9A is a cross-sectional view of a memory string.
Figure 9B:
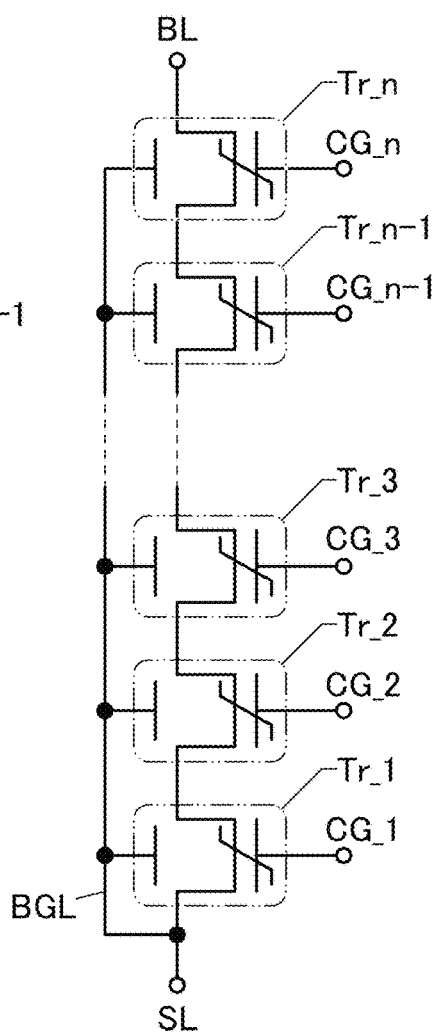
FIG. 9B is a circuit diagram of the memory string.

FIG. 9A illustrates a cross-sectional view of a memory string 100E, which is a modification example of the memory string 100. FIG. 9A is a cross-sectional view of the memory string 100E seen from the Y direction. In addition, FIG. 9B is an equivalent circuit diagram of the memory string 100E. The memory string 100E includes a ferroelectric 118 instead of the insulator 113, the functional layer 114, and the insulator 115 included in the memory string 100.

Examples of a material used for the ferroelectric 118 include a mixed crystal of hafnium oxide and zirconium oxide (also referred to as "HZO"), and a material in which an element X (the element X is silicon (Si), aluminum (Al), gadolinium (Gd), yttrium (Y), lanthanum (La), strontium (Sr), or the like) is added to hafnium oxide.

Alternatively, for the ferroelectric 118, a piezoelectric ceramic having a perovskite structure may be used. For example, lead zirconate titanate (also referred to as "PZT"), strontium bismuth tantalate (also referred to as "SBT"), bismuth ferrite (also referred to as "BFO"), or barium titanate may be used for the ferroelectric 118.

Alternatively, for the ferroelectric 118, an organic ferroelectric such as polyvinylidene fluoride (also referred to as "PVDF") or a copolymer of vinylidene fluoride (also referred to as "VDF") and trifluoroethylene (also referred to as "TrFE") may be used.

The transistor Tr included in the memory string 100E functions as a ferroelectric transistor (FeFET: Ferroelectric FET). The ferroelectric transistor is a transistor using a ferroelectric for an insulator functioning as a gate insulator. Here, a ferroelectric is described. When an electric field is applied to a dielectric, a portion with positive charges and a portion with negative charges are generated inside the dielectric. Such a phenomenon is called "polarization." A dielectric in which polarization disappears when an electric field vanishes is called "paraelectric," and a dielectric in which polarization remains even when an electric field vanishes is called "ferroelectric." The direction of polarization changes when the direction of electric field added to ferroelectric is changed at a certain electric field intensity or higher. The threshold voltage of the ferroelectric transistor can be changed with voltage applied to the gate electrode thereof.

With the use of the ferroelectric transistor as the transistor Tr included in the memory string 100E, a NAND ferroelectric memory can be achieved.

MODIFICATION EXAMPLE 6

Figure 10A:
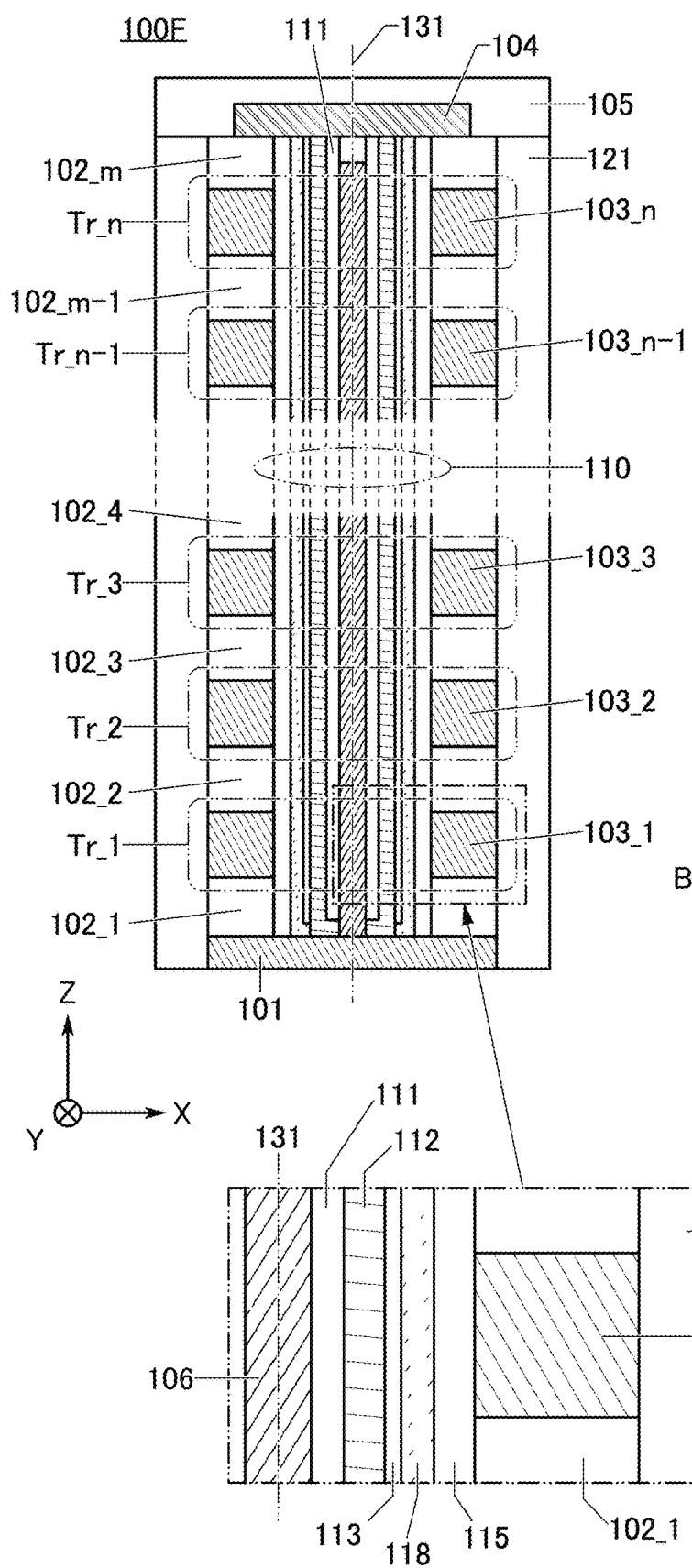
FIG. 10A is a cross-sectional view of a memory string.
Figure 10B:
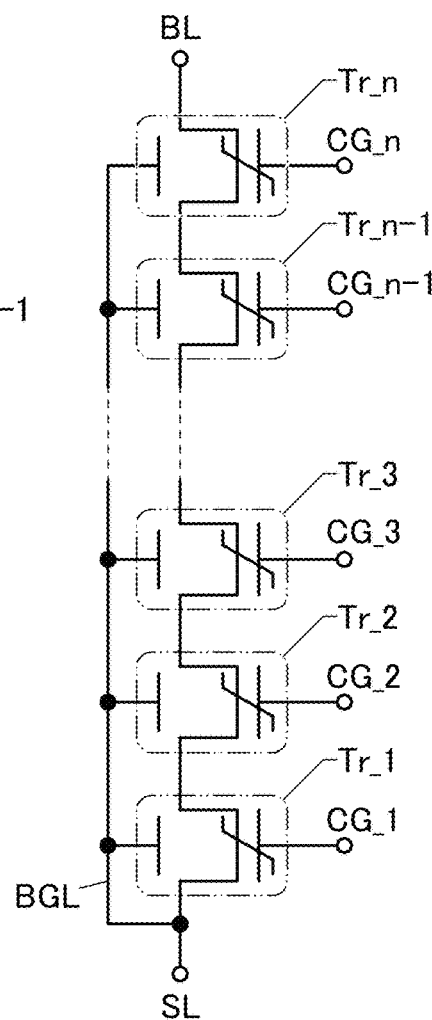
FIG. 10B is a circuit diagram of the memory string.

FIG. 10 is a cross-sectional view of a memory string 100F. FIG. 10A is a cross-sectional view of the memory string 100F seen from the Y direction. In addition, FIG. 10B is an equivalent circuit diagram of the memory string 100F. The memory string 100F is a modification example of the memory string 100 that is different from the memory string 100E. The memory string 100F includes the ferroelectric 118 instead of the functional layer 114 included in the memory string 100.

The ferroelectric 118 included in the memory string 100F is provided to be sandwiched between the insulator 113 and the insulator 115. For the ferroelectric 118, a material similar to that for the memory string 100E can be used.

When the ferroelectric 118 is sandwiched between the insulator 113 and the insulator 115, the polarization of the ferroelectric 118 after data rewriting is stabilized and the reliability of the memory string 100F can be improved. When the insulator 113 is provided between the semiconductor 112 and the ferroelectric 118, an interface of the semiconductor 112 on the ferroelectric 118 side is stabilized and data writing and reading speed can be increased.

<Memory Cell Constituent Material>

Next, constituent materials that can be used for the memory string 100 and the like are described.

[Substrate]

The memory string 100 can be provided over the substrate. An insulator substrate, a semiconductor substrate, or a conductor substrate is used as the substrate, for example. Examples of the insulator substrate include a glass substrate, a quartz substrate, a sapphire substrate, a stabilized zirconia substrate (an yttria-stabilized zirconia substrate or the like), and a resin substrate. In addition, examples of the semiconductor substrate include a semiconductor substrate using silicon or germanium as a material and a compound semiconductor substrate containing silicon carbide, silicon germanium, gallium arsenide, indium phosphide, zinc oxide, gallium oxide, gallium nitride (GaN), or the like. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate containing a metal nitride and a substrate containing a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

[Insulator]

Examples of an insulator include an oxide, a nitride, an oxynitride, a nitride oxide, a metal oxide, a metal oxynitride, and a metal nitride oxide, each of which has an insulating property.

As miniaturization and high integration of the transistor progress, for example, a problem such as leakage current may arise because of a thinner gate insulator. When a high-k material is used for the insulator functioning as the gate insulator, voltage during operation of the transistor can be reduced while the physical thickness of the gate insulator is maintained. In contrast, when a material with low relative permittivity is used for the insulator functioning as an interlayer film, parasitic capacitance generated between wirings can be reduced. Thus, a material is preferably selected depending on the function of an insulator.

In addition, examples of the insulator with high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

In addition, examples of the insulator with low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

Furthermore, when an OS transistor is surrounded by an insulator having a function of inhibiting passage of oxygen and impurities such as hydrogen, the transistor can have stable electrical characteristics. As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, gallium, germanium, yttrium, zirconium, lanthanum, neodymium, hafnium, or tantalum are used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; or a metal nitride such as aluminum nitride, silicon nitride oxide, or silicon nitride can be used.

Note that in this specification and the like, "oxynitride" refers to a material that contains more oxygen than nitrogen as its main component. For example, "silicon oxynitride" refers to a material that contains more oxygen than nitrogen and contains silicon, nitrogen, and oxygen. In this specification and the like, "nitride oxide" refers to a material that contains more nitrogen than oxygen as its main component. For example, "aluminum nitride oxide" refers to a material that contains more nitrogen than oxygen and contains aluminum, nitrogen, and oxygen.

In addition, in the case where an oxide semiconductor is used as the semiconductor 112, it is preferable that the insulator adjacent to the semiconductor 112 be an insulator including a region containing oxygen released by heating. For example, when a structure in which silicon oxide or silicon oxynitride including a region containing oxygen released by heating is in contact with the semiconductor 112 is employed, oxygen vacancies included in the semiconductor 112 can be compensated for.

Furthermore, as the insulator, a single layer of an insulator formed using the above material may be used, or a stack of a plurality of insulating layers formed using the above material may be used.

For example, in the case where an insulator is provided in contact with a conductor, an insulator that has a function of inhibiting passage of oxygen may be used as the insulator in order to prevent oxidation of the conductor. For example, hafnium oxide, aluminum oxide, silicon nitride, or the like may be used as the insulator.

In addition, in the case where insulators are stacked adjacent to a conductor, an insulator that has a function of inhibiting passage of oxygen is preferably used as the insulator in contact with the conductor. For example, the insulator in contact with the conductor may be formed using hafnium oxide, and an insulator containing silicon oxynitride may be formed in contact with the insulator.

[Conductor]

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a semiconductor having high electric conductivity, typified by polycrystalline silicon containing an impurity element such as phosphorus, or silicide such as nickel silicide may be used.

In addition, as the conductor, a single conductive layer formed using the above material may be used, or a stack of a plurality of conductive layers formed using the above material may be used. For example, a stacked-layer structure in which a material containing the above metal element and a conductive material containing oxygen are combined may be employed. Alternatively, a stacked-layer structure in which a material containing the above metal element and a conductive material containing nitrogen are combined may be employed. Alternatively, a stacked-layer structure in which a material containing the above metal element, a conductive material containing oxygen, and a conductive material containing nitrogen are combined may be employed.

[Oxide Semiconductor]

An oxide semiconductor, which is a kind of metal oxide, is preferably used as the semiconductor 112. An oxide semiconductor that can be used for the OS transistor will be described below.

The oxide semiconductor preferably contains at least indium or zinc. In particular, indium and zinc are preferably contained. In addition, aluminum, gallium, yttrium, tin, or the like is preferably contained. Furthermore, one kind or a plurality of kinds selected from boron, titanium, iron, nickel, germanium, zirconium, molybdenum, lanthanum, cerium, neodymium, hafnium, tantalum, tungsten, magnesium, cobalt, and the like may be contained.

Here, the case where the oxide semiconductor is an In-M-Zn oxide that contains indium, the element M, and zinc is considered. Note that the element M is one or more elements selected from aluminum, gallium, yttrium, and tin. Other elements that can be applied to the element M include boron, titanium, iron, nickel, germanium, zirconium, molybdenum, lanthanum, cerium, neodymium, hafnium, tantalum, tungsten, magnesium, cobalt, and the like. Note that a plurality of above elements may be combined as the element M in some cases.

[Classification of Crystal Structures]

First, classification of the crystal structures of an oxide semiconductor will be described using FIG. 11A. FIG. 11A is a diagram showing the classification of crystal structures of an oxide semiconductor, typically IGZO (a metal oxide containing In, Ga, and Zn).

As shown in FIG. 11A, an oxide semiconductor is roughly classified into "Amorphous," "Crystalline," and "Crystal." In addition, the term "Amorphous" includes completely amorphous. Furthermore, the term "Crystalline" includes CAAC (c-axis-aligned crystalline), nc (nanocrystalline), and CAC (cloud-aligned composite) (excluding single crystal and poly crystal). Note that in classification of "Crystalline," single crystal, poly crystal, and completely amorphous are excluded. Moreover, the term "Crystal" includes single crystal and poly crystal.

Note that the structures shown in the thick frame in FIG. 11A are in an intermediate state between "Amorphous" and "Crystal," and belong to a new crystalline phase. That is, these structures can be rephrased as structures completely different from "Amorphous," which is energetically unstable, and "Crystal."

Note that a crystal structure of a film or a substrate can be evaluated with an X-ray diffraction (XRD) spectrum. Here, FIG. 11B shows an XRD spectrum, which is obtained by GIXD (Grazing-Incidence XRD) measurement, of a CAAC-IGZO film classified into "Crystalline." Note that a GIXD method is also referred to as a thin film method or a Seemann-Bohlin method. The XRD spectrum that is shown in FIG. 11B and obtained by GIXD measurement is hereinafter simply referred to as an XRD spectrum. The CAAC-IGZO film shown in FIG. 11B has a composition in the neighborhood of In:Ga:Zn=4:2:3 [atomic ratio]. In addition, the thickness of the CAAC-IGZO film shown in FIG. 11B is 500 nm.

As shown in FIG. 11B, a clear peak (Intensity) indicating crystallinity is detected in the XRD spectrum of the CAAC-IGZO film. Specifically, a peak indicating c-axis alignment is detected at $2\theta$ of around 31° in the XRD spectrum of the CAAC-IGZO film. Note that as shown in FIG. 11B, the peak at $2\theta$ of around 31° is asymmetric with respect to the axis of an angle at which peak intensity is detected.

In addition, a crystal structure of a film or a substrate can also be evaluated with a diffraction pattern observed by a nanobeam electron diffraction (NBED) method (such a pattern is also referred to as a nanobeam electron diffraction pattern). FIG. 11C shows a diffraction pattern of the CAAC-IGZO film. FIG. 11C shows a diffraction pattern observed by NBED in which an electron beam is incident in a direction parallel to the substrate. Note that the CAAC-IGZO film shown in FIG. 11C has a composition in the vicinity of In:Ga:Zn=4:2:3 [atomic ratio]. Furthermore, in the nanobeam electron diffraction method, electron diffraction is performed with a probe diameter of 1 nm.

As shown in FIG. 11C, a plurality of spots indicating c-axis alignment are observed in the diffraction pattern of the CAAC-IGZO film.

[Structure of Oxide Semiconductor]

Note that oxide semiconductors might be classified in a manner different from that in FIG. 11A when classified in terms of the crystal structure. Oxide semiconductors are classified into a single crystal oxide semiconductor and a non-single-crystal oxide semiconductor, for example. Examples of the non-single-crystal oxide semiconductor include a c-axis-aligned crystalline oxide semiconductor (CAAC-OS) and a nanocrystalline oxide semiconductor (nc-OS). Other examples of the non-single-crystal oxide semiconductor include a polycrystalline oxide semiconductor, an amorphous-like oxide semiconductor (a-like OS), an amorphous oxide semiconductor, and the like.

Next, the CAAC-OS, the nc-OS, and the a-like OS are described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of a surface where the CAAC-OS film is formed, or the normal direction of the surface of the CAAC-OS film. In addition, the crystal region refers to a region having periodic atomic arrangement. Note that when atomic arrangement is regarded as lattice arrangement, the crystal region also refers to a region with uniform lattice arrangement. Furthermore, the CAAC-OS has a region where a plurality of crystal regions are connected in an a-b plane direction, and the region has distortion in some cases. Note that distortion refers to a portion where the direction of lattice arrangement changes between a region with uniform lattice arrangement and another region with uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. Alternatively, in the case where the crystal region is formed of a large number of fine crystals, the size of the crystal region is sometimes approximately several tens of nanometers.

In the case of an In-M-Zn oxide, the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Note that indium and the element M can be replaced with each other. Therefore, indium is sometimes contained in the (M,Zn) layer. Furthermore, the element M is sometimes contained in the In layer. Note that Zn is sometimes contained in the In layer. Such a layer-shaped structure is observed as a lattice image in a high-resolution TEM image, for example.

When the CAAC-OS film is subjected to structural analysis by out-of-plane XRD measurement with an XRD apparatus using $\theta/2\theta$ scanning, for example, a peak indicating c-axis alignment is detected at $2\theta$ of 31° or around 31°. Note that the position of the peak indicating c-axis alignment (the value of 2θ) might change depending on the kind, composition, or the like of the metal element contained in the CAAC-OS.

In addition, for example, a plurality of bright spots are observed in the electron diffraction pattern of the CAAC-OS film. Note that one spot and another spot are observed point-symmetrically with a spot of an incident electron beam passing through a sample (also referred to as a direct spot) as a symmetric center.

When the crystal region is observed from the particular direction, lattice arrangement in the crystal region is basically hexagonal lattice arrangement; however, a unit lattice is not always a regular hexagon and is a non-regular hexagon in some cases. In addition, pentagonal lattice arrangement, heptagonal lattice arrangement, and the like are included in the distortion in some cases. Note that a clear grain boundary cannot be observed even in the vicinity of the distortion in the CAAC-OS. That is, it is found that formation of a grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, it can be said that a reduction in electron mobility due to the grain boundary is unlikely to occur. In addition, entry of impurities, formation of defects, or the like might decrease the crystallinity of an oxide semiconductor. This means that the CAAC-OS can also be referred to as an oxide semiconductor having small amounts of impurities and defects (oxygen vacancies or the like). Therefore, physical properties of an oxide semiconductor including the CAAC-OS become stable. Accordingly, the oxide semiconductor including the CAAC-OS is resistant to heat and has high reliability. In addition, the CAAC-OS is also stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region greater than or equal to 1 nm and less than or equal to 10 nm, in particular, a region greater than or equal to 1 nm and less than or equal to 3 nm) has periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. In addition, there is no regularity of crystal orientation between different nanocrystals in the nc-OS. Hence, the orientation in the whole film is not observed. Accordingly, in some cases, the nc-OS cannot be distinguished from an a-like OS or an amorphous oxide semiconductor, depending on the analysis method. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are obtained in the observed electron diffraction pattern when the nc-OS film is subjected to electron diffraction (also referred to as nanobeam electron diffraction) using an electron beam with a probe diameter close to or smaller than the size of a nanocrystal (e.g., greater than or equal to 1 nm and less than or equal to 30 nm).

[a-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration in the film than the nc-OS and the CAAC-OS.

[Composition of Oxide Semiconductor]

Next, the CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. Alternatively, for example, the first region has higher [In] and lower [Ga] than the second region. Moreover, the second region has higher [Ga] and lower [In] than the first region.

Specifically, the first region contains indium oxide, indium zinc oxide, or the like as its main component. In addition, the second region contains gallium oxide, gallium zinc oxide, or the like as its main component. That is, the first region can be referred to as a region containing In as its main component. Furthermore, the second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (On/Off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$), and excellent switching operation can be achieved.

Oxide semiconductors have various structures and each have different properties. Two or more kinds among the amorphous oxide semiconductor, the polycrystalline oxide semiconductor, the a-like OS, the CAC-OS, the nc-OS, and the CAAC-OS may be included in an oxide semiconductor according to one embodiment of the present invention.

[Transistor Including Oxide Semiconductor]

Next, the case where the oxide semiconductor is used for a transistor is described.

When the oxide semiconductor is used for a transistor, a transistor with high field-effect mobility can be achieved. In addition, a highly reliable transistor can be achieved.

An oxide semiconductor having a low carrier concentration is preferably used for a channel formation region of the transistor. For example, the carrier concentration of an oxide semiconductor in the channel formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet further preferably lower than $1 \times 10^{13}$ cm$^{-3}$, yet still further preferably lower than $1 \times 10^{12}$ cm$^{-3}$, Note that in the case where the carrier concentration of an oxide semiconductor film is lowered, the impurity concentration in the oxide semiconductor film is lowered to decrease the density of defect states. In this specification and the like, a state with a low impurity concentration and a low density of defect states is referred to as a highly purified intrinsic or substantially highly purified intrinsic state. Note that an oxide semiconductor having a low carrier concentration is sometimes referred to as a highly purified intrinsic or substantially highly purified intrinsic oxide semiconductor. In addition, a highly purified intrinsic or substantially highly purified intrinsic state is sometimes referred to as an i-type or a substantially i-type.

In addition, a highly purified intrinsic or substantially highly purified intrinsic oxide semiconductor film has a low density of defect states and accordingly has a low density of trap states in some cases.

In addition, charge captured by the trap states in an oxide semiconductor takes a long time to disappear and might behave like fixed charge. Thus, a transistor whose channel formation region is formed in an oxide semiconductor having a high density of trap states has unstable electrical characteristics in some cases.

Accordingly, in order to stabilize electrical characteristics of the transistor, reducing the impurity concentration in the oxide semiconductor is effective. In addition, in order to reduce the impurity concentration in the oxide semiconductor, the impurity concentration in a film that is adjacent to the oxide semiconductor is also preferably reduced. Examples of impurities include hydrogen, nitrogen, an alkali metal, an alkaline earth metal, iron, nickel, silicon, and the like.

[Impurities]

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in a channel formation region of the oxide semiconductor and the concentration of silicon or carbon in the vicinity of an interface with the channel formation region of the oxide semiconductor (the concentration obtained by secondary ion mass spectrometry (SIMS)) are each set lower than or equal to $2 \times 10^{18}$ atoms/cm$^3$, preferably lower than or equal to $2 \times 10^{17}$ atoms/cm$^3$.

In addition, when the oxide semiconductor contains an alkali metal or an alkaline earth metal, defect states are formed and carriers are generated in some cases. Accordingly, a transistor using an oxide semiconductor that contains an alkali metal or an alkaline earth metal tends to have normally-on characteristics. Thus, the concentration of an alkali metal or an alkaline earth metal in the channel formation region of the oxide semiconductor that is obtained by SIMS is lower than or equal to $1 \times 10^{18}$ atoms/cm$^3$, preferably lower than or equal to $2 \times 10^{16}$ atoms/cm$^3$.

In addition, an oxide semiconductor containing nitrogen easily becomes n-type by generation of electrons serving as carriers and an increase in carrier concentration. Thus, a transistor using an oxide semiconductor that contains nitrogen as the semiconductor tends to have normally-on characteristics. Alternatively, when nitrogen is contained in the oxide semiconductor, a trap state is sometimes formed. This might make the electrical characteristics of the transistor unstable. Therefore, the concentration of nitrogen in the channel formation region of the oxide semiconductor that is obtained by SIMS is set lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

In addition, hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, in some cases, some hydrogen reacts with oxygen bonded to a metal atom and generates an electron serving as a carrier. Thus, a transistor using an oxide semiconductor that contains hydrogen tends to have normally-on characteristics. For this reason, hydrogen in the channel formation region of the oxide semiconductor is preferably reduced as much as possible. Specifically, the hydrogen concentration in the channel formation region of the oxide semiconductor that is obtained by SIMS is set lower than $1 \times 10^{20}$ atoms/cm$^3$, preferably lower than $5 \times 10^{19}$ atoms/cm$^3$, further preferably lower than $1 \times 10^{19}$ atoms/cm$^3$, still further preferably lower than $5 \times 10^{18}$ atoms/cm$^3$, yet still further preferably lower than $1 \times 10^{18}$ atoms/cm$^3$.

When an oxide semiconductor with sufficiently reduced impurities is used for a channel formation region in a transistor, the transistor can have stable electrical characteristics.

[Other Semiconductor Materials]

Semiconductor materials that can be used for the semiconductor 112 are not limited to the above oxide semiconductors. A semiconductor material having a bandgap (a semiconductor material that is not a zero-gap semiconductor) may be used for the semiconductor 112. For example, a single element semiconductor such as silicon, a compound semiconductor such as gallium arsenide, or a layered material (also referred to as an atomic layered material, a two-dimensional material, or the like) may be used as a semiconductor material. In particular, a layered material functioning as a semiconductor is preferably used as a semiconductor material.

In this specification and the like, the layered material is a general term of a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material functioning as a semiconductor and having high two-dimensional electrical conductivity is used for a channel-formation region, a transistor having high on-state current can be provided.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

As a semiconductor material used in a semiconductor device according to one embodiment of the present invention, transition metal chalcogenide functioning as a semiconductor may be used. Specific examples include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), zirconium selenide (typically $ZrSe_2$), and the like.

[Deposition Method]

The conductors, insulators, and semiconductors can be formed by a sputtering method, a CVD method, a molecular beam epitaxy (MBE) method, a pulsed laser deposition (PLD) method, an atomic layer deposition (ALD) method, or the like.

Note that the CVD method can be classified into a plasma enhanced CVD (PECVD) method utilizing plasma, a thermal CVD (TCVD) method utilizing heat, a photo CVD method utilizing light, and the like. Moreover, the CVD method can be classified into a metal CVD (MCVD) method and a metal organic CVD (MOCVD) method depending on a source gas to be used.

The plasma CVD method enables a high-quality film to be obtained at a comparatively low temperature. In addition, a thermal CVD method is a deposition method that does not use plasma and thus causes less plasma damage to an object to be processed. For example, a wiring, an electrode, an element (a transistor, a capacitor, or the like), or the like included in a semiconductor device might be charged up by receiving charge from plasma. In that case, accumulated charge might break the wiring, the electrode, the element, or the like included in the semiconductor device. In contrast, in the case of a thermal CVD method not using plasma, such plasma damage is not caused and the yield of the semiconductor device can be increased. Furthermore, a film with few defects can be obtained by a thermal CVD method because plasma damage during deposition is not caused.

In addition, an ALD method is also a deposition method that causes less plasma damage to an object to be processed. Furthermore, an ALD method also does not cause plasma damage during deposition, so that a film with few defects can be obtained.

Unlike a deposition method in which particles ejected from a target or the like are deposited, a CVD method and an ALD method are deposition methods in which a film is formed by reaction at a surface of an object to be processed. Thus, the CVD method and the ALD method are deposition methods that enable good step coverage almost regardless of the shape of an object to be processed. In particular, the ALD method enables excellent step coverage and excellent thickness uniformity and thus is suitably used to cover a surface of an opening with a high aspect ratio, for example. Meanwhile, the ALD method has a comparatively low deposition rate, and thus is preferably used in combination with another deposition method with a high deposition rate, such as the CVD method, in some cases.

The CVD method and the ALD method enable control of the composition of a film to be obtained with the flow rate ratio of source gases. For example, by the CVD method and the ALD method, a film with a certain composition can be deposited depending on the flow rate ratio of the source gases. Moreover, for example, by the CVD method and the ALD method, a film whose composition is continuously changed can be deposited by changing the flow rate ratio of the source gases during deposition. In the case of depositing a film while changing the flow rate ratio of the source gases, as compared with the case of depositing a film using a plurality of deposition chambers, the time taken for deposition can be shortened because the time taken for transfer and pressure adjustment is omitted. Thus, the productivity of the semiconductor device can be increased in some cases.

In addition, deposition by an ALD method may be performed in such a manner that pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves); in order to avoid mixing of the plurality of kinds of source gases, an inert gas (argon, nitrogen, or the like) or the like is introduced at the same time as or after introduction of a first source gas and then a second source gas is introduced. Note that in the case where the first source gas and the inert gas are introduced at a time, the inert gas serves as a carrier gas, and the inert gas may also be introduced at the same time as the introduction of the second source gas. Alternatively, the second source gas may be introduced after the first source gas is exhausted by vacuum evacuation instead of the introduction of the inert gas. The first source gas is adsorbed on the surface of the substrate to deposit a first thin layer; then the second source gas is introduced to react with the first thin layer; as a result, a second thin layer is stacked over the first thin layer, so that a thin film is formed. The sequence of the gas introduction is controlled and repeated a plurality of times until a desired thickness is obtained, so that a thin film with excellent step coverage can be formed. The thickness of the thin film can be adjusted by the number of repetition times of the sequence of the gas introduction; therefore, an ALD method makes it possible to accurately adjust film thickness and is thus suitable for manufacturing a minute FET.

A variety of films such as metal films, semiconductor films, and inorganic insulating films can be formed by a thermal CVD method such as a MOCVD method or an ALD method. For example, trimethylindium (In(CH$_3$)$_3$), trimethylgallium (Ga(CH$_3$)$_3$), and dimethylzinc (Zn(CH$_3$)$_2$) are used to deposit an In—Ga—Zn—O film. In addition, without limitation to the above combination, triethylgallium (Ga(C$_2$H$_5$)$_3$) can also be used instead of trimethylgallium and diethylzinc (Zn(C$_2$H$_5$)$_2$) can also be used instead of dimethylzinc.

For example, in the case where a hafnium oxide film is formed by a deposition apparatus utilizing ALD, two kinds of gases, ozone (O$_3$) as an oxidizer and a source gas that is obtained by vaporizing liquid containing a solvent and a hafnium precursor compound (hafnium alkoxide or hafnium amide such as tetrakis(dimethylamide)hafnium (TDMAH, Hf[N(CH$_3$)$_2$]$_4$)), are used. Furthermore, examples of another material include tetrakis(ethylmethylamide)hafnium and the like.

For example, in the case where an aluminum oxide film is formed by a deposition apparatus utilizing ALD, two kinds of gases, H$_2$O as an oxidizer and a source gas that is obtained by vaporizing liquid containing a solvent and an aluminum precursor compound (trimethylaluminum (TMA, Al(CH$_3$)$_3$) or the like) are used. Furthermore, examples of another material include tris(dimethylamide)aluminum, triisobutylaluminum, aluminum tris(2,2,6,6-tetramethyl-3,5-heptanedionate), and the like.

For example, in the case where a silicon oxide film is formed by a deposition apparatus utilizing ALD, hexachlorodisilane is adsorbed on a surface on which a film is to be formed, and radicals of an oxidizing gas (O$_2$ or dinitrogen monoxide) are supplied to react with the adsorbate.

For example, in the case where a tungsten film is deposited by a deposition apparatus utilizing ALD, a WF$_6$ gas and a B$_2$H$_6$ gas are sequentially and repeatedly introduced to form an initial tungsten film, and then a WF$_6$ gas and an H$_2$ gas are sequentially and repeatedly introduced to form a tungsten film. Note that an SiH$_4$ gas may be used instead of a B$_2$H$_6$ gas.

For example, in the case where an oxide semiconductor film, an In—Ga—Zn—O film, is deposited by a deposition apparatus utilizing ALD, an In(CH$_3$)$_3$ gas and an O$_3$ gas are sequentially and repeatedly introduced to form an In—O layer, a Ga(CH$_3$)$_3$ gas and an O$_3$ gas are sequentially and repeatedly introduced to form a GaO layer, and then a Zn(CH$_3$)$_2$ gas and an O$_3$ gas are sequentially and repeatedly introduced to form a ZnO layer. Note that the order of these layers is not limited to this example. In addition, a mixed oxide layer such as an In—Ga—O layer, an In—Zn—O layer, or a Ga—Zn—O layer may be formed by using these gases. Note that although an H$_2$O gas that is obtained by bubbling water with an inert gas such as Ar may be used instead of an O$_3$ gas, it is preferable to use an O$_3$ gas, which does not contain H. Furthermore, instead of an In(CH$_3$)$_3$ gas, an In(C$_2$H$_5$)$_3$ gas may be used. Furthermore, instead of a Ga(CH$_3$)$_3$ gas, a Ga(C$_2$H$_5$)$_3$ gas may be used. Furthermore, instead of a Zn(CH$_3$)$_2$ gas, a Zn(C$_2$H$_5$)$_2$ gas may be used.

<Example of Connection to Peripheral Circuit>

Figure 12A:
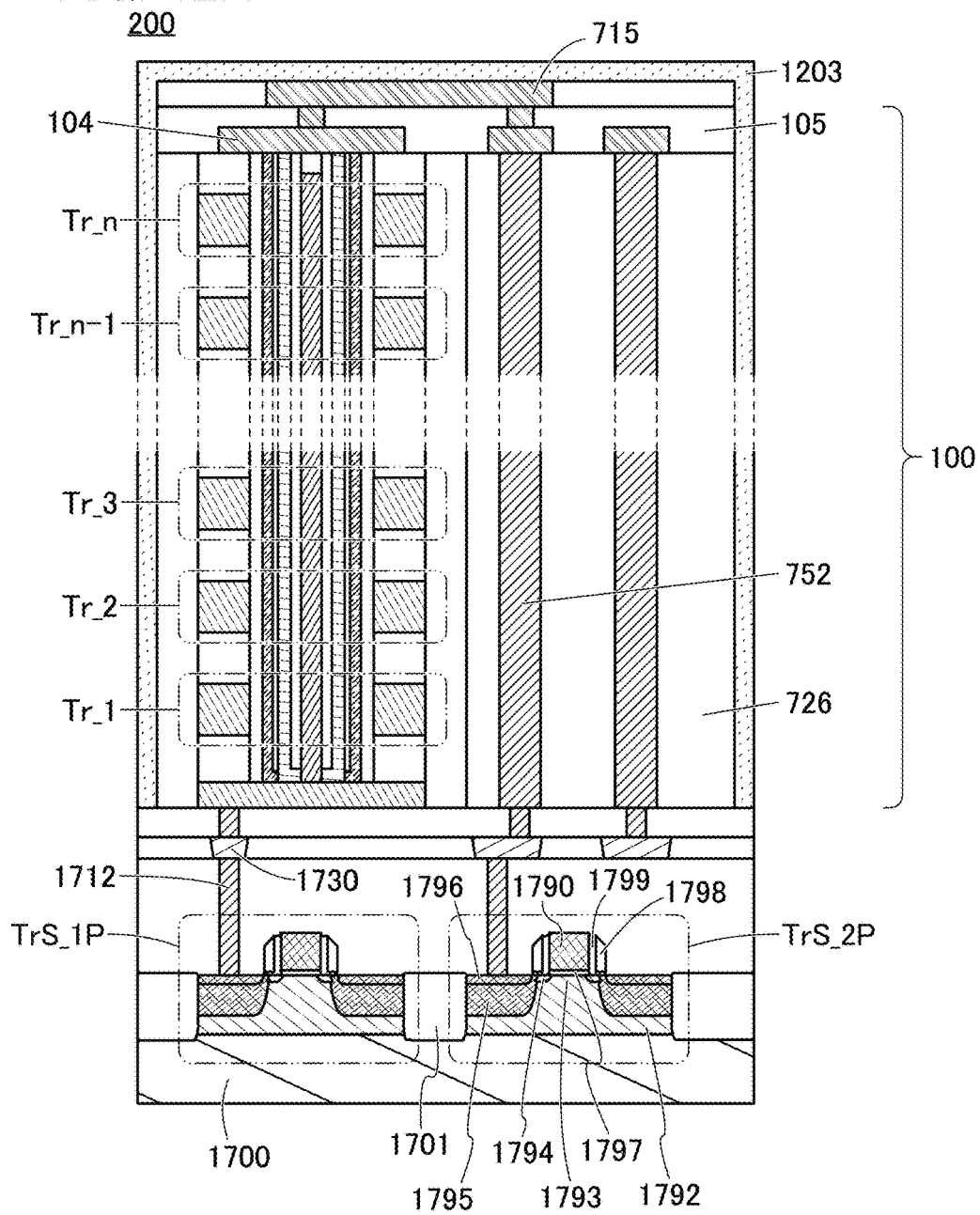
FIG. 12A and FIG. 12B are cross-sectional views of a semiconductor device.

A peripheral circuit such as a read circuit or a precharge circuit may be formed below the memory string 100 according to one embodiment of the present invention. The transistor TrS illustrated in FIG. 4 may be provided in the peripheral circuit. In this case, Si transistors are formed on a silicon substrate or the like to form the peripheral circuit, and then the memory string 100 according to one embodiment of the present invention is formed over the peripheral circuit. FIG. 12A is a cross-sectional view of a semiconductor device 200 where a peripheral circuit is formed using planar Si transistors (a transistor TrS_1P and a transistor TrS_2P) and the memory string 100 according to one embodiment of the present invention is formed over the peripheral circuit. In addition, FIG. 13A is a cross-sectional view of a semiconductor device 200A where a peripheral circuit is formed using FIN-type Si transistors (a transistor TrS_1F and a transistor TrS_2F) and the memory string 100 according to one embodiment of the present invention is formed over the peripheral circuit.

The transistor TrS_1P, the transistor TrS_2P, the transistor TrS_1F, and the transistor TrS_2F function as selection transistors. A memory string from or to which data is read or written can be selected by the selection transistor.

Note that memory strings that can be used for the semiconductor device 200 and the semiconductor device 200A are not limited to the memory string 100. The memory string 100A, the memory string 100B, or the memory string 100C may be used instead of the memory string 100.

Figure 13A:
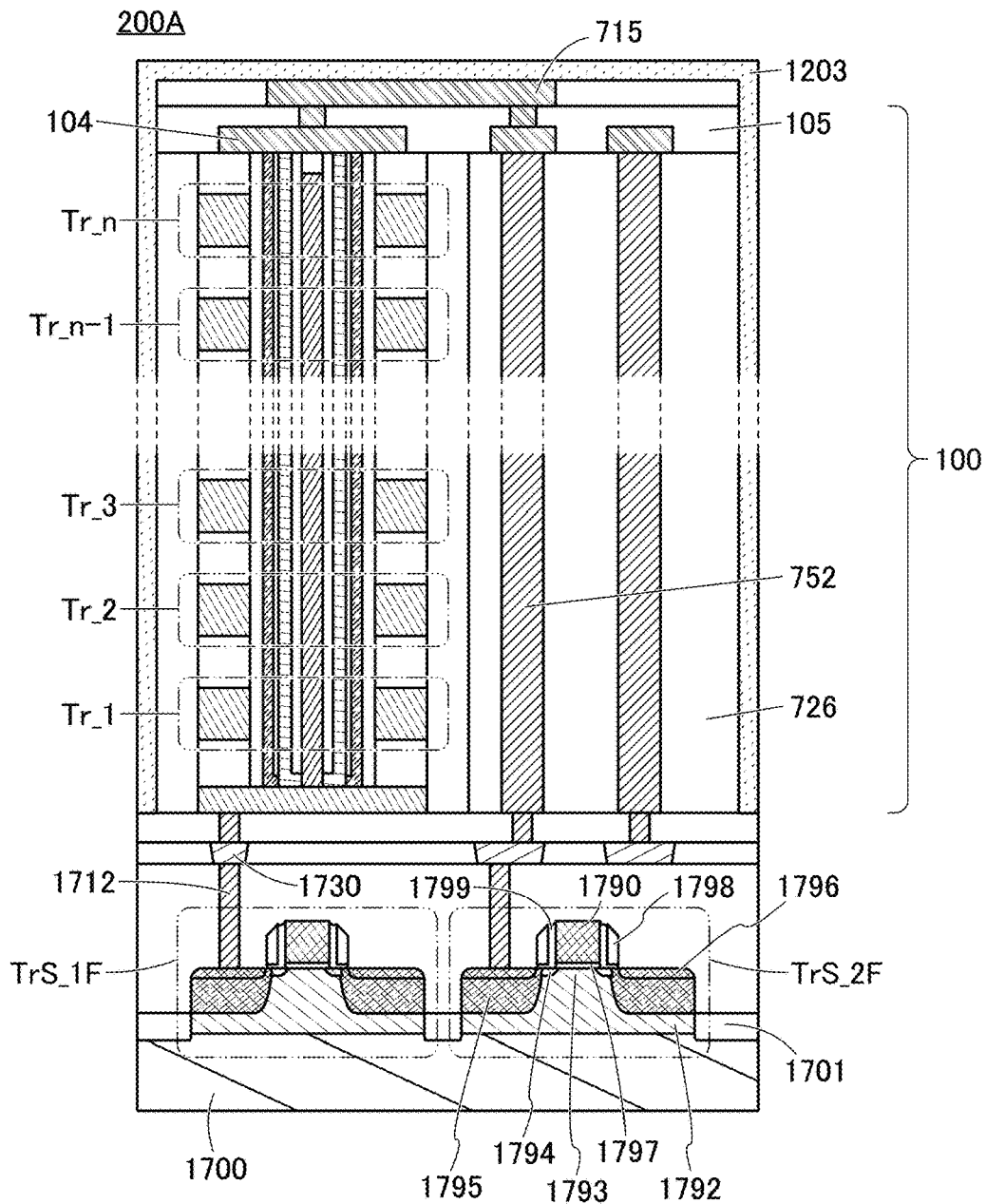
FIG. 13A and FIG. 13B are cross-sectional views of a semiconductor device.

In FIG. 12A and FIG. 13A, the Si transistors configuring the peripheral circuit are formed on a substrate 1700. An element isolation layer 1701 is formed between a plurality of Si transistors. Conductors 1712 are formed as a source and a drain of the Si transistor. A conductor 1730 is formed with extension in a channel width direction and is connected to another Si transistor or the conductor 1712 (not illustrated).

As the substrate 1700, the substrates described above can be used. For example, a single crystal semiconductor substrate or a polycrystalline semiconductor substrate formed of silicon or silicon carbide, a compound semiconductor substrate formed of silicon germanium, an SOI substrate, or the like can be used.

Moreover, a glass substrate, a quartz substrate, a plastic substrate, a metal substrate, a flexible substrate, an attachment film, paper containing a fibrous material, a base film, or the like may be used as the substrate 1700, for example. Alternatively, after a semiconductor element is formed using one substrate, the semiconductor element may be transferred to another substrate. As an example, FIG. 12A and FIG. 13A illustrate examples in which a single crystal silicon wafer is used as the substrate 1700.

In addition, in FIG. 12A, the transistor TrS_1P is electrically connected to the transistor Tr_1, and the transistor TrS_2P is electrically connected to the transistor Tr_n. Furthermore, in FIG. 13A, the transistor TrS_1F is electrically connected to the transistor Tr_1, and the transistor TrS_2F is electrically connected to the transistor Tr_n.

A gate of the transistor TrS_1 is electrically connected to the wiring SEL_1. In addition, one of a source and a drain of the transistor TrS_1 is electrically connected to the wiring SL, and the other thereof is electrically connected to one of a source and a drain of the transistor Tr_1. The gate of the transistor TrS_2 is electrically connected to the wiring SEL_2. Furthermore, one of a source and a drain of the transistor TrS_2 is electrically connected to the wiring BL, and the other thereof is electrically connected to one of a source and a drain of a transistor Tr_2n through a conductor 715, a conductor 752, and the like. The conductor 752 is provided to be embedded in an insulator 726.

Moreover, in FIG. 12A and FIG. 13A, an insulator 1203 is formed to cover the conductor 104, the memory string 100, and the like. As the insulator 1203, an insulator having a function of inhibiting passage of oxygen and impurities such as hydrogen is preferably used. When an insulator having a function of inhibiting passage of oxygen and impurities such as hydrogen is used as the insulator 1203, it is possible to inhibit diffusion of impurities from the outside (e.g., a water molecule, a hydrogen atom, a hydrogen molecule, an oxygen atom, an oxygen molecule, a nitrogen atom, a nitrogen molecule, and a nitrogen oxide molecule (such as $N_2O$, NO, and $NO_2$)) into the memory string 100.

Figure 12B:
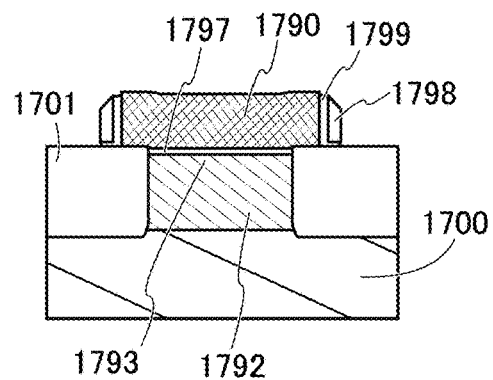

Here, the details of the Si transistors are described. FIG. 12A illustrates a cross-sectional view of planar Si transistors (the transistor TrS_1P and the transistor TrS_2P) in a channel length direction, and FIG. 12B illustrates a cross-sectional view of the planar Si transistor in a channel width direction. The Si transistor includes a channel formation region 1793 provided in a well 1792, low-concentration impurity regions 1794 and high-concentration impurity regions 1795 (also collectively referred to simply as impurity regions), conductive regions 1796 provided in contact with the impurity regions, a gate insulating film 1797 provided over the channel formation region 1793, a gate electrode 1790 provided over the gate insulating film 1797, and sidewall insulating layers 1798 and sidewall insulating layers 1799 provided on side surfaces of the gate electrode 1790. Note that for the conductive regions 1796, a metal silicide or the like may be used.

Figure 13B:
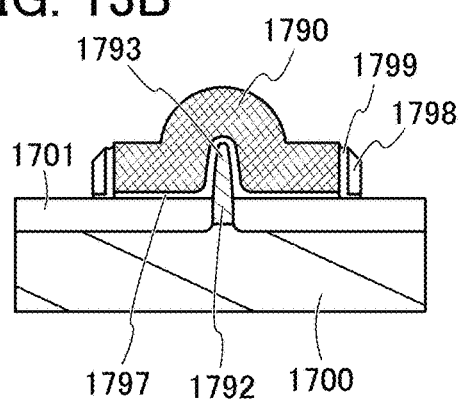

In addition, FIG. 13A illustrates a cross-sectional view of FIN-type Si transistors (the transistor TrS_1F and the transistor TrS_2F) in a channel length direction, and FIG. 13B illustrates a cross-sectional view of the FIN-type Si transistor in a channel width direction. In the Si transistors illustrated in FIG. 13A and FIG. 13B, the channel formation region 1793 has a projecting portion, and the gate insulating film 1797 and the gate electrode 1790 are provided along its side surface and top surface. Although the case where the projecting portion is formed by processing part of the semiconductor substrate is described in this embodiment, a semiconductor layer with a projecting shape may be formed by processing an SOI substrate. Note that the reference numerals shown in FIG. 13A and FIG. 13B are the same as the reference numerals shown in FIG. 12A and FIG. 12B.

<Operation Example of Memory String>

Figure 14A:
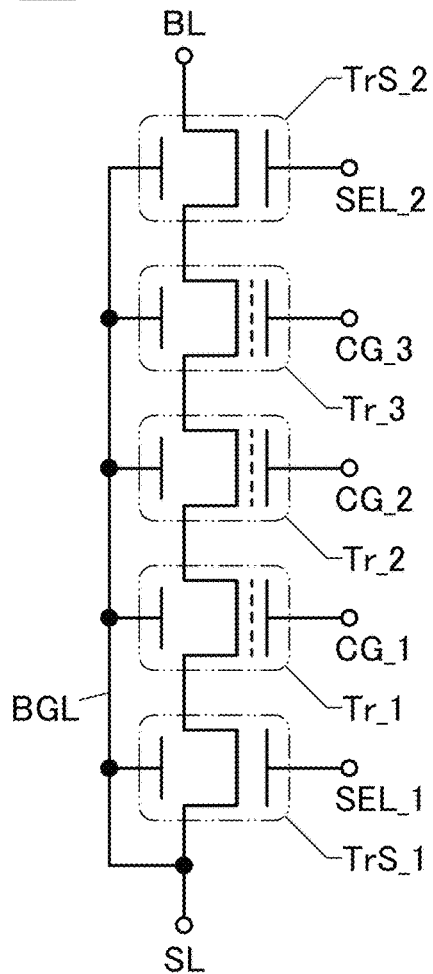
FIG. 14A is a circuit diagram of a memory string.

Next, an operation example of a memory string according to one embodiment of the present invention is described using drawings. Here, an operation example of a memory string is described by giving a memory string 250 including three memory cells and two selection transistors as an example. FIG. 14A illustrates a circuit diagram of the memory string 250.

The structure of the memory string 250 corresponds to the structure of the memory string 100A. Thus, although an operation example of the memory string 100A is described in this embodiment, the operations of the memory string 100, the memory string 100B, and the memory string 100C can be understood similarly.

As described above, the transistor Tr functions as a memory cell. Data is written through injection of charge into the charge accumulation layer (the functional layer 114) included in the transistor Tr. The transistor Tr is preferably a transistor that functions as a normally-on transistor after data erase. In addition, the transistor TrS_1 and the transistor TrS_2 are preferably normally-off transistors.

Figure 14B:
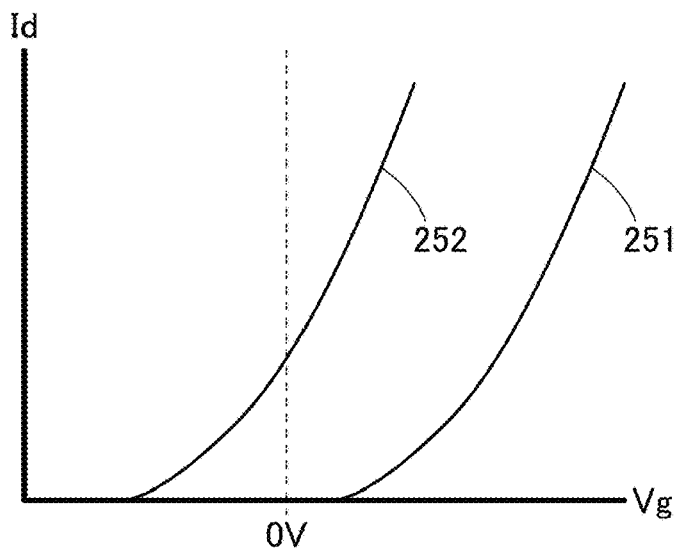
FIG. 14B is a diagram showing examples of Id-Vg characteristics of transistors.

Here, Id-Vg characteristics of transistors are described. FIG. 14B is a diagram showing examples of Id-Vg characteristics of transistors. In FIG. 14B, the horizontal axis represents gate voltage (Vg) and the vertical axis represents drain current (Id). Characteristics 251 show Id-Vg characteristics of a normally-off transistor, and characteristics 252 show Id-Vg characteristics of a normally-on transistor.

In a normally-off transistor, a channel resistance value (a resistance value between a source and a drain) at the time when Vg is 0 V is extremely high and Id hardly flows. In contrast, in a normally-on transistor, a channel resistance value at the time when Vg is 0 V is low and a large amount of Id flows compared with the normally-off transistor. In general, when a transistor is an n-channel transistor, the threshold voltage VthD of a normally-on transistor and the threshold voltage VthE of a normally-off transistor satisfy a relation VthD<VthE.

[Erase Operation]

Before information is written to a given memory cell, it is necessary to erase data that has been written. In this embodiment, it is assumed that an electron corresponding to data "1" is injected into the charge accumulation layer of each of the transistor Tr_1 to the transistor Tr_3. Id-Vg characteristics of the transistor Tr_1 to the transistor Tr_3 at this time correspond to the characteristics 251 shown in FIG. 14B.

Figure 15A:
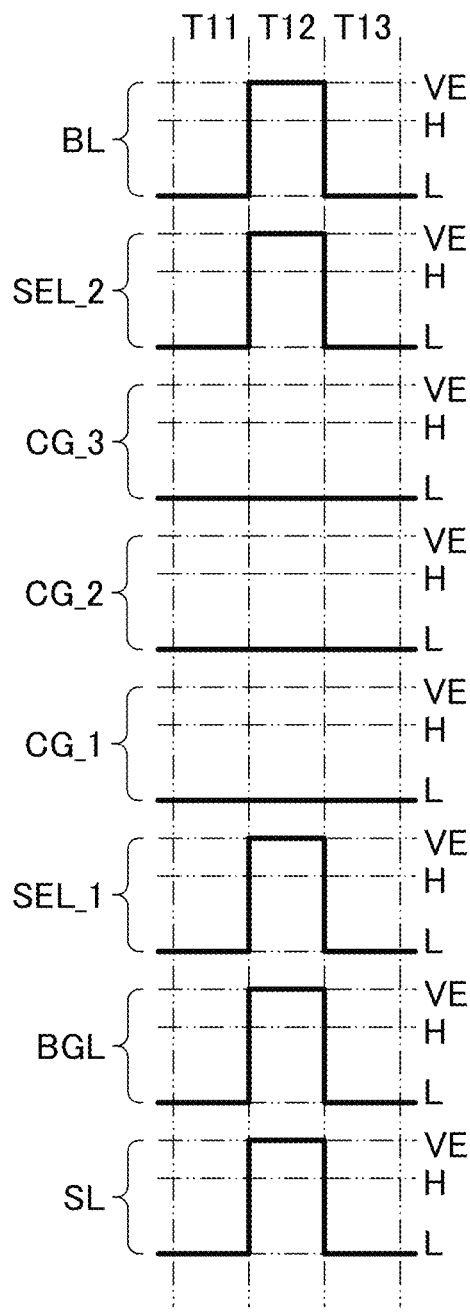
FIG. 15A is a timing chart illustrating an erase operation of the memory string.
Figure 15B:
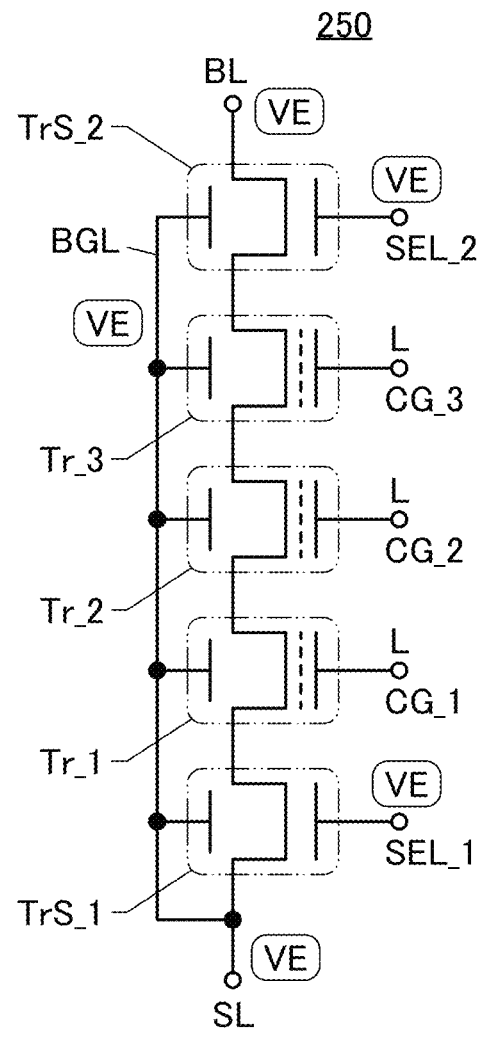
FIG. 15B is a circuit diagram illustrating the memory string in an operating state.

FIG. 15A is a timing chart for illustrating an erase operation. FIG. 15B is a circuit diagram illustrating the memory string 250 in an operating state in a period T12. In a circuit diagram or the like illustrating an operating state, in order to make it easy to know the potential of a wiring or the like, a sign such as "H" representing an H potential or "L" representing an L potential is written beside the wiring or the like. In addition, the sign such as "H" or "L" is sometimes written by an enclosed character near a wiring or the like whose potential has changed. Furthermore, an "×" symbol sometimes overlaps with an off-state transistor.

In a period T11, the L potential (0 V) is supplied to the witting BL, the wiring SL, the wiring SEL_1, the wiring SEL_2, the wiring CG_1 to a wiring CG_3, and the wiring BGL.

In the period T12, a VE potential is supplied to the wiring BL, the wiring SL, the wiring SEL_1, the wiring SEL_2, and the wiring BGL. The VE potential is a potential that is higher than the H potential. For example, when the H potential is set to 5 V, the VE potential is preferably higher than or equal to 10 and lower than or equal to 30 V, further preferably higher than or equal to 15 and lower than or equal to 25 V. The VE potential is preferably greater than or equal to 2 times and less than or equal to 6 times, further preferably greater than or equal to 3 times and less than or equal to 5 times the H potential. The VE potential is a potential that can release electrons from the charge accumulation layer (the functional layer 114) to the semiconductor 112 through the tunnel layer (the insulator 113) owing to a potential difference from the L potential.

An oxide semiconductor can hardly generate holes. Thus, in the case where an oxide semiconductor is used as the semiconductor 112, data erasing by injection of holes cannot be performed. Accordingly, it is necessary to erase data by extracting electrons from the charge accumulation layer. However, the erasure by extracting electrons takes more time than the erasure by injection of holes.

When the L potential is supplied to the wiring CG and a potential higher than the H potential is supplied to the wiring BGL, the extraction of electrons from the charge accumulation layer to a semiconductor layer can be performed quickly and more surely.

Figure 16:
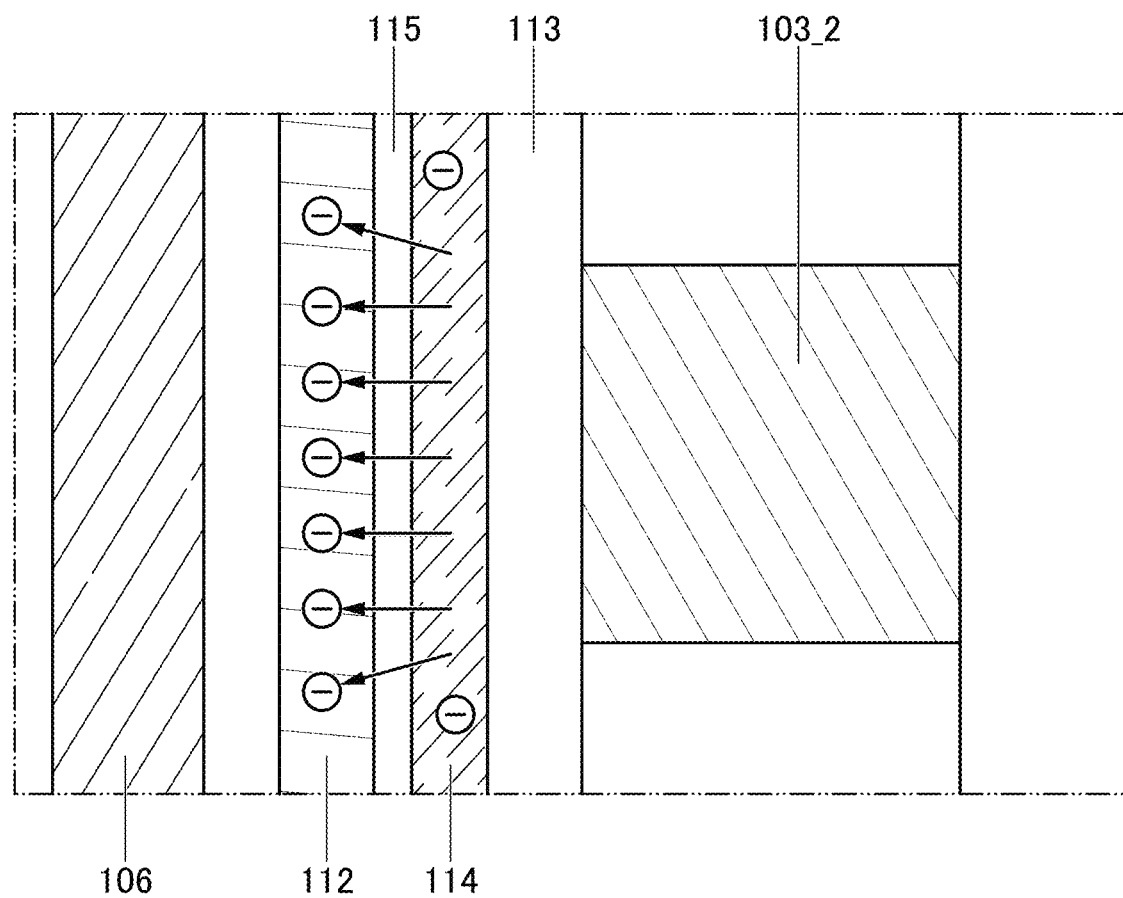
FIG. 16 is a cross-sectional view of a memory cell.

FIG. 16 illustrates part of a cross-sectional view of the transistor Tr_2 (memory cell) in the period T12. FIG. 16 schematically illustrates movement of electrons in the period T12.

In a period T13, the L potential is supplied to the wiring BL, the wiring SL, the wiring SEL_1, the wiring SEL_2, the wiring CG_1 to the wiring CG_3, and the wiring BGL. In this manner, data retained in the transistor Tr_2 can be erased. Because of data erase, the threshold voltage of the transistor Tr is shifted in a negative direction and the transistor Tr becomes a normally-on transistor. Id-Vg characteristics of the transistor Tr at this time correspond to the characteristics 252 shown in FIG. 14B. Thus, data "0" can be regarded as being retained in the transistor Tr.

Although the wiring BL, the wiring SL, the wiring SEL_1, and the wiring SEL_2 are shared by a memory string performing data erasure, in a memory string where data erasure is not performed, the wiring CG connected to the latter memory string may be brought into a floating state. Alternatively, the VE potential may be supplied to the wiring CG connected to the latter memory string.

[Write Operation]

Next, a write operation is described. The write operation is performed after the erase operation. In this embodiment, an example of a write operation to the transistor Tr_2 is described. In this embodiment, an operation of writing data "1" to the transistor Tr_2 is described.

Figure 17A:
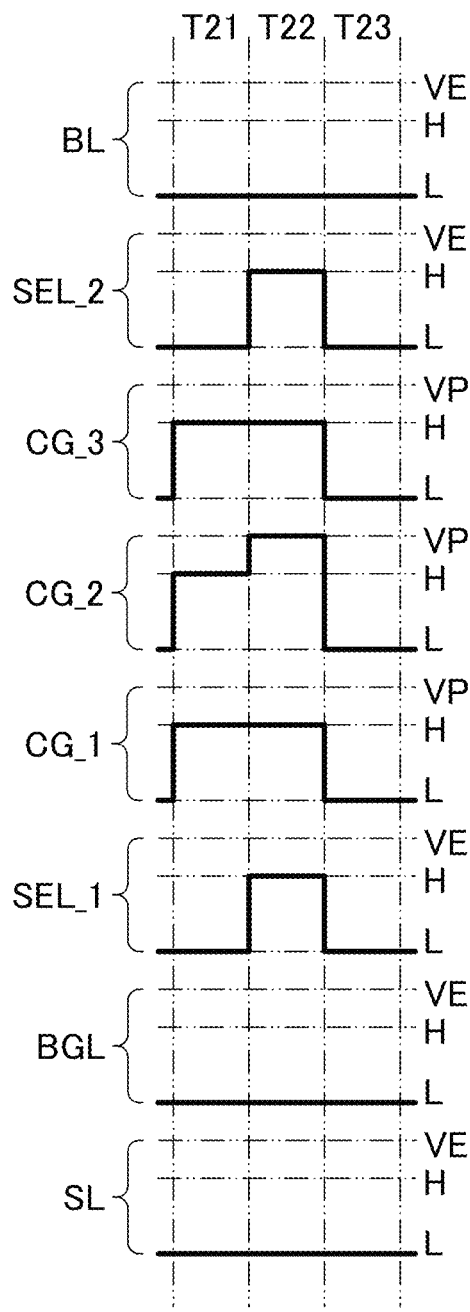
FIG. 17A is a timing chart illustrating a write operation of the memory string.
Figure 17B:
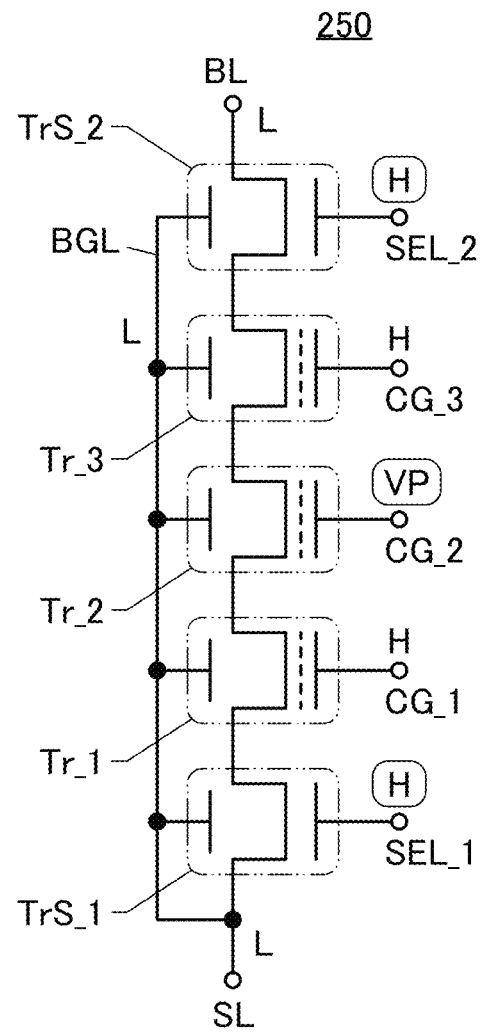
FIG. 17B is a circuit diagram illustrating the memory string in an operating state.

FIG. 17A is a timing chart for illustrating a write operation. FIG. 17B is a circuit diagram illustrating the memory string 250 in the operating state in a period T22.

In a period T21, the L potential is supplied to the wiring BL, the wiring SL, the wiring BGL, the wiring SEL_1, and the wiring SEL_2. In addition, the H potential is supplied to the wiring CG_1 to the wiring CG_3. Note that the H potential is a potential at which a normally-off transistor can be brought into an on state. The H potential is set to higher than or equal to 5 V and lower than or equal to 10 V. When the H potential is supplied to the wiring CG_1 to the wiring CG_3, the transistor Tr_1 to the transistor Tr_3 can be brought into an on state.

In the period T22, the H potential is supplied to the wiring SEL_1 and the wiring SEL_2. In addition, a VP potential is supplied to the wiring CG_2. The VP potential is a potential that is higher than the H potential. Moreover, the VP potential is a potential that can inject electrons from the semiconductor 112 into the charge accumulation layer (the functional layer 114) through the tunnel layer (the insulator 113) owing to a potential difference between the VP potential and the L potential. For example, when the H potential is 5 V, the VP potential is higher than or equal to 10 V and lower than or equal to 20 V. The VP potential is greater than or equal to 2 times and less than or equal to 4 times the H potential.

In the period T22, when the VP potential is supplied to the wiring CG_2, electrons are injected into the charge accumulation layer (the functional layer 114).

Figure 18:
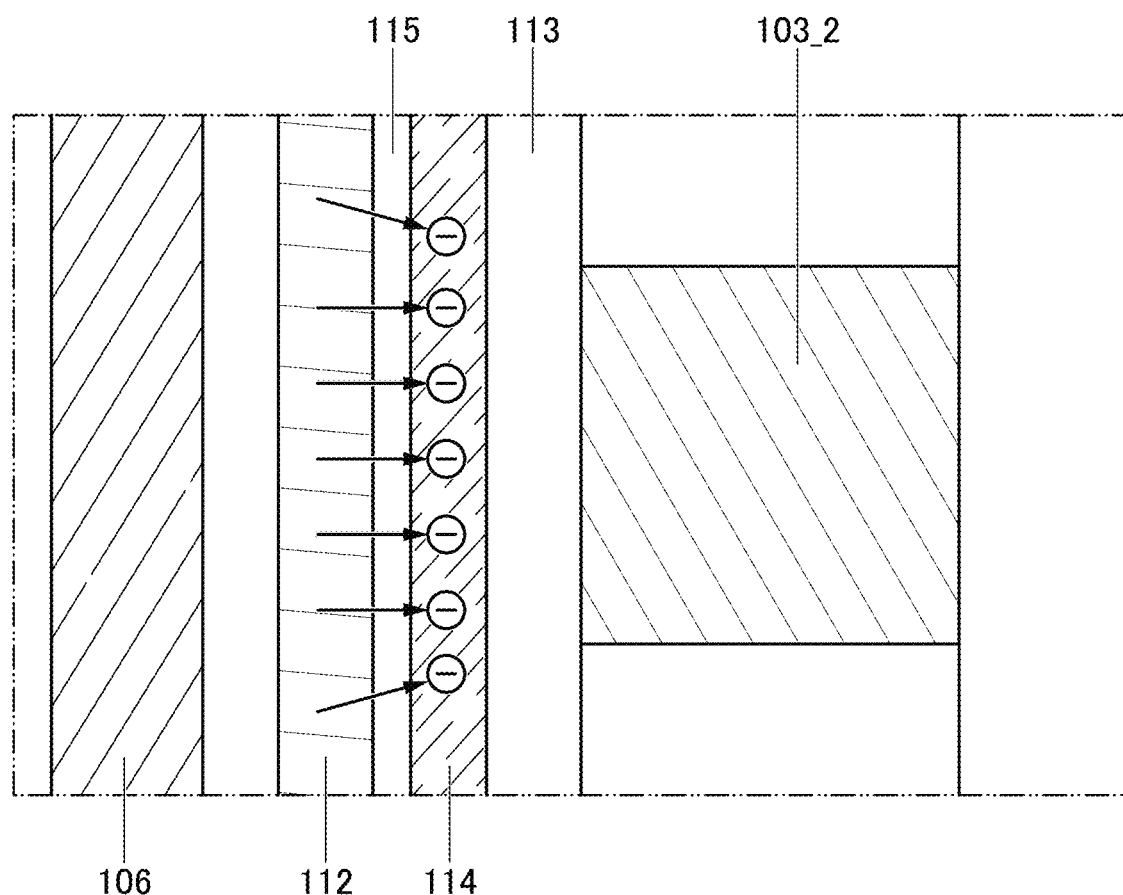
FIG. 18 is a cross-sectional view of the memory cell.

FIG. 18 illustrates part of a cross-sectional view of the transistor Tr_2 (memory cell) in the period T22. FIG. 18 schematically illustrates movement of electrons and holes in the period T22.

In a period T23, the L potential is supplied to the wiring BL, the wiring SL, the wiring BGL, the wiring SEL_1, the wiring SEL_2, and the wiring CG_1 to the wiring CG_3. In this manner, the data "1" can be written to the transistor Tr_2. Because of the data "1" writing, the threshold voltage of the transistor Tr_2 is shifted in a positive direction and the transistor Tr_2 becomes a normally-off transistor. Id-Vg characteristics of the transistor Tr_2 at this time correspond to the characteristics 251 shown in FIG. 14B.

[Read Operation]

Figure 19A:
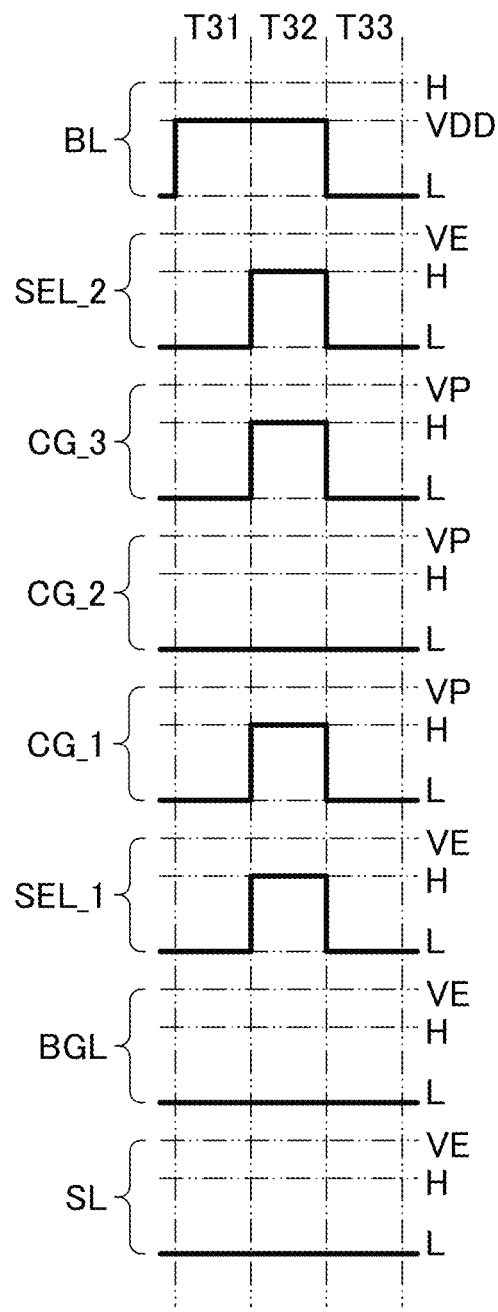
FIG. 19A is a timing chart illustrating a read operation of the memory string.
Figure 19B:
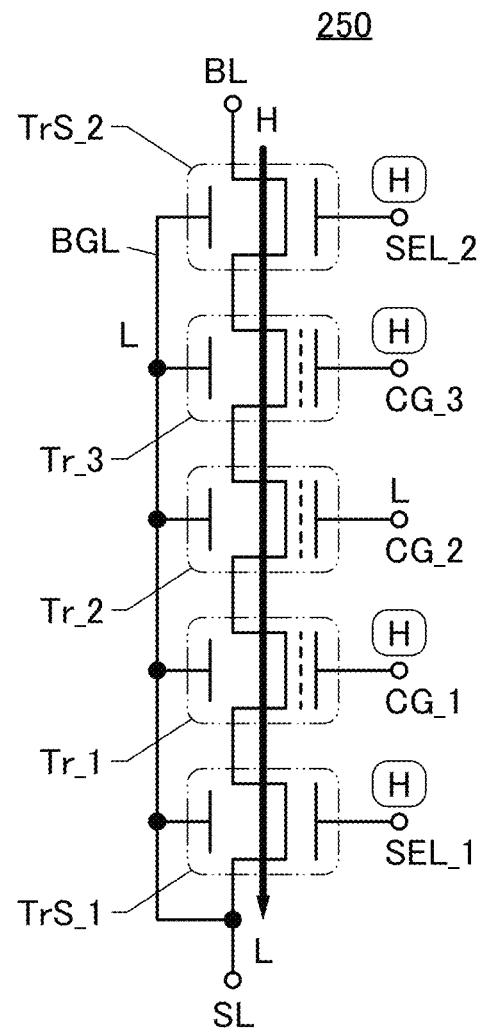
FIG. 19B is a circuit diagram illustrating the memory string in an operating state.

Next, a read operation is described. In this embodiment, a read operation of data retained in the transistor Tr_2 is described. FIG. 19A is a timing chart for illustrating the read operation. FIG. 19B is a circuit diagram illustrating the memory string 250 in the operating state in a period T32.

In a period T31, the L potential is supplied to the wiring SL, the wiring BGL, the wiring SEL_1, the wiring SEL_2, and the wiring CG_1 to the wiring CG_3. In addition, a VDD potential is supplied to the wiring BL. The VDD potential is a potential higher than the L potential. For example, the VDD potential may be a potential higher than the L potential and lower than the H potential. For example, in the case where the L potential is 0 V and the H potential is 5 V, the VDD potential may be 3 V.

In the period T32, the H potential is supplied to the wiring SEL_1, the wiring SEL_2, the wiring CG_1, and the wiring CG_3 while the VDD potential is supplied to the wiring BL. The potential of the wiring CG_2 remains L.

The transistor Tr_2 (memory cell) functions as a normally-on transistor at the time of retaining data "0," and thus is not brought into an off state even when the potential of the wiring CG_2 is L. In contrast, the transistor Tr_2 functions as a normally-off transistor at the time of retaining data "1," and thus is brought into an off state when the potential of the wiring CG_2 is L. Accordingly, the amount of current flowing between the wiring BL and the wiring SL is changed depending on the data retained in the transistor Tr_2 (memory cell). That is, the amount of current flowing through the wiring BL or the amount of current flowing through the wiring SL is changed. When the current value of the wiring BL or the wiring SL is measured, data retained (stored) in the memory cell can be read out.

In a period T33, the L potential is supplied to the wiring BL, the wiring SL, the wiring BGL, the wiring SEL_1, the wiring SEL_2, and the wiring CG_1 to the wiring CG_3. In this manner, data retained in the transistor Tr_2 can be read out.

This embodiment can be combined as appropriate with any of the other embodiments and the like described in this specification.

Embodiment 2

A memory string 300 according to one embodiment of the present invention is described using drawings. The memory string 300 is a modification example of the memory string 100A described in the above embodiment. Thus, in this embodiment, description overlapping with the description in the above embodiment is kept to the minimum.

Figure 20:
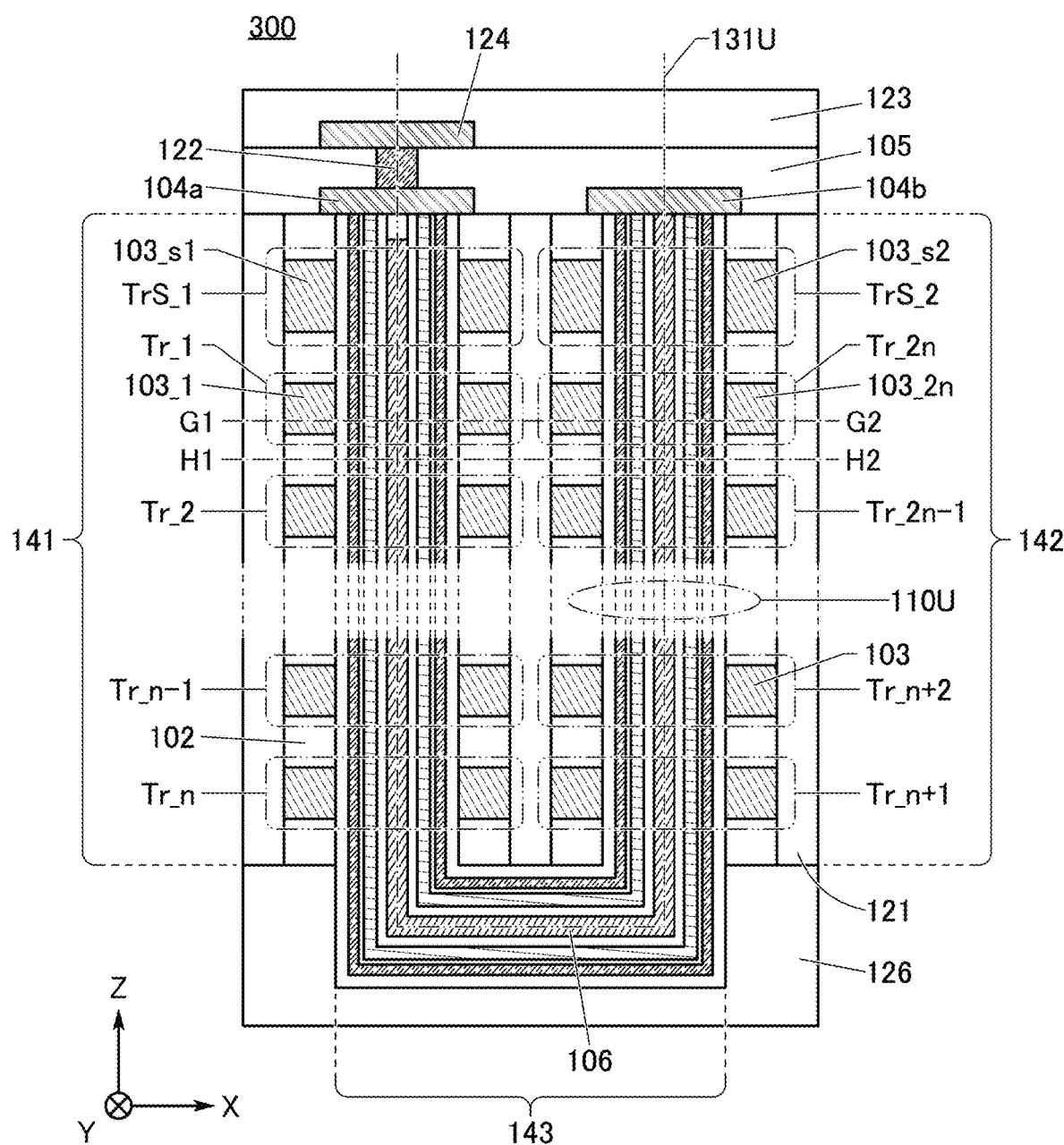
FIG. 20 is a cross-sectional view of a memory string.
Figure 21A:
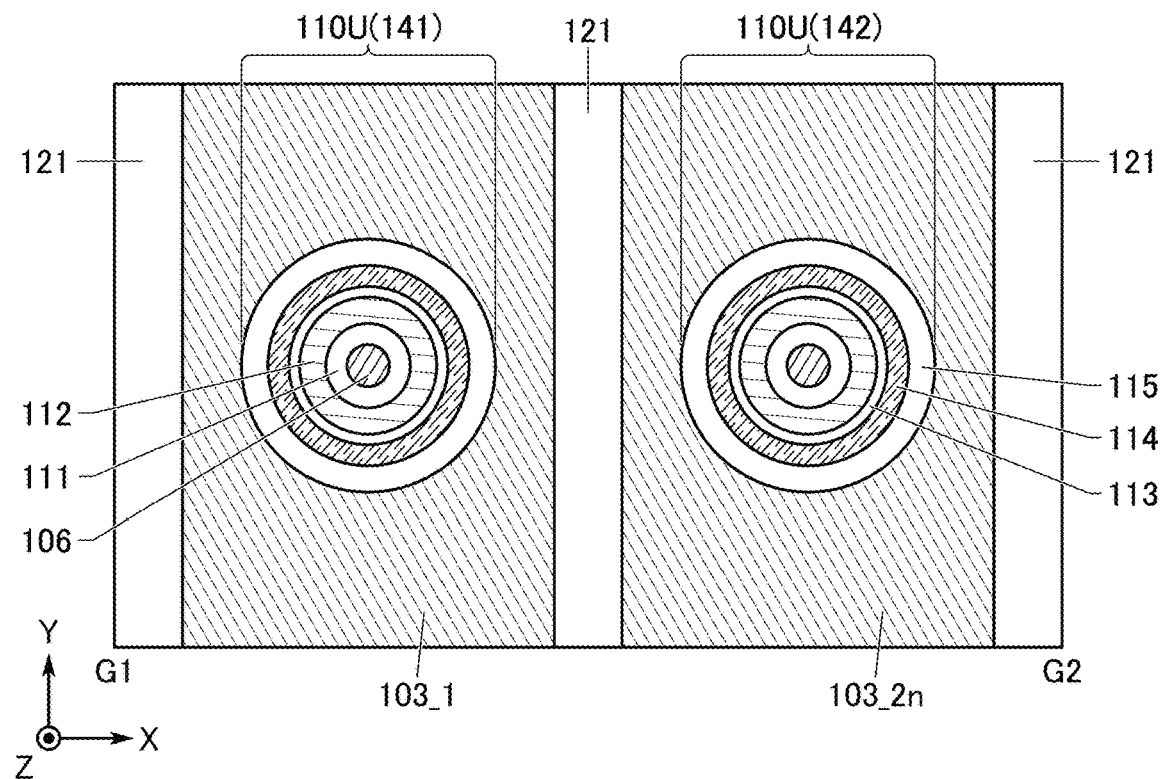
FIG. 21A and FIG. 21B are cross-sectional views of the memory string.
Figure 21B:
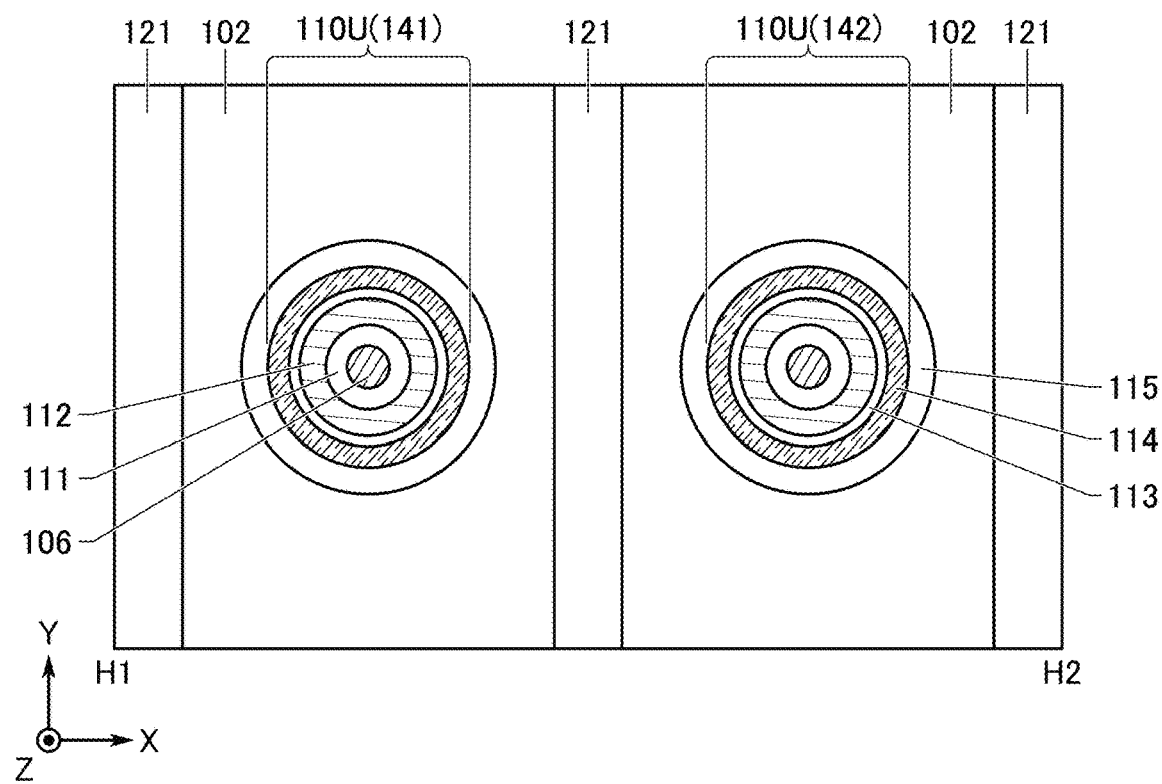

FIG. 20 is a cross-sectional view of the memory string 300 seen from the Y direction. FIG. 21A is a cross-sectional view in which a portion G1-G2 represented by a dashed-dotted line in FIG. 20 is seen from the Z direction. FIG. 21B is a cross-sectional view in which a portion H1-H2 represented by a dashed-dotted line in FIG. 20 is seen from the Z direction.

The memory string 300 includes a structure body 110U. FIG. 20 illustrates a central axis 131U of the memory string 300. The central axis 131U corresponds to the central axis 131 of the memory string 100A. The structure body 110U is the structure body 110 that has a U shape when seen from the Y direction. The structure body 110U includes two portions (a portion 141 and a portion 142) that extend in the Z direction and a portion (a portion 143) that extends in the X direction. The central axis 131U extends in the Z direction in the portion 141 and the portion 142 and extends in the X direction in the portion 143.

Like the structure body 110, the structure body 110U includes the conductor 106, the insulator 111, the semiconductor 112, the insulator 113, the functional layer 114, and the insulator 115. In the structure body 110U, the conductor 106 extends along the central axis 131U, the insulator 111 is provided to be adjacent to the side surface of the conductor 106, and the semiconductor 112 is provided to be adjacent to the side surface of the insulator 111. In addition, the insulator 113 is provided to be adjacent to the semiconductor 112, and the functional layer 114 is provided to be adjacent to the insulator 113. Furthermore, the insulator 115 is provided to be adjacent to the functional layer 114. The insulator 111, the semiconductor 112, the insulator 113, the functional layer 114, and the insulator 115 each have a U shape when seen from the Y direction. Furthermore, as illustrated in FIG. 21A and FIG. 21B, the semiconductor 112, the insulator 113, the functional layer 114, the insulator 115, and the insulator 111 are each concentrically provided outside the conductor 106.

The memory string 300 includes an insulator 126 instead of the conductor 101 illustrated in FIG. 1 and the like. The portion 141 and the portion 142 are provided above the insulator 126. In addition, the portion 143 is provided to be embedded in the insulator 126.

One end of the structure body 110U is connected to a conductor 104a, and the other end thereof is connected to a conductor 104b. In particular, one end of the semiconductor 112 included in the structure body 110U is electrically connected to the conductor 104a, and the other end thereof is electrically connected to the conductor 104b. The conductor 106 is electrically connected to the conductor 104b but is not connected to the conductor 104a.

The insulator 105 is provided over the conductor 104a and the conductor 104b, and a conductor 124 is provided over the insulator 105. In addition, an insulator 123 is provided over the conductor 124. The conductor 104a is electrically connected to the conductor 124 through a conductor 122.

A region (an intersection portion) where the structure body 110U overlaps with the conductor 103 functions as the transistor Tr in the portion 141 and the portion 142. Thus, a region (an intersection portion) where the structure body 110 overlaps with the conductor 103 functions as a memory cell. In FIG. 20, n transistors Tr are provided in each of the portion 141 and the portion 142. Note that in FIG. 20, in the portion 141, the transistor Tr that is close to the conductor 104a is referred to as the "transistor Tr_1," and the transistor Tr that is close to the portion 143 is referred to as the transistor Tr_n." In addition, in the portion 142, the transistor Tr that is close to the conductor 104b is referred to as the "transistor Tr_2n," and the transistor Tr that is close to the portion 143 is referred to as a "transistor Tr_n+1." Note that in FIG. 20, the conductor 103 that can function as a gate electrode of the transistor Tr_1 is referred to as the conductor 103_1. Furthermore, the conductor 103 that can function as a gate electrode of the transistor Tr_2n is referred to as a conductor 103_2n.

The transistors Tr functioning as memory cells are provided in a portion overlapping with the portion 141 and a portion overlapping with the portion 142 in the memory string 300. Thus, the portion overlapping with the portion 141 in the memory string 300 can be regarded as the memory string 100A. Similarly, the portion overlapping with the portion 142 in the memory string 300 can be regarded as the memory string 100A. In addition, the portion 143 can be regarded as a connection portion for electrically connecting two memory cells. Therefore, it can be said that the memory string 300 has a structure where two adjacent memory strings 100A are electrically connected to each other through a connection portion.

In addition, the memory string 300 has a region where the structure body 110U overlaps with a conductor 103_s1 between the transistor Tr_1 and the conductor 104a. A conductor 103_s1 extends in the Y direction. The region functions as the transistor TrS_1. Furthermore, the memory string 300 has a region where the structure body 110U overlaps with a conductor 103_s2 between the transistor Tr_2n and the conductor 104b. The region functions as the transistor TrS_2. The transistor TrS_1 and the transistor TrS_2 function as selection transistors.

One of the conductor 124 and the conductor 104b is electrically connected to the wiring SL, and the other thereof is electrically connected to the wiring BL. For example, the conductor 104b is electrically connected to the wiring SL, and the other thereof is electrically connected to the wiring BL. Moreover, one of the conductor 124 and the conductor 104b may function as the wiring SL, and the other thereof may function as the wiring BL.

In the memory string 300, selection transistors that would be provided on a peripheral circuit side are provided. Accordingly, the number of transistors on the peripheral circuit side can be reduced, and design flexibility on the peripheral circuit side can be improved.

Figure 22:
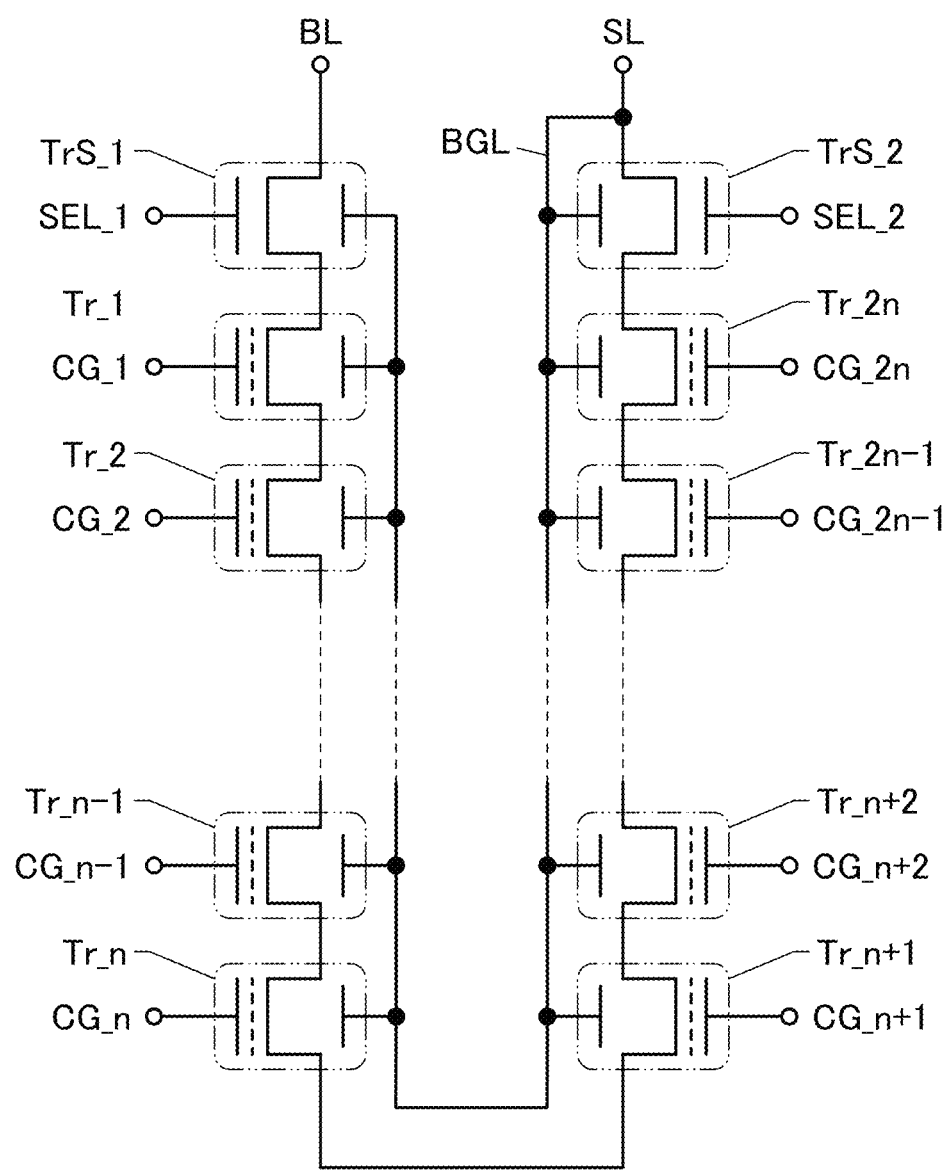
FIG. 22 is a circuit diagram of the memory string.

FIG. 22 illustrates an equivalent circuit diagram of the memory string 300. For the equivalent circuit diagram, the description of the equivalent circuit diagram illustrated in FIG. 4 is referred to.

When the number of transistors Tr to be stacked is increased to increase memory capacity per memory string, an aspect ratio is increased, so that a structure body or the like is likely to collapse during a manufacturing process. Since the memory string 300 according to one embodiment of the present invention has a U-shaped structure, when memory capacity per memory string is the same, the structure body or the like is less likely to collapse during the manufacturing process. Accordingly, the productivity of the semiconductor device including the memory string according to one embodiment of the present invention can be increased.

Figure 23:
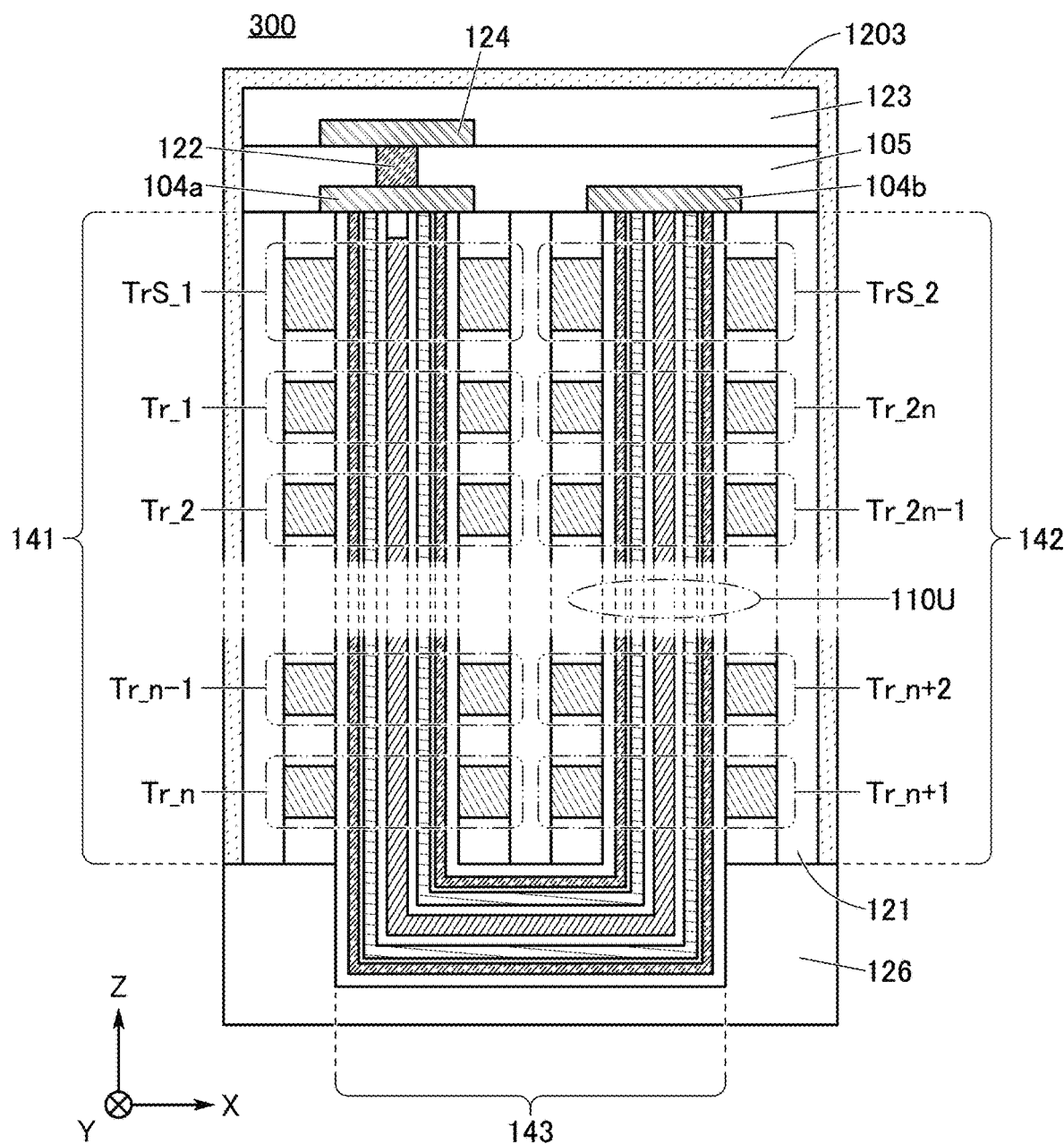
FIG. 23 is a cross-sectional view of the memory string.

As illustrated in FIG. 23, the insulator 1203 may be provided to cover the memory string 300 or the like. For the insulator 1203, an insulator having a function of inhibiting passage of oxygen and impurities such as hydrogen is preferably used.

Figure 24:
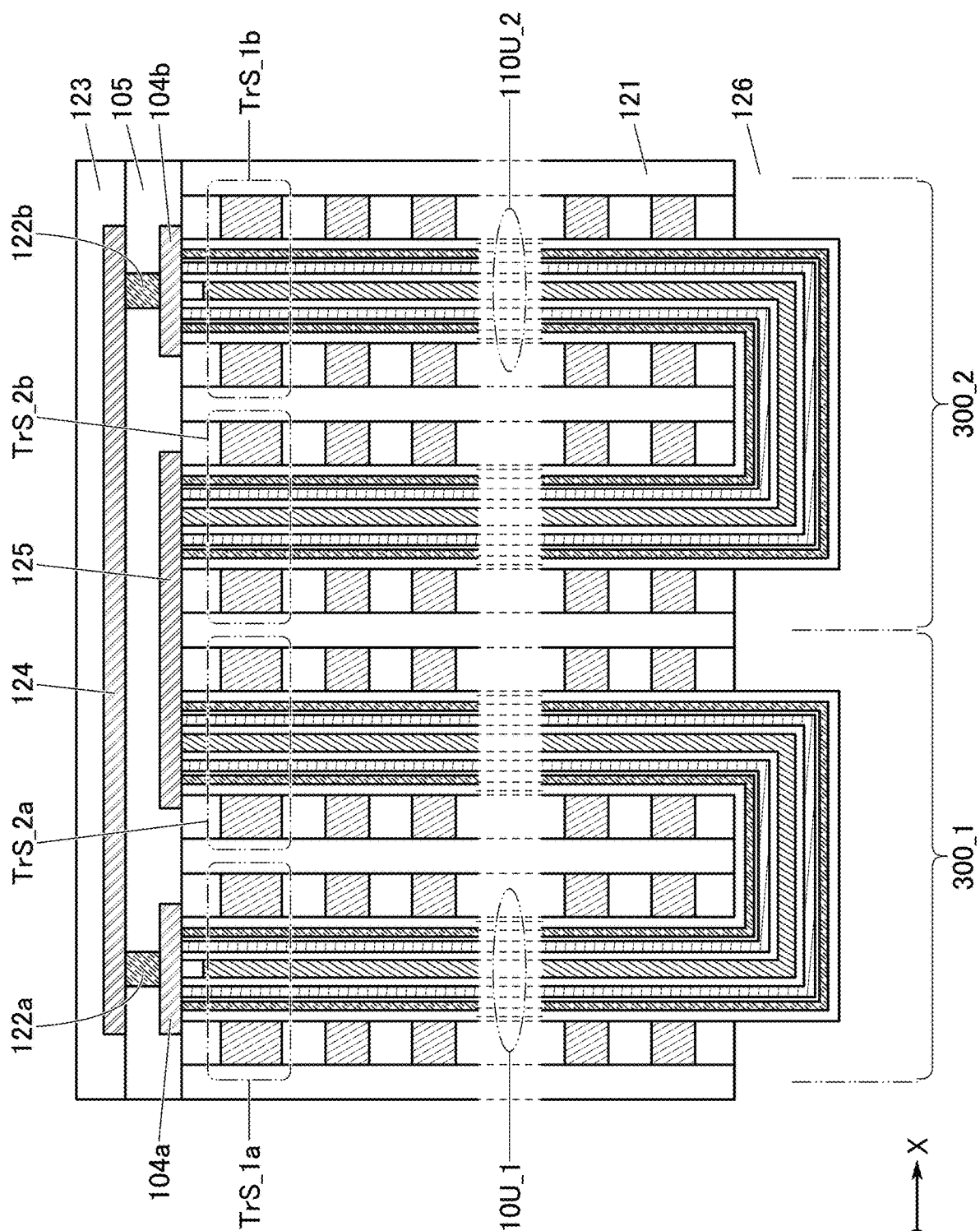
FIG. 24 is a cross-sectional view of the memory strings.

FIG. 24 is a cross-sectional view illustrating a connection example of two adjacent memory strings 300 (a memory string 300_1 and a memory string 300_2). In FIG. 24, the structure body 110U included in the memory string 300_1 is referred to as a structure body 110U_1, and the structure body 110U included in the memory string 300_2 is referred to as a structure body 110U_2.

One end of the structure body 110U_1 is connected to the conductor 104a, and the other end thereof is connected to a conductor 125. In addition, one end of the structure body 110U_2 is connected to the conductor 104b, and the other end thereof is connected to the conductor 125. The conductor 125 is provided in the same layer as the conductor 104 (the conductor 104a and the conductor 104b). Furthermore, the conductor 104a is electrically connected to the conductor 124 through a conductor 122a, and the conductor 104b is electrically connected to the conductor 124 through a conductor 122b.

One of the conductor 124 and the conductor 125 functions as the wiring SL, and the other thereof functions as the wiring BL. Alternatively, one of the conductor 124 and the conductor 125 is electrically connected to the wiring SL, and the other thereof is electrically connected to the wiring BL.

In addition, in FIG. 24, the transistor TrS_1 that is provided in the vicinity of the one end of the structure body 110U_1 is denoted by a transistor TrS_1a, and the transistor TrS_2 that is provided in the vicinity of the other end thereof is denoted by a transistor TrS_2a. Furthermore, the transistor TrS_1 that is provided in the vicinity of one end of the structure body 110U_2 is denoted by a transistor TrS_1b, and the transistor TrS_2 that is provided in the vicinity of the other end thereof is denoted by a transistor TrS_2b.

By controlling the operation of the selection transistors (the transistor TrS_1 and the transistor TrS_2), data reading and writing can be performed only on one of the two memory strings 300.

MODIFICATION EXAMPLE 1

Figure 25:
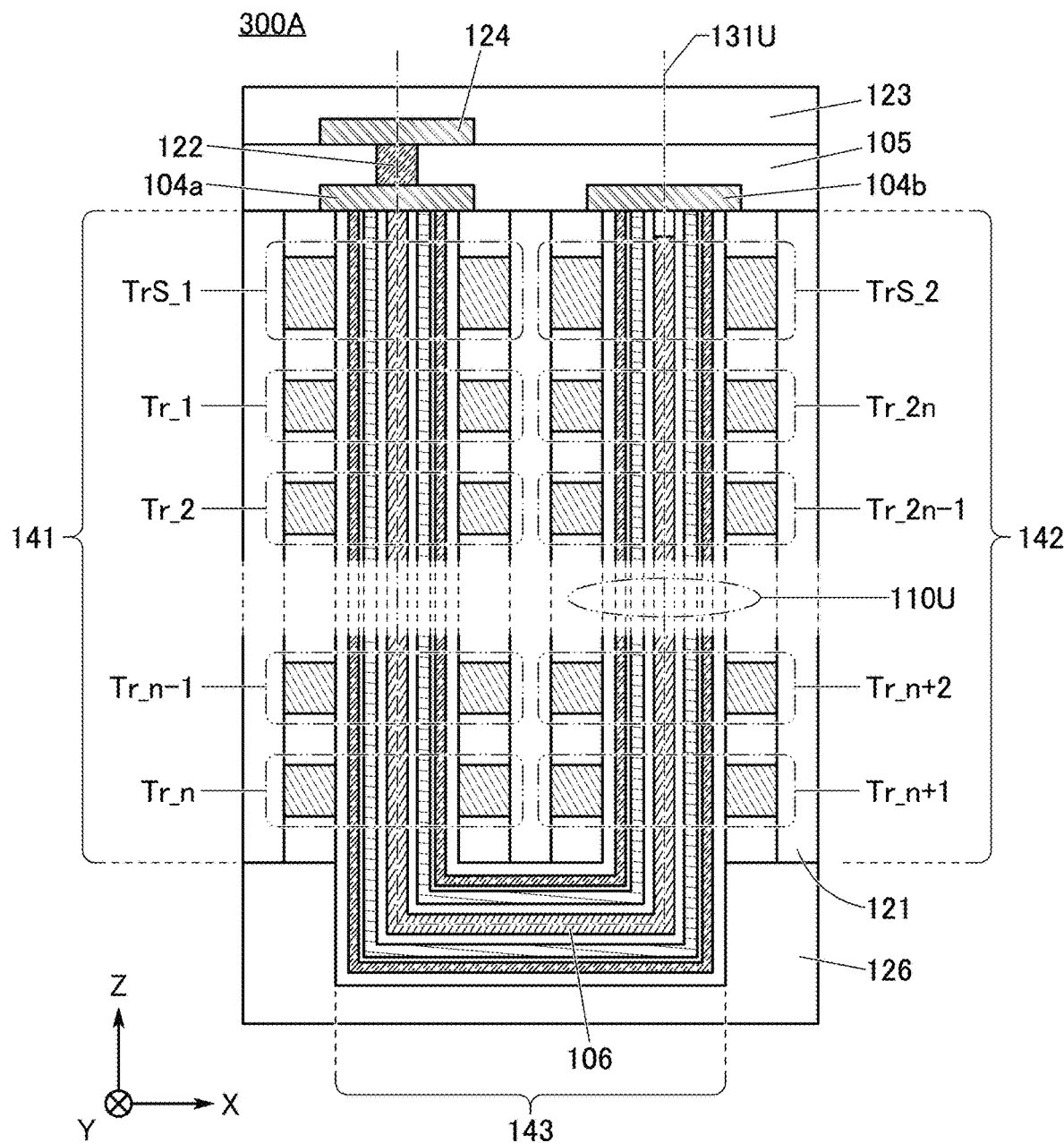
FIG. 25 is a cross-sectional view of a memory string.
Figure 26:
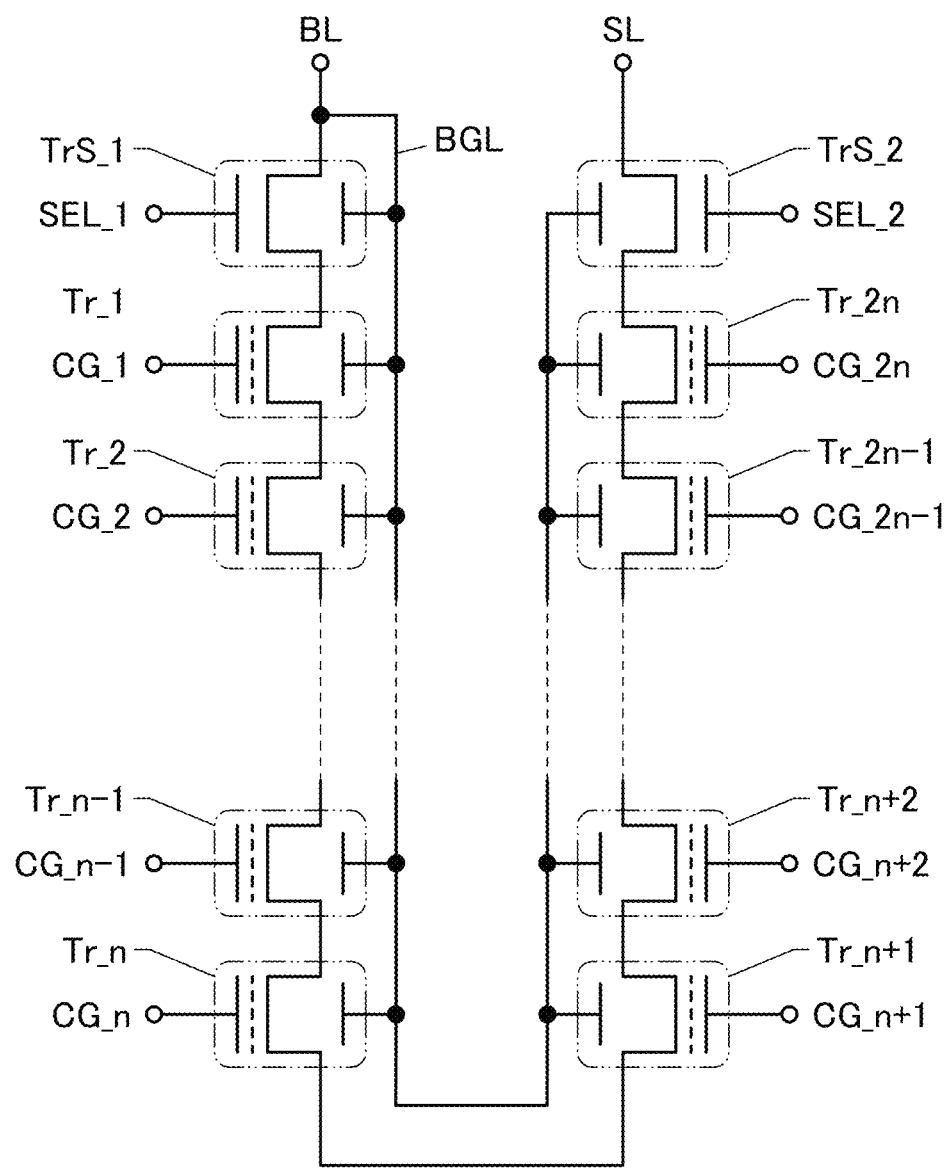
FIG. 26 is a circuit diagram of the memory string.

FIG. 25 illustrates a cross-sectional view of a memory string 300A, which is a modification example of the memory string 300. FIG. 26 is an equivalent circuit diagram of the memory string 300A illustrated in FIG. 25. As illustrated in FIG. 25, the conductor 106 and the conductor 104a are electrically connected to each other, and the conductor 106 and the conductor 104b are not necessarily connected to each other. That is, the conductor 106 may be electrically connected to the wiring BL.

MODIFICATION EXAMPLE 2

Figure 27:
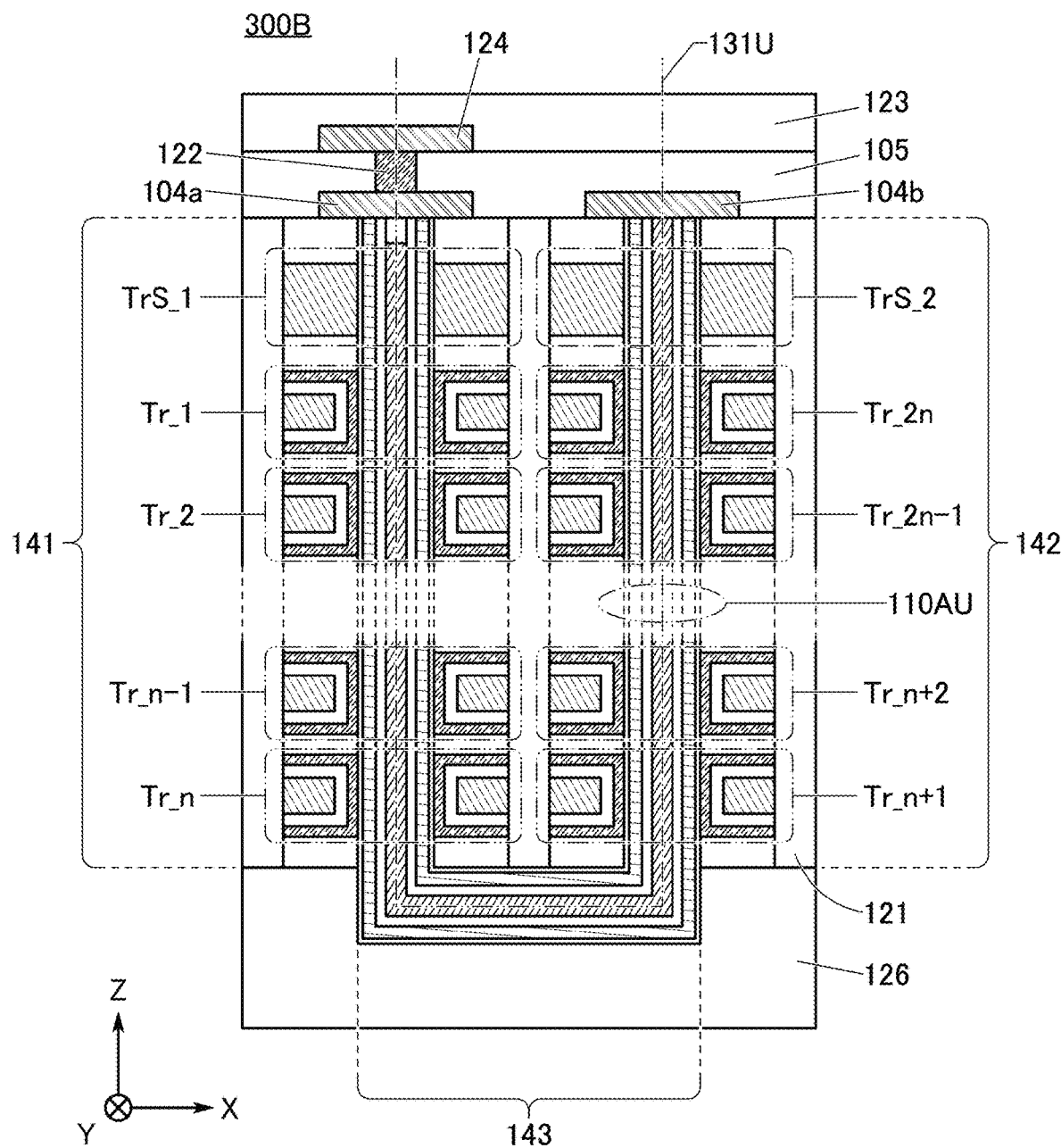
FIG. 27 is a cross-sectional view of a memory string.

FIG. 27 illustrates a cross-sectional view of a memory string 300B, which is a modification example of the memory string 300. In the memory string 300B, the transistor Tr illustrated in the memory string 100C is used as the transistor Tr. The memory string 300B includes a structure body 110AU instead of the structure body 110U. The structure body 110AU has a structure where the functional layer 114 and the insulator 115 are eliminated from the structure body 110U.

MODIFICATION EXAMPLE 3

Figure 28:
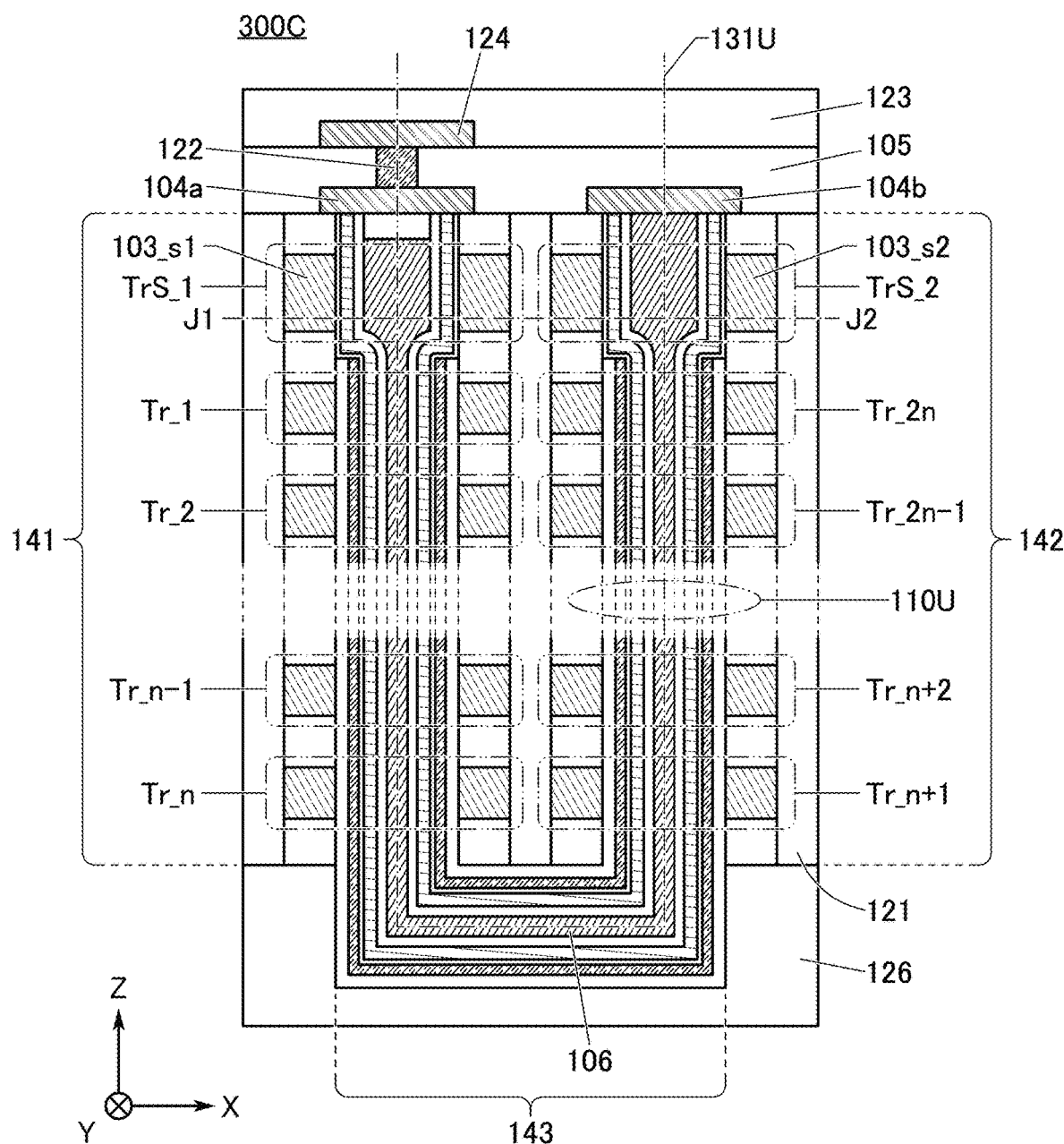
FIG. 28 is a cross-sectional view of a memory string.
Figure 29:
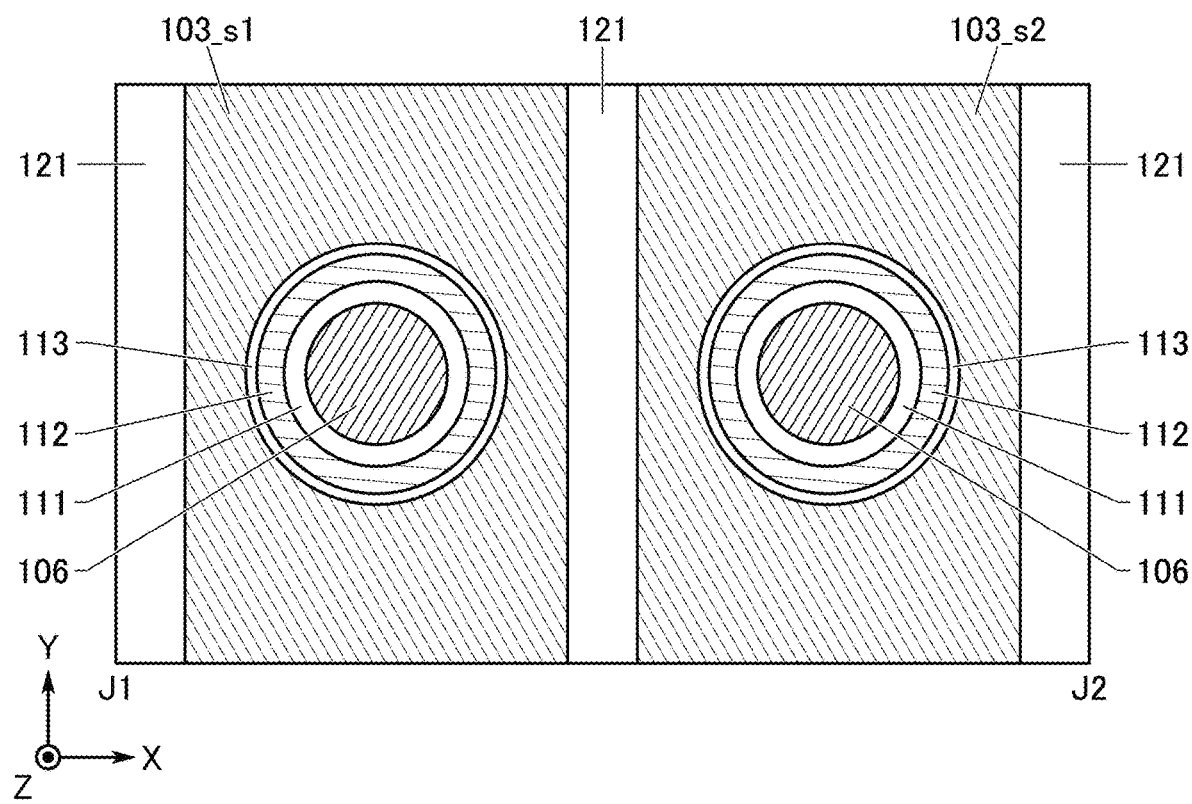
FIG. 29 is a cross-sectional view of the memory string.

FIG. 28 illustrates a cross-sectional view of a memory string 300C, which is a modification example of the memory string 300. FIG. 29 is a cross-sectional view in which a portion J1-J2 represented by a dashed-dotted line in FIG. 28 is seen from the Z direction.

As illustrated in FIG. 28 and FIG. 29, a structure may be employed in which the functional layer 114 and the insulator 115 are not provided in intersection portions of the structure body 110U and the conductor 103_s (the conductor 103_s1 and the conductor 103_s2) that function as the transistors TrS (the transistor TrS_1 and the transistor TrS_2). When the functional layer 114 and the insulator 115 are not provided in the intersection portions, the operation speed of the transistor TrS can be improved.

MODIFICATION EXAMPLE 4

Figure 30:
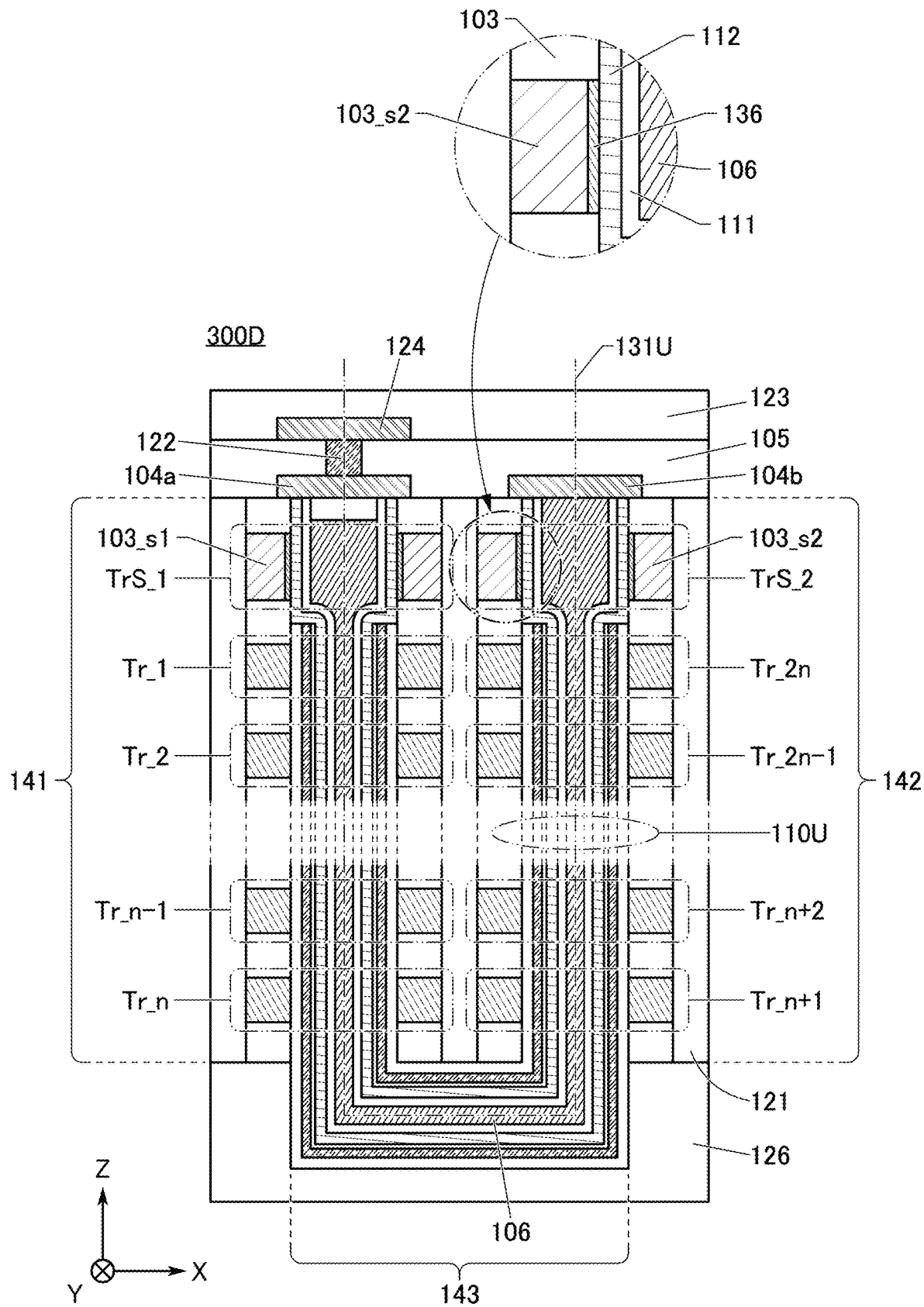
FIG. 30 is a cross-sectional view of a memory string.

FIG. 30 illustrates a cross-sectional view of a memory string 300D, which is a modification example of the memory string 300 and the memory string 300C. In the memory string 300D, the insulator 113, the functional layer 114, and the insulator 115 are not provided in the intersection portions of the structure body 110U and the conductor 103_s (the conductor 103_s1 and the conductor 103_s2) that function as the transistors TrS, and an insulator 136 is provided between the conductor 103_s and the semiconductor 112.

The insulator 136 functions as a gate insulating film of the transistor TrS. A thermal oxidation film or the like is preferably used for the insulator 136. For example, the conductor 103_s is formed using low resistance silicon, a surface of the conductor 103_s is oxidized in a high temperature atmosphere including oxygen to form silicon oxide (a thermal oxidation film), and the silicon oxide is used for the insulator 136. The silicon oxide has excellent insulation withstand characteristics and can be thin. Thus, the operation speed of the transistor TrS can be improved.

This embodiment can be combined as appropriate with any of the other embodiments and the like described in this specification.

Embodiment 3

In this embodiment, a semiconductor device 400 including a memory device or a semiconductor device according to one embodiment of the present invention is described.

Figure 31:
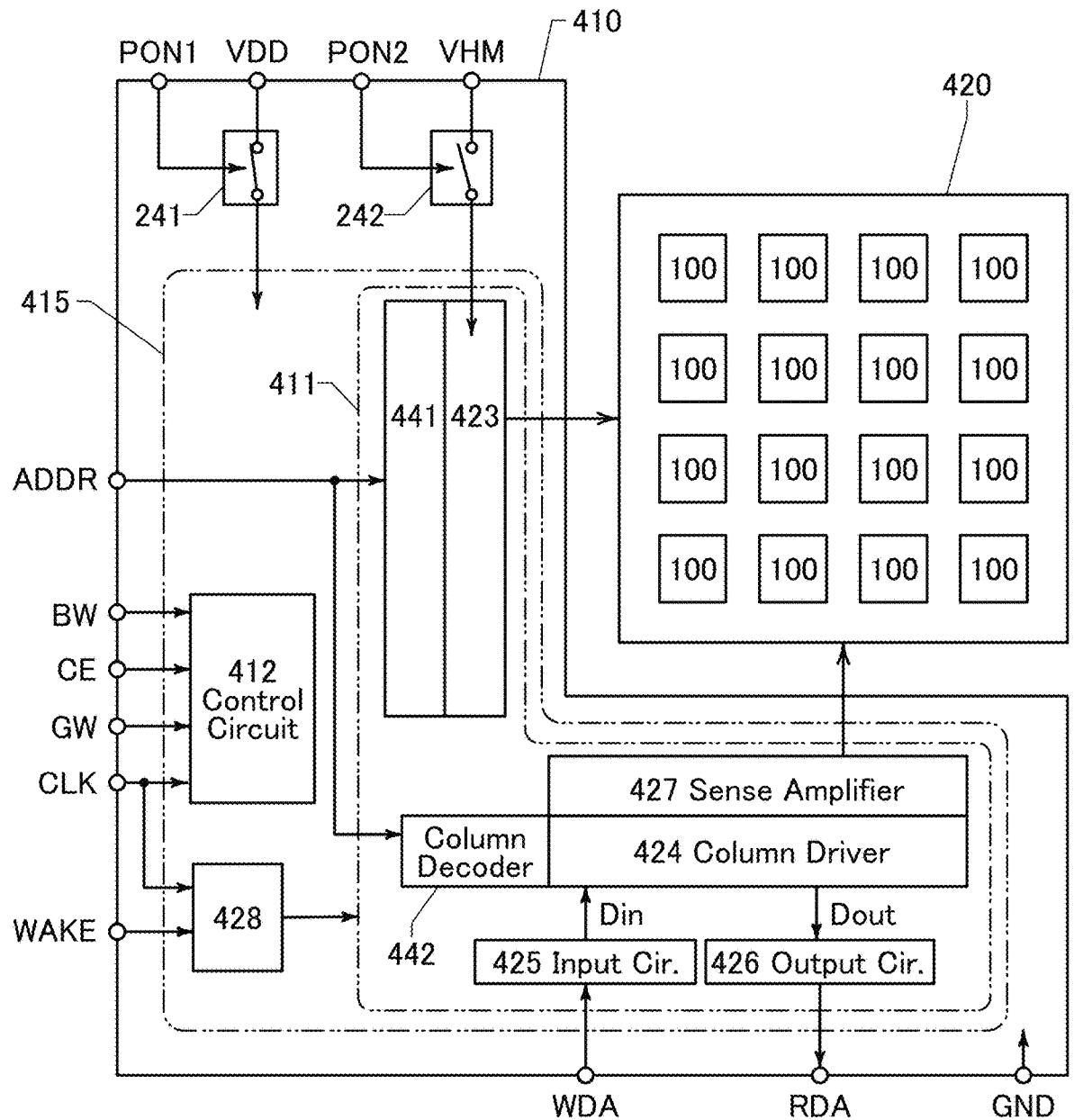
FIG. 31 is a block diagram illustrating a structure example of a semiconductor device.

FIG. 31 illustrates a block diagram illustrating a structure example of the semiconductor device 400. The semiconductor device 400 illustrated in FIG. 31 includes a driver circuit 410 and a memory array 420. The memory array 420 includes one or more memory strings 100. FIG. 31 illustrates an example in which the memory array 420 includes a plurality of memory strings 100 arranged in a matrix.

The driver circuit 410 includes a PSW 241 (a power switch), a PSW 242, and a peripheral circuit 415. The peripheral circuit 415 includes a peripheral circuit 411, a control circuit 412, and a voltage generation circuit 428.

In the semiconductor device 400, each circuit, each signal, and each voltage can be appropriately selected as needed. Alternatively, another circuit or another signal may be added. A signal BW, a signal CE, a signal GW, a signal CLK, a signal WAKE, a signal ADDR, a signal WDA, a signal PON1, and a signal PON2 are signals input from the outside, and a signal RDA is a signal output to the outside. The signal CLK is a clock signal.

In addition, the signals BW and CE and the signal GW are control signals. The signal CE is a chip enable signal, the signal GW is a global write enable signal, and the signal BW is a byte write enable signal. The signal ADDR is an address signal. The signal WDA is write data, and the signal RDA is read data. The signal PON1 and the signal PON2 are power gating control signals. Note that the signal PON1 and the signal PON2 may be generated in the control circuit 412.

The control circuit 412 is a logic circuit having a function of controlling the overall operation of the semiconductor device 400. For example, the control circuit performs logical operation on the signal CE, the signal GW, and the signal BW to determine an operation mode of the semiconductor device 400 (e.g., write operation or read operation). Alternatively, the control circuit 412 generates a control signal for the peripheral circuit 411 so that the operation mode is executed.

The voltage generation circuit 428 has a function of generating negative voltage. The signal WAKE has a function of controlling the input of the signal CLK to the voltage generation circuit 428. For example, when an H-level signal is supplied as the signal WAKE, the signal CLK is input to the voltage generation circuit 428, and the voltage generation circuit 428 generates negative voltage.

The peripheral circuit 411 is a circuit for writing and reading data to and from the memory string 100. The peripheral circuit 411 includes a row decoder 441, a column decoder 442 (Column Decoder), a row driver 423, a column driver 424 (Column Driver), an input circuit 425 (Input Cir.), an output circuit 426 (Output Cir.), and a sense amplifier 427 (Sense Amplifier).

The row decoder 441 and the column decoder 442 have a function of decoding the signal ADDR. The row decoder 441 is a circuit for specifying a row to be accessed, and the column decoder 442 is a circuit for specifying a column to be accessed. The row driver 423 has a function of selecting the wiring CG specified by the row decoder 441. The column driver 424 has a function of writing data to the memory string 100, a function of reading data from the memory string 100, a function of retaining the read data, and the like.

The input circuit 425 has a function of retaining the signal WDA. Data retained by the input circuit 425 is output to the column driver 424. Data output from the input circuit 425 is data (Din) to be written to the memory string 100. Data (Dout) read from the memory string 100 by the column driver 424 is output to the output circuit 426. The output circuit 426 has a function of retaining Dout. In addition, the output circuit 426 has a function of outputting Dout to the outside of the semiconductor device 400. Data output from the output circuit 426 is the signal RDA.

The PSW 241 has a function of controlling the supply of VDD to the peripheral circuit 415. The PSW 242 has a function of controlling the supply of VHM to the row driver 423. Here, in the semiconductor device 400, high power supply voltage is VDD and low power supply voltage is GND (a ground potential). In addition, VHM is high power supply voltage used to set a word line at a high level and is higher than VDD. The on/off of the PSW 241 is controlled by the signal PON1, and the on/off of the PSW 242 is controlled by the signal PON2. The number of power domains to which VDD is supplied is one in the peripheral circuit 415 in FIG. 31 but can be plural. In this case, a power switch is provided for each power domain.

Figure 32:
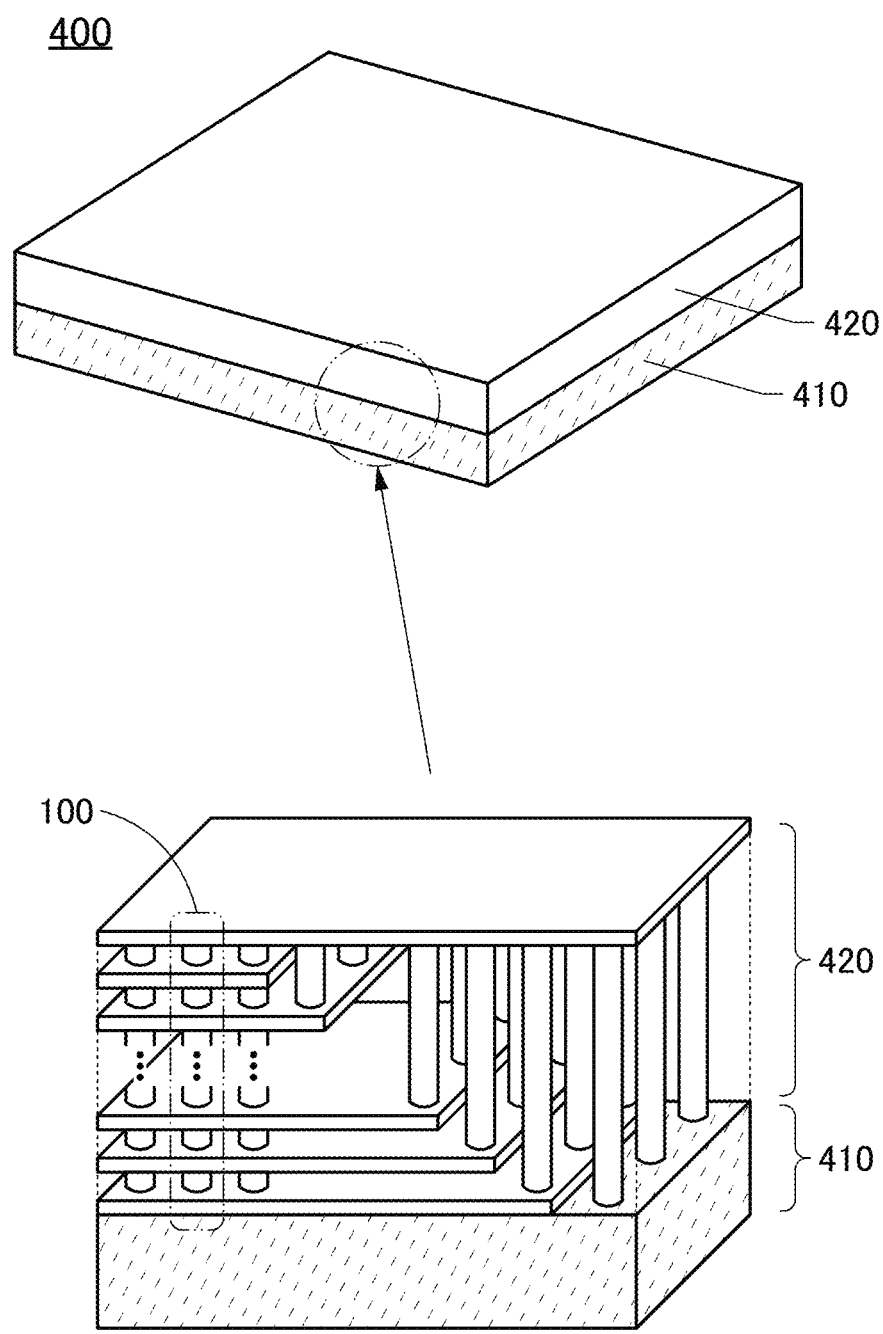
FIG. 32 is a diagram illustrating a structure example of the semiconductor device.

The driver circuit 410 and the memory array 420 that are included in the semiconductor device 400 may be provided on the same plane. In addition, as illustrated in FIG. 32, the driver circuit 410 and the memory array 420 may be provided to overlap with each other. When the driver circuit 410 and the memory array 420 are provided to overlap with each other, the signal transmission distance can be shortened. Furthermore, FIG. 32 illustrates a perspective view in which part of the semiconductor device 400 is enlarged.

In addition, in the semiconductor device 400, an arithmetic processing unit such as a CPU (Central Processing Unit) or a GPU (Graphics Processing Unit) may be used for the control circuit 412 included in the driver circuit 410. With the use of the CPU and/or the GPU or the like, the semiconductor device 400 that has an arithmetic processing function can be achieved.

With the use of the memory string 100 according to one embodiment of the present invention, part of the memory array 420 can function as a main memory or a cache memory. In addition, the memory string 100 can function as a flash memory. Thus, part of the memory array 420 can function as a flash memory. The semiconductor device 400 according to one embodiment of the present invention can function as a universal memory.

In addition, according to one embodiment of the present invention, functions of a CPU, a cache memory, and a storage can be achieved on the same chip.

The semiconductor device 400 illustrated in FIG. 32 includes the driver circuit 410 including a CPU and a 3D OS NAND memory device according to one embodiment of the present invention in the memory array 420. The 3D OS NAND memory device according to one embodiment of the present invention has a function of a cache memory and a function of a storage.

Figure 33:
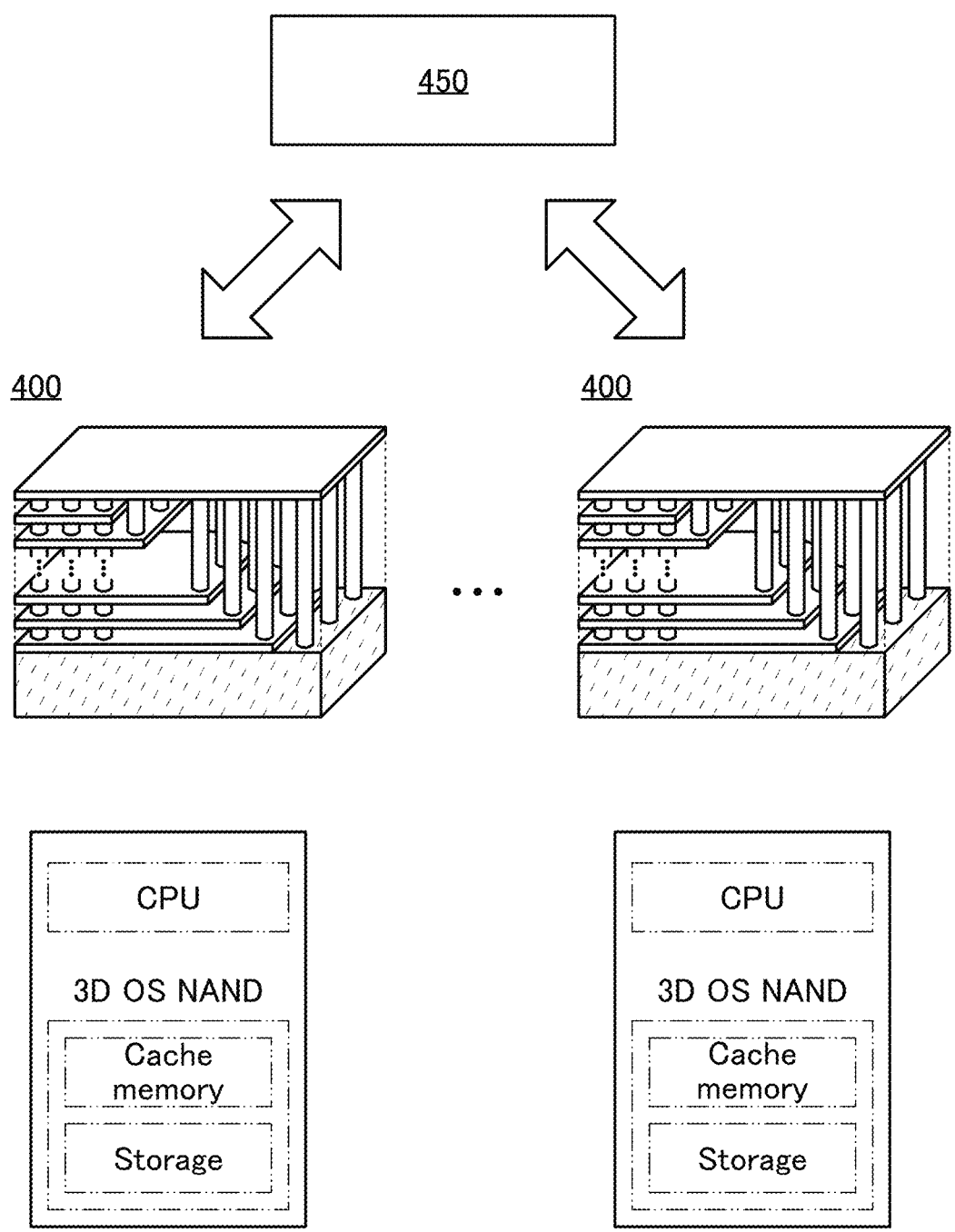
FIG. 33 is a diagram illustrating an example of an information processing system including a plurality of memory devices.

FIG. 33 illustrates a state where a host 450 controls a plurality of semiconductor devices 400. Each of the semiconductor devices 400 has an arithmetic processing function, and writing to and reading from a cache memory and a storage can be parallelized. When the host 450 controls the plurality of semiconductor devices 400, an information processing system that achieves non-von Neumann computing can be constructed.

This embodiment can be combined as appropriate with any of the other embodiments and the like described in this specification.

Embodiment 4

An example of an arithmetic processing unit that can include the semiconductor device such as the memory device described in the above embodiment is described in this embodiment.

Figure 34:
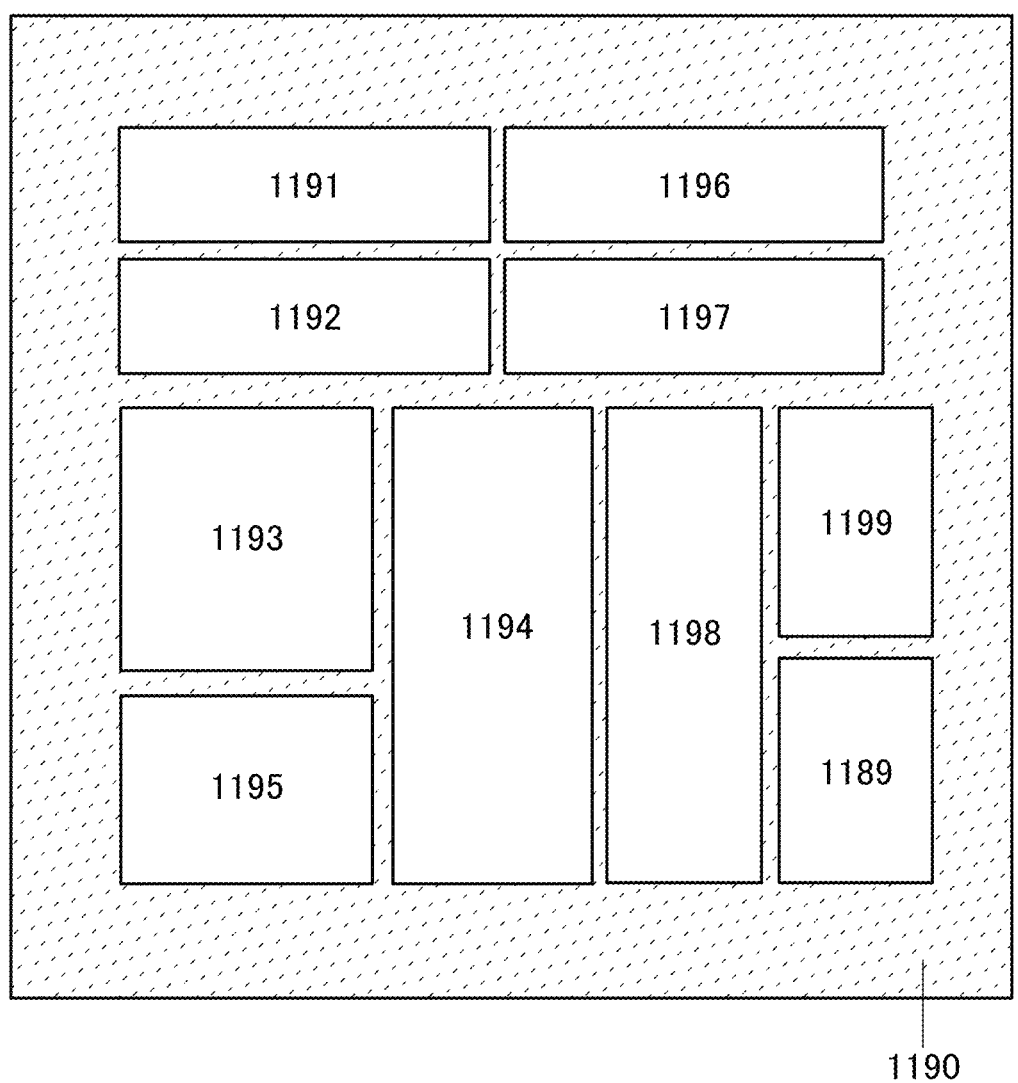
FIG. 34 is a block diagram illustrating a CPU.

FIG. 34 illustrates a block diagram of an arithmetic processing unit 1100. FIG. 34 illustrates a structure example of a CPU as a structure example that can be used for the arithmetic processing unit 1100.

The arithmetic processing unit 1100 illustrated in FIG. 34 includes, over a substrate 1190, an ALU 1191 (Arithmetic logic unit, arithmetic circuit), an ALU controller 1192, an instruction decoder 1193, an interrupt controller 1194, a timing controller 1195, a register 1196, a register controller 1197, a bus interface 1198, a cache 1199, and a cache interface 1189. A semiconductor substrate, an SOI substrate, a glass substrate, or the like is used as the substrate 1190. The central processing unit 1100 may include a rewritable ROM and a ROM interface. In addition, the cache 1199 and the cache interface 1189 may be provided in a separate chip.

The cache 1199 is connected via the cache interface 1189 to a main memory provided in another chip. The cache interface 1189 has a function of supplying part of data retained in the main memory to the cache 1199. The cache 1199 has a function of retaining the data.

The arithmetic processing unit 1100 illustrated in FIG. 34 is only an example with a simplified structure, and the actual arithmetic processing unit 1100 has a variety of structures depending on the application. For example, the arithmetic processing unit 1100 may have a structure in which a structure including the arithmetic processing unit 1100 illustrated in FIG. 34 or an arithmetic circuit is considered as one core, a plurality of cores are included, and the cores operate in parallel, namely a structure like that of a GPU. In addition, the number of bits that the arithmetic processing unit 1100 can process in an internal arithmetic circuit or in a data bus can be 8 bits, 16 bits, 32 bits, 64 bits, or the like, for example.

An instruction that is input to the arithmetic processing unit 1100 through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the arithmetic processing unit 1100 is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the arithmetic processing unit 1100.

In addition, the timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator portion for generating an internal clock signal based on a reference clock signal, and supplies the internal clock signal to the above various circuits.

In the arithmetic processing unit 1100 illustrated in FIG. 34, a memory device is provided in the register 1196 and the cache 1199. As the memory device, the memory device described in the above embodiment, or the like can be used, for example.

In the arithmetic processing unit 1100 illustrated in FIG. 34, the register controller 1197 selects a retention operation in the register 1196 in accordance with an instruction from the ALU 1191. That is, the register controller 1197 selects whether data retention by a flip-flop is performed or data retention by a capacitor is performed in the memory cell included in the register 1196. In the case where data retention by the flip-flop is selected, power supply voltage is supplied to the memory cell in the register 1196. In the case where data retention by the capacitor is selected, the data is rewritten into the capacitor, and supply of power supply voltage to the memory cell in the register 1196 can be stopped.

Note that the arithmetic processing unit 1100 is not limited to a CPU and may be a GPU, a DSP (Digital Signal Processor), an FPGA (Filed-Programmable Gate Array), or the like.

Figure 35A:
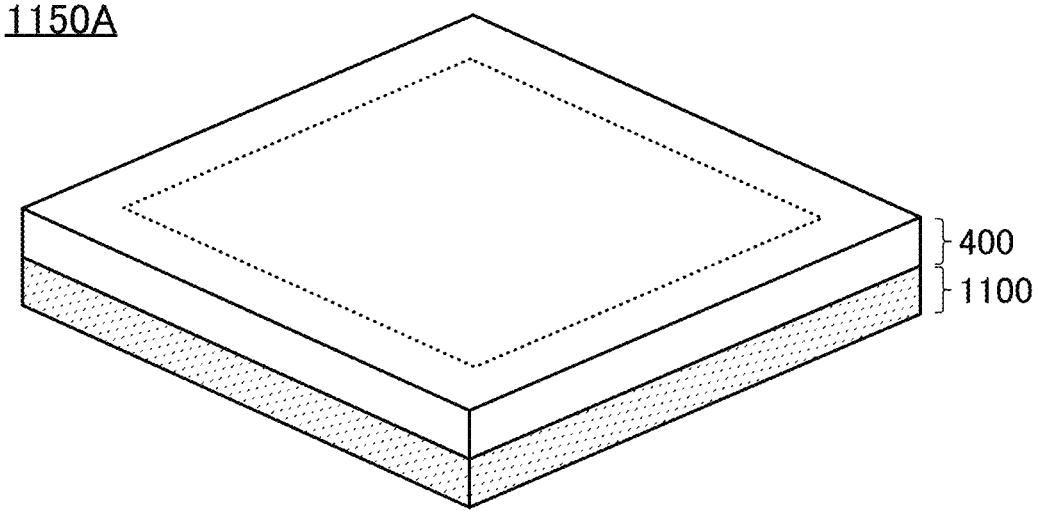
FIG. 35A and FIG. 35B are perspective views of a semiconductor device.
Figure 35B:
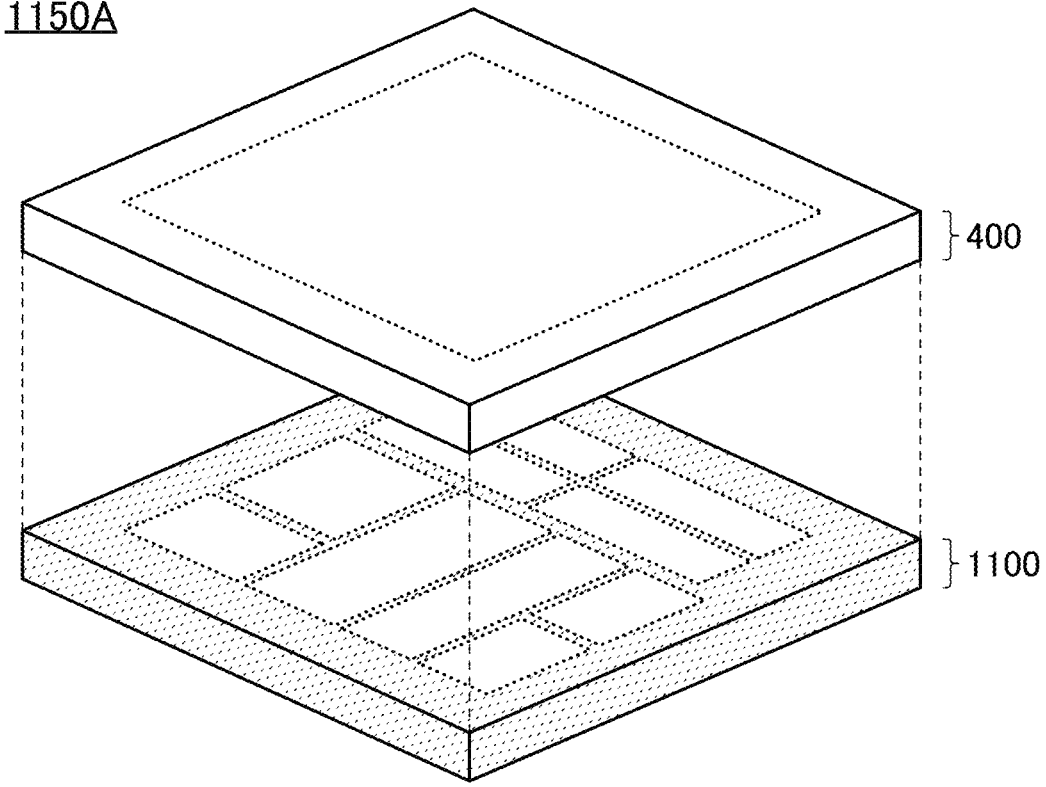

The semiconductor device 400 described in the above embodiment and the arithmetic processing unit 1100 can be provided to overlap with each other. FIG. 35A and FIG. 35B illustrate perspective views of a semiconductor device 1150A. The semiconductor device 1150A includes the semiconductor device 400 functioning as a memory device over the arithmetic processing unit 1100. The arithmetic processing unit 1100 and the semiconductor device 400 have an overlap region. For easy understanding of the structure of the semiconductor device 1150A, the arithmetic processing unit 1100 and the semiconductor device 400 are separately illustrated in FIG. 35B.

Overlapping the semiconductor device 400 and the arithmetic processing unit 1100 can shorten the connection distance therebetween. Accordingly, the communication speed therebetween can be increased. Moreover, since the connection distance is short, power consumption can be reduced.

Figure 36A:
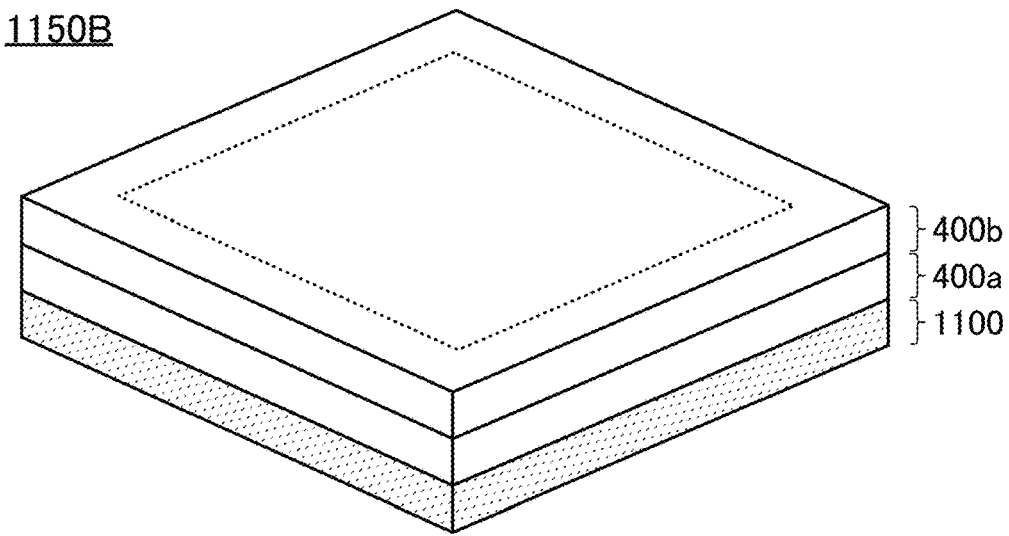
FIG. 36A and FIG. 36B are perspective views of a semiconductor device.
Figure 36B:
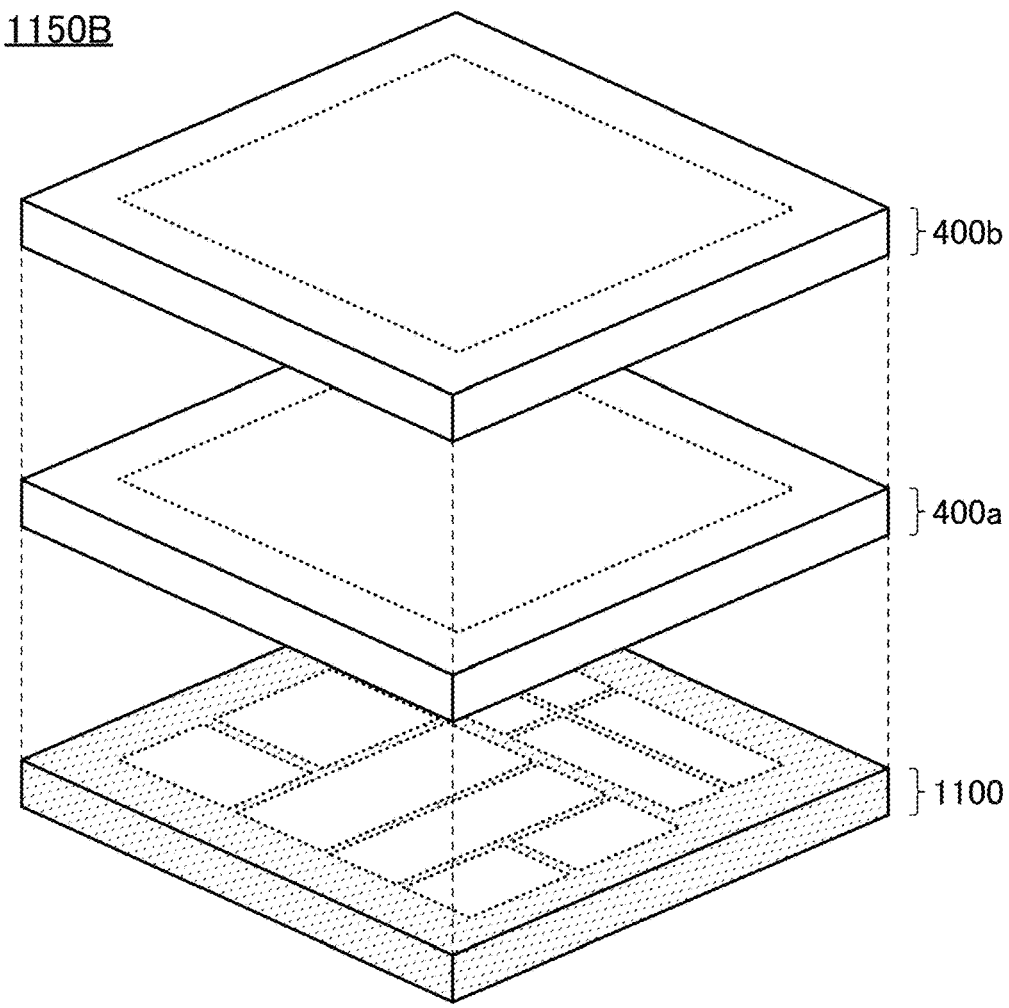

In addition, a plurality of semiconductor devices 400 may be provided to overlap the arithmetic processing unit 1100. FIG. 36A and FIG. 36B illustrate perspective views of a semiconductor device 1150B. The semiconductor device 1150B includes a semiconductor device 400a and a semiconductor device 400b over the arithmetic processing unit 1100. The arithmetic processing unit 1100, the semiconductor device 400a, and the semiconductor device 400b have an overlap region. For easy understanding of the structure of the semiconductor device 1150B, the arithmetic processing unit 1100, the semiconductor device 400a, and the semiconductor device 400b are separately illustrated in FIG. 36B.

The semiconductor device 400a and the semiconductor device 400b function as memory devices. For example, a NOR memory device may be used for one of the semiconductor device 400a and the semiconductor device 400b, and a NAND memory device may be used for the other thereof. Both the semiconductor device 400a and the semiconductor device 400b may be NAND memory devices. Examples of the NOR memory device include a DRAM, an SRAM, and the like. A NOR memory device can operate at higher speed than a NAND memory device; thus, for example, part of the semiconductor device 400a can also be used as the main memory and/or the cache 1199. Note that the stacking order of the semiconductor device 400a and the semiconductor device 400b may be reverse.

Figure 37A:
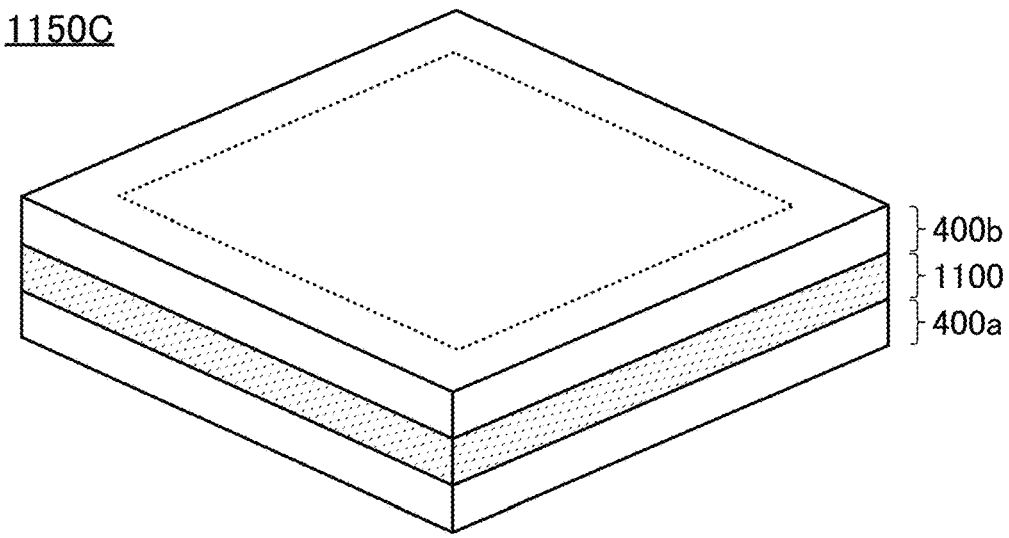
FIG. 37A and FIG. 37B are perspective views of a semiconductor device.
Figure 37B:
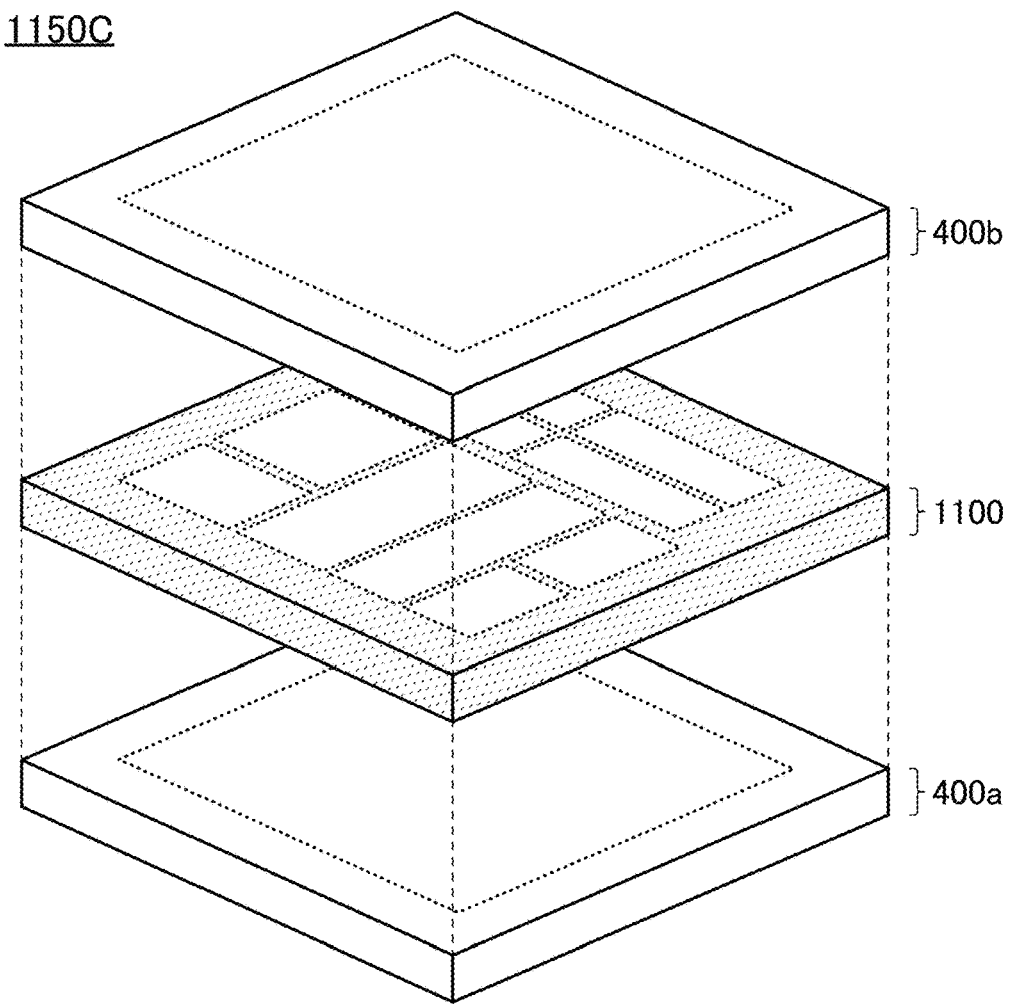

FIG. 37A and FIG. 37B illustrate perspective views of a semiconductor device 1150C. The semiconductor device 1150C has a structure in which the arithmetic processing unit 1100 is sandwiched between the semiconductor device 400a and the semiconductor device 400b. The arithmetic processing unit 1100, the semiconductor device 400a, and the semiconductor device 400b have an overlap region. For easy understanding of the structure of the semiconductor device 1150C, the arithmetic processing unit 1100, the semiconductor device 400a, and the semiconductor device 400b are separately illustrated in FIG. 37B.

With the structure of the semiconductor device 1150C, the communication speed between the semiconductor device 400a and the arithmetic processing unit 1100 and the communication speed between the semiconductor device 400b and the arithmetic processing unit 1100 can be both increased. Moreover, power consumption can be reduced compared to the semiconductor device 1150B.

This embodiment can be combined as appropriate with any of the other embodiments and the like described in this specification.

Embodiment 5

In this embodiment, examples of a semiconductor wafer where the semiconductor device or the like described in the above embodiment is formed and electronic components incorporating the semiconductor device are described.

<Semiconductor Wafer>

Figure 38A:
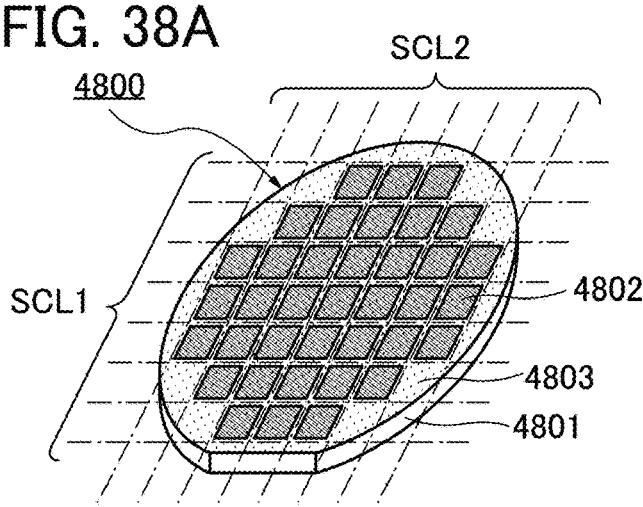
FIG. 38A is a perspective view illustrating an example of a semiconductor wafer.

First, an example of a semiconductor wafer where a semiconductor device or the like is formed is described using FIG. 38A.

A semiconductor wafer 4800 illustrated in FIG. 38A includes a wafer 4801 and a plurality of circuit portions 4802 provided on a top surface of the wafer 4801. Note that a portion without the circuit portion 4802 on the top surface of the wafer 4801 is a spacing 4803 that is a region for dicing.

The semiconductor wafer 4800 can be manufactured by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

A dicing step is performed as a next step. Dicing is performed along scribe lines SCL1 and scribe lines SCL2 (referred to as dicing lines or cutting lines in some cases) indicated by dashed-dotted lines. Note that to perform the dicing step easily, it is preferable that the spacing 4803 be provided so that the plurality of scribe lines SCL1 are parallel to each other, the plurality of scribe lines SCL2 are parallel to each other, and the scribe lines SCL1 are perpendicular to the scribe lines SCL2.

Figure 38B:
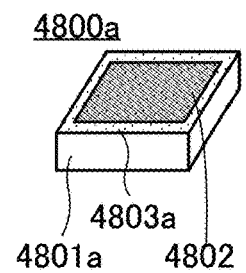
FIG. 38B is a perspective view illustrating an example of a chip.

With the dicing step, a chip 4800a as illustrated in FIG. 38B can be cut out from the semiconductor wafer 4800. The chip 4800a includes a wafer 4801a, the circuit portion 4802, and a spacing 4803a. Note that it is preferable to make the spacing 4803a small as much as possible. In this case, the width of the spacing 4803 between adjacent circuit portions 4802 is substantially the same as a cutting allowance of the scribe line SCL1 or a cutting allowance of the scribe line SCL2.

Note that the shape of the element substrate according to one embodiment of the present invention is not limited to the shape of the semiconductor wafer 4800 illustrated in FIG. 38A.

The element substrate may be a rectangular semiconductor wafer, for example. The shape of the element substrate can be changed as appropriate, depending on a manufacturing process of an element and an apparatus for manufacturing the element.

<Electronic Component>

Figure 38C:
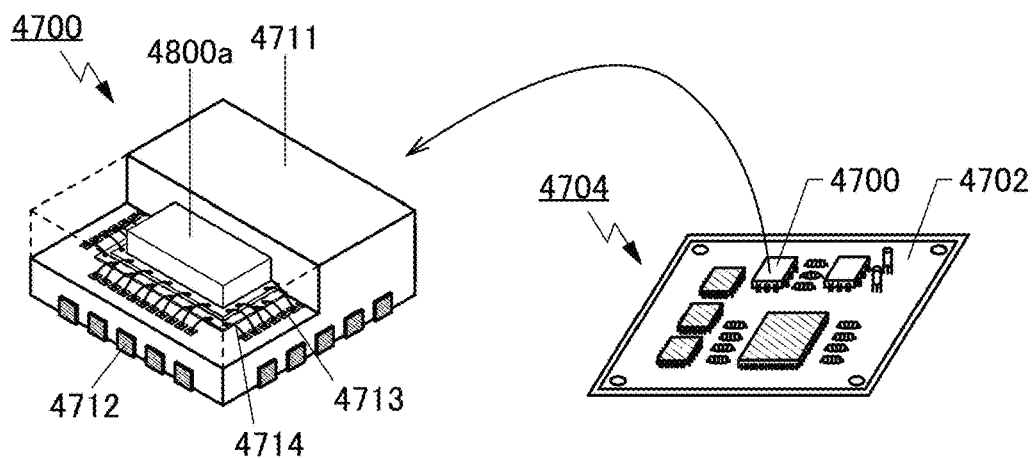
FIG. 38C and FIG. 38D are perspective views illustrating examples of electronic components.

FIG. 38C illustrates a perspective view of an electronic component 4700 and a substrate (a mounting board 4704) on which the electronic component 4700 is mounted. The electronic component 4700 illustrated in FIG. 38C includes a chip 4800a in a mold 4711. As the chip 4800a, the memory device or the like according to one embodiment of the present invention can be used.

To illustrate the inside of the electronic component 4700, some portions are omitted in FIG. 38C. The electronic component 4700 includes a land 4712 outside the mold 4711. The land 4712 is electrically connected to an electrode pad 4713, and the electrode pad 4713 is electrically connected to the chip 4800a through a wire 4714. The electronic component 4700 is mounted on a printed circuit board 4702, for example. A plurality of such electronic components are combined and electrically connected to each other on the printed circuit board 4702, so that the mounting board 4704 is completed.

Figure 38D:
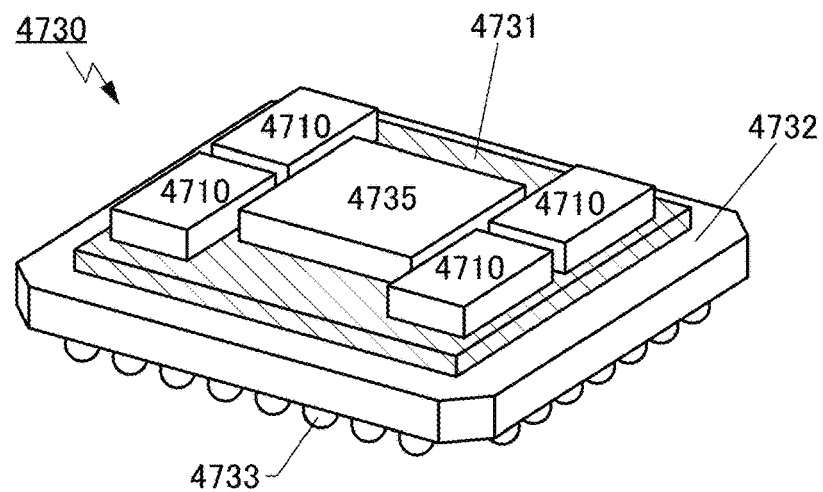

FIG. 38D illustrates a perspective view of an electronic component 4730. The electronic component 4730 is an example of a SiP (System in package) or an MCM (Multi Chip Module). In the electronic component 4730, an interposer 4731 is provided on a package substrate 4732 (a printed circuit board), and a semiconductor device 4735 and a plurality of semiconductor devices 4710 are provided on the interposer 4731.

Examples of the semiconductor device 4710 include the chip 4800a, the semiconductor device described in the above embodiment, and a high bandwidth memory (HBM). In addition, an integrated circuit (a semiconductor device) such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings are provided in a single layer or multiple layers. In addition, the interposer 4731 has a function of electrically connecting an integrated circuit provided on the interposer 4731 to an electrode provided on the package substrate 4732. Accordingly, the interposer is referred to as a "redistribution substrate" or an "intermediate substrate" in some cases. Furthermore, a through electrode is provided in the interposer 4731 and the through electrode is used to electrically connect an integrated circuit and the package substrate 4732 in some cases. Moreover, in the case of using a silicon interposer, a TSV (Through Silicon Via) can also be used as the through electrode.

A silicon interposer is preferably used as the interposer 4731. The silicon interposer can be manufactured at lower cost than an integrated circuit because it is not necessary to provide an active element. Moreover, since wirings of the silicon interposer can be formed through a semiconductor process, the formation of minute wirings, which is difficult for a resin interposer, is easily achieved.

An HBM needs to be connected to many wirings to achieve a wide memory bandwidth. Therefore, an interposer on which an HBM is mounted requires minute and densely formed wirings. For this reason, a silicon interposer is preferably used as the interposer on which an HBM is mounted.

In addition, in a SiP, an MCM, or the like using a silicon interposer, a decrease in reliability due to a difference in the coefficient of expansion between an integrated circuit and the interposer is less likely to occur. Furthermore, a surface of a silicon interposer has high planarity; thus, poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on the interposer.

In addition, a heat sink (a radiator plate) may be provided to overlap with the electronic component 4730. In the case of providing a heat sink, the heights of integrated circuits provided on the interposer 4731 are preferably equal to each other. For example, in the electronic component 4730 described in this embodiment, the heights of the semiconductor devices 4710 and the semiconductor device 4735 are preferably equal to each other.

To mount the electronic component 4730 on another substrate, an electrode 4733 may be provided on a bottom portion of the package substrate 4732. FIG. 38D illustrates an example in which the electrode 4733 is formed of a solder ball. Solder balls are provided in a matrix on the bottom portion of the package substrate 4732, so that BGA (Ball Grid Array) mounting can be achieved. Alternatively, the electrode 4733 may be formed of a conductive pin. When conductive pins are provided in a matrix on the bottom portion of the package substrate 4732, PGA (Pin Grid Array) mounting can be achieved.

The electronic component 4730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

This embodiment can be combined as appropriate with any of the other embodiments and the like described in this specification.

Embodiment 6

In this embodiment, application examples of the memory device according to one embodiment of the present invention are described.

The memory device according to one embodiment of the present invention can be applied to, for example, memory devices of a variety of electronic devices (e.g., information terminals, computers, smartphones, e-book readers, digital still cameras, video cameras, video recording/reproducing devices, navigation systems, game machines, and the like). In addition, the memory device can also be used for image sensors, IoT (Internet of Things), healthcare, and the like. Note that here, the computers refer not only to tablet computers, laptop computers, and desktop computers, but also to large computers such as server systems.

An example of an electronic device including a memory device according to one embodiment of the present invention is described. Note that FIG. 39A to FIG. 39J and FIG. 40A to FIG. 40E each illustrate a state where the electronic component 4700 or the electronic component 4730, each of which includes the memory device, is included in an electronic device.

[Cellular Phone]

Figure 39A:
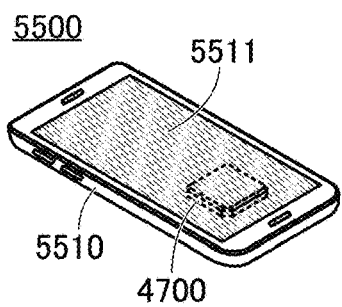
FIG. 39A to FIG. 39J are perspective views and schematic views illustrating examples of electronic devices.

An information terminal 5500 illustrated in FIG. 39A is a cellular phone (smartphone), which is a type of information terminal. The information terminal 5500 includes a housing 5510 and a display portion 5511, and as input interfaces, a touch panel is provided in the display portion 5511 and a button is provided in the housing 5510.

By applying the memory device according to one embodiment of the present invention to the information terminal 5500, the information terminal 5500 can retain a temporary file generated at the time of executing an application (e.g., a web browser's cache or the like).

[Wearable Terminal]

Figure 39B:
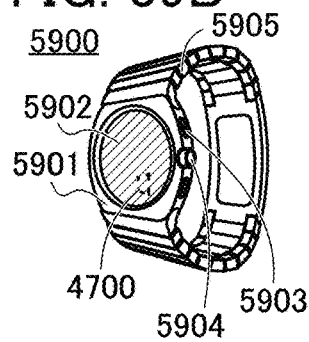

In addition, FIG. 39B illustrates an information terminal 5900 that is an example of a wearable terminal. The information terminal 5900 includes a housing 5901, a display portion 5902, an operation switch 5903, an operation switch 5904, a band 5905, and the like.

Like the information terminal 5500 described above, the wearable terminal can retain a temporary file generated at the time of executing an application by applying the memory device according to one embodiment of the present invention to the wearable terminal.

[Information Terminal]

Figure 39C:
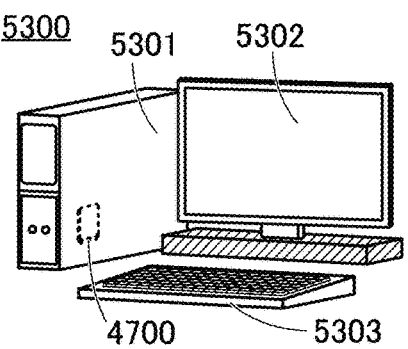

In addition, FIG. 39C illustrates a desktop information terminal 5300. The desktop information terminal 5300 includes a main body 5301 of the information terminal, a display portion 5302, and a keyboard 5303.

Like the information terminal 5500 described above, the desktop information terminal 5300 can retain a temporary file generated at the time of executing an application applying the memory device according to one embodiment of the present invention to the desktop information terminal 5300.

Note that although the smartphone, the wearable terminal, and the desktop information terminal are respectively illustrated in FIG. 39A to FIG. 39C as examples of the electronic device, one embodiment of the present invention can be applied to an information terminal other than a smartphone, a wearable terminal, and a desktop information terminal. Examples of information terminals other than a smartphone, a wearable terminal, and a desktop information terminal include a PDA (Personal Digital Assistant), a laptop information terminal, and a workstation.

[Household Appliance]

Figure 39D:
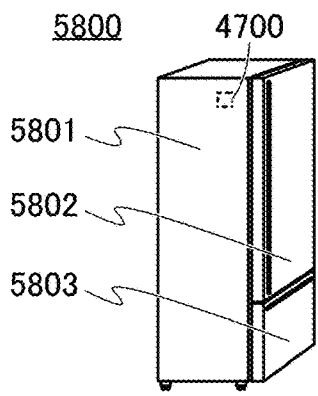

In addition, FIG. 39D illustrates an electric refrigerator-freezer 5800 as an example of a household appliance. The electric refrigerator-freezer 5800 includes a housing 5801, a refrigerator door 5802, a freezer door 5803, and the like. For example, the electric refrigerator-freezer 5800 is an electric refrigerator-freezer that is compatible with IoT (Internet of Things).

The memory device according to one embodiment of the present invention can be applied to the electric refrigerator-freezer 5800. The electric refrigerator-freezer 5800 can transmit and receive information on food stored in the electric refrigerator-freezer 5800 and food expiration dates, for example, to and from an information terminal and the like via the Internet. In the electric refrigerator-freezer 5800, the memory device can retain a temporary file generated at the time of transmitting the information.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, an audiovisual appliance, and the like.

[Game Machine]

Figure 39E:
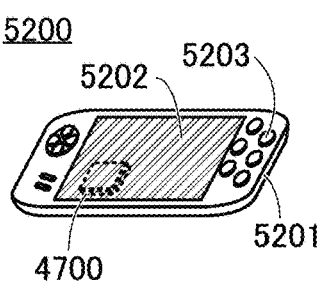

In addition, FIG. 39E illustrates a portable game machine 5200 as an example of a game machine. The portable game machine 5200 includes a housing 5201, a display portion 5202, a button 5203, and the like.

Figure 39F:
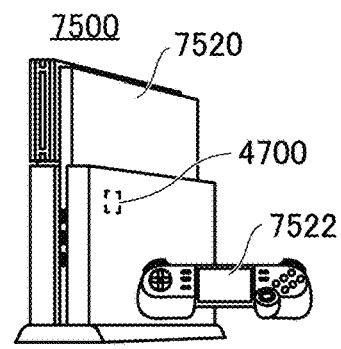

In addition, FIG. 39F illustrates a stationary game machine 7500 as another example of a game machine. The stationary game machine 7500 includes a main body 7520 and a controller 7522. Note that the controller 7522 can be connected to the main body 7520 with or without a wire. Furthermore, although not illustrated in FIG. 39F, the controller 7522 can include a display portion that displays a game image, and an input interface besides a button, such as a touch panel, a stick, a rotating knob, and a sliding knob, for example. Moreover, the shape of the controller 7522 is not limited to that illustrated in FIG. 39F, and the shape of the controller 7522 may be changed in various ways in accordance with the genres of games. For example, for a shooting game such as an FPS (First Person Shooter) game, a gun-shaped controller having a trigger button can be used. As another example, for a music game or the like, a controller having a shape of a musical instrument, audio equipment, or the like can be used. Furthermore, the stationary game machine may include a camera, a depth sensor, a microphone, and the like so that the game player can play a game using a gesture and/or a voice instead of a controller.

In addition, videos displayed on the game machine can be output with a display device such as a television device, a personal computer display, a game display, or a head-mounted display.

The memory device described in the above embodiment is employed for the portable game machine 5200 or the stationary game machine 7500, so that the portable game machine 5200 with low power consumption or the stationary game machine 7500 with low power consumption can be achieved. Moreover, heat generation from a circuit can be reduced owing to low power consumption; thus, the influence of heat generation on the circuit itself, a peripheral circuit, and a module can be reduced.

Moreover, the memory device described in the above embodiment is employed for the portable game machine 5200 or the stationary game machine 7500, so that it is possible to retain a temporary file necessary for arithmetic operation that occurs during game play.

As an example of a game machine, FIG. 39E illustrates a portable game machine. In addition, FIG. 39F illustrates a home-use stationary game machine. Note that an electronic device according to one embodiment of the present invention is not limited thereto. Examples of the electronic device according to one embodiment of the present invention include an arcade game machine installed in entertainment facilities (a game center, an amusement park, and the like), a throwing machine for batting practice installed in sports facilities, and the like.

[Moving Vehicle]

The memory device described in the above embodiment can be used for a motor vehicle, which is a moving vehicle, and around the driver's seat in a motor vehicle.

Figure 39G:
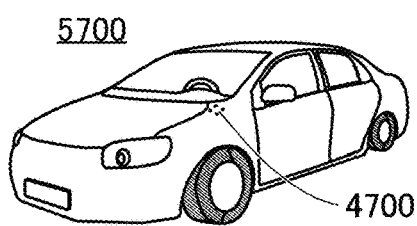

FIG. 39G illustrates a motor vehicle 5700 as an example of a moving vehicle.

An instrument panel that provides various kinds of information by displaying a speedometer, a tachometer, a mileage, a fuel meter, a gearshift state, air-conditioning settings, and the like is provided around the driver's seat in the motor vehicle 5700. In addition, a display device showing the above information may be provided around the driver's seat.

In particular, the display device can compensate for the view obstructed by a pillar or the like, blind areas for the driver's seat, and the like by displaying a video from an imaging device (not illustrated) provided for the motor vehicle 5700, which can increase safety. That is, display of an image from an imaging device provided on the outside of the motor vehicle 5700 can fill in blind areas and increase safety.

The memory device described in the above embodiment can temporarily retain data; thus, the memory device can be used to retain temporary data necessary in an automatic driving system for the motor vehicle 5700 and a system for navigation and risk prediction, for example. The display device may be configured to display temporary information regarding navigation, risk prediction, or the like. Moreover, the memory device may be configured to retain a video of a driving recorder provided in the motor vehicle 5700.

Note that although a motor vehicle is described above as an example of a moving vehicle, the moving vehicle is not limited to a motor vehicle. Examples of moving vehicles include a train, a monorail train, a ship, a flying object (a helicopter, an unmanned aircraft (a drone), an airplane, and a rocket), and the like.

[Camera]

The memory device described in the above embodiment can be employed for a camera.

Figure 39H:
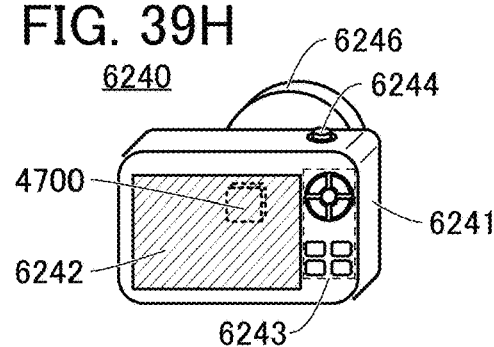

FIG. 39H illustrates a digital camera 6240 as an example of an imaging device. The digital camera 6240 includes a housing 6241, a display portion 6242, operation switches 6243, a shutter button 6244, and the like, and a detachable lens 6246 is attached to the digital camera 6240. Note that here, although the camera 6240 is configured such that the lens 6246 is detachable from the housing 6241 for replacement, the lens 6246 may be integrated with the housing 6241. In addition, the digital camera 6240 can be additionally equipped with a stroboscope, a viewfinder, or the like.

When the memory device described in the above embodiment is employed for the digital camera 6240, the digital camera 6240 with low power consumption can be achieved. Moreover, heat generation from a circuit can be reduced owing to low power consumption; thus, the influence of heat generation on the circuit itself, a peripheral circuit, and a module can be reduced.

[Video Camera]

The memory device described in the above embodiment can be employed for a video camera.

Figure 39I:
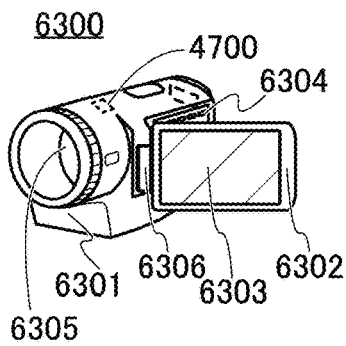

FIG. 39I illustrates a video camera 6300 as an example of an imaging device. The video camera 6300 includes a first housing 6301, a second housing 6302, a display portion 6303, operation switches 6304, a lens 6305, a joint 6306, and the like. The operation switches 6304 and the lens 6305 are provided in the first housing 6301, and the display portion 6303 is provided in the second housing 6302. The first housing 6301 and the second housing 6302 are connected to each other with the joint 6306, and an angle between the first housing 6301 and the second housing 6302 can be changed with the joint 6306. Images displayed on the display portion 6303 may be changed in accordance with the angle at the joint 6306 between the first housing 6301 and the second housing 6302.

When images taken by the video camera 6300 are recorded, the images need to be encoded in accordance with a data recording format. With the use of the above memory device, the video camera 6300 can retain a temporary file generated in encoding.

[ICD]

The memory device described in the above embodiment can be employed for an implantable cardioverter-defibrillator (ICD).

Figure 39J:
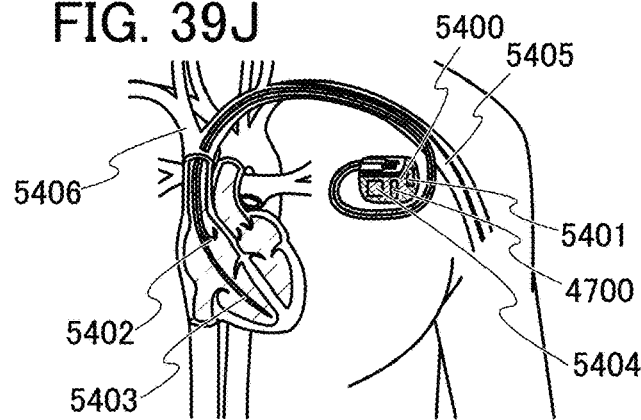

FIG. 39J is a schematic cross-sectional view showing an example of an ICD. An ICD main unit 5400 includes at least a battery 5401, the electronic component 4700, a regulator, a control circuit, an antenna 5404, a wire 5402 reaching a right atrium, and a wire 5403 reaching a right ventricle.

The ICD main unit 5400 is implanted in the body by surgery, and the two wires pass through a subclavian vein 5405 and a superior vena cava 5406 of the human body, with an end of one of the wires placed in the right ventricle and an end of the other wire placed in the right atrium.

The ICD main unit 5400 functions as a pacemaker and paces the heart when the heart rate is not within a predetermined range. In addition, when the heart rate is not recovered by pacing (e.g., when ventricular tachycardia or ventricular fibrillation occurs), treatment with an electrical shock is performed.

The ICD main unit 5400 needs to monitor the heart rate all the time in order to perform pacing and deliver electrical shocks as appropriate. For that reason, the ICD main unit 5400 includes a sensor for measuring the heart rate. In addition, in the ICD main unit 5400, data on the heart rate obtained by the sensor or the like, the number of times the treatment with pacing is performed, and the time taken for the treatment, for example, can be stored in the electronic component 4700.

In addition, the antenna 5404 can receive power, and the battery 5401 is charged with the power. Furthermore, when the ICD main unit 5400 includes a plurality of batteries, safety can be increased. Specifically, even when one of the batteries in the ICD main unit 5400 is dead, the other batteries can function properly; thus, the batteries also function as an auxiliary power source.

In addition to the antenna 5404 capable of receiving power, an antenna that can transmit physiological signals may be included to construct, for example, a system that monitors cardiac activity by checking physiological signals such as a pulse, a respiratory rate, a heart rate, and body temperature with an external monitoring device.

[Expansion Device for PC]

The memory device described in the above embodiment can be employed for a calculator such as a PC (Personal Computer) and an expansion device for an information terminal.

Figure 40A:
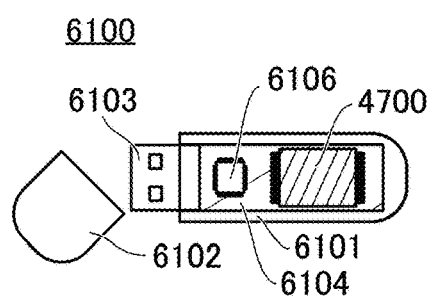
FIG. 40A to FIG. 40E are perspective views and schematic views illustrating examples of electronic devices.

FIG. 40A illustrates, as an example of the expansion device, a portable expansion device 6100 that includes a chip capable of retaining information and is externally provided on a PC. The expansion device 6100 can store information using the chip when connected to a PC with a USB (Universal Serial Bus) or the like, for example. Note that FIG. 40A illustrates the portable expansion device 6100; however, the expansion device according to one embodiment of the present invention is not limited thereto and may be a comparatively large expansion device including a cooling fan or the like, for example.

The expansion device 6100 includes a housing 6101, a cap 6102, a USB connector 6103, and a substrate 6104. The substrate 6104 is held in the housing 6101. The substrate 6104 is provided with a circuit for driving the memory device or the like described in the above embodiment. For example, the substrate 6104 is provided with the electronic component 4700 and a controller chip 6106. The USB connector 6103 functions as an interface for connection to an external device.

[SD Card]

The memory device described in the above embodiment can be employed for an SD card that can be attached to an electronic device such as an information terminal or a digital camera.

Figure 40B:
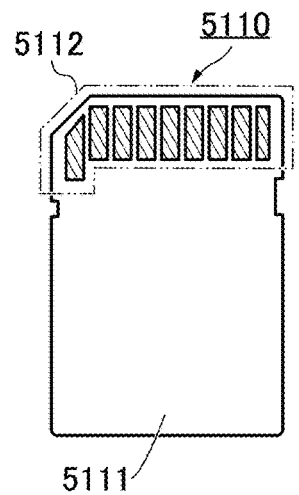
Figure 40C:
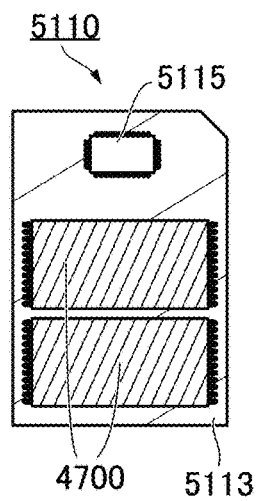

FIG. 40B is a schematic external view of an SD card, and FIG. 40C is a schematic view of the internal structure of the SD card. An SD card 5110 includes a housing 5111, a connector 5112, and a substrate 5113. The connector 5112 functions as an interface for connection to an external device. The substrate 5113 is held in the housing 5111. The substrate 5113 is provided with a memory device and a circuit for driving the memory device. For example, electronic components 4700 and a controller chip 5115 are attached to the substrate 5113. Note that the circuit structures of the electronic components 4700 and the controller chip 5115 are not limited to those described above, and can be changed as appropriate according to circumstances. For example, a write circuit, a row driver, a read circuit, and the like that are provided in an electronic component may be incorporated into the controller chip 5115 instead of the electronic component 4700.

When the electronic components 4700 are provided also on a rear surface side of the substrate 5113, the capacitance of the SD card 5110 can be increased. In addition, a wireless chip with a wireless communication function may be provided on the substrate 5113. This allows wireless communication between an external device and the SD card 5110 and enables data reading and writing from and to the electronic components 4700.

[SSD]

The memory device described in the above embodiment can be employed for an SSD (Solid State Drive) that can be attached to an electronic device such as an information terminal.

Figure 40D:
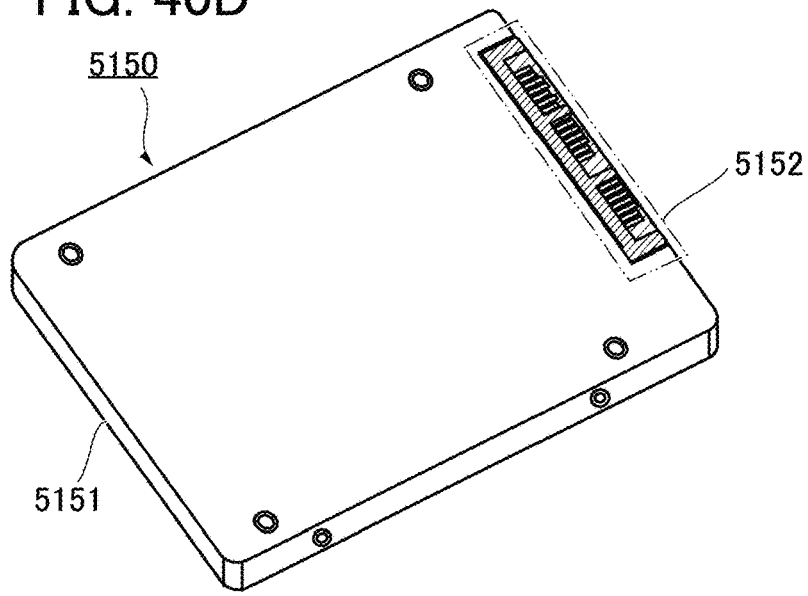
Figure 40E:
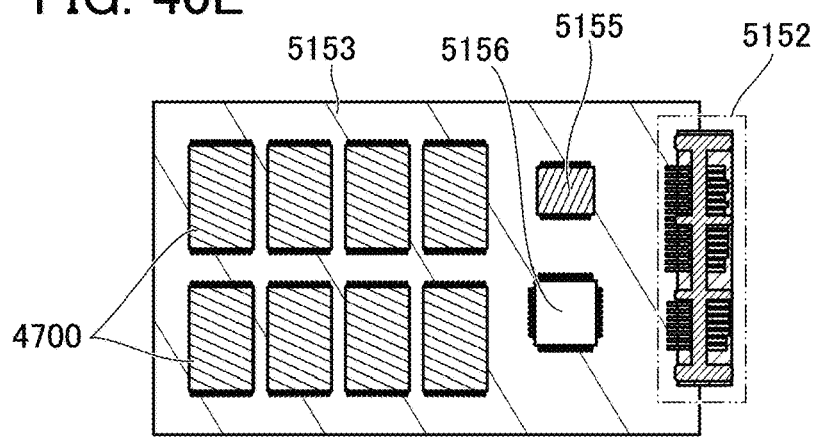

FIG. 40D is a schematic external view of an SSD, and FIG. 40E is a schematic view of the internal structure of the SSD. An SSD 5150 includes a housing 5151, a connector 5152, and a substrate 5153. The connector 5152 functions as an interface for connection to an external device. The substrate 5153 is held in the housing 5151. The substrate 5153 is provided with a memory device and a circuit for driving the memory device. For example, the electronic components 4700, a memory chip 5155, and a controller chip 5156 are attached to the substrate 5153. When the electronic components 4700 are also provided on a rear surface side of the substrate 5153, the capacity of the SSD 5150 can be increased. A work memory is incorporated in the memory chip 5155. For example, a DRAM chip is used as the memory chip 5155. A processor, an ECC circuit, and the like are incorporated in the controller chip 5156. Note that the circuit structures of the electronic components 4700, the memory chip 5155, and the controller chip 5156 are not limited to those described above, and the circuit structures can be changed as appropriate according to circumstances. For example, a memory functioning as a work memory may also be provided in the controller chip 5156.

[Computer]

Figure 41A:
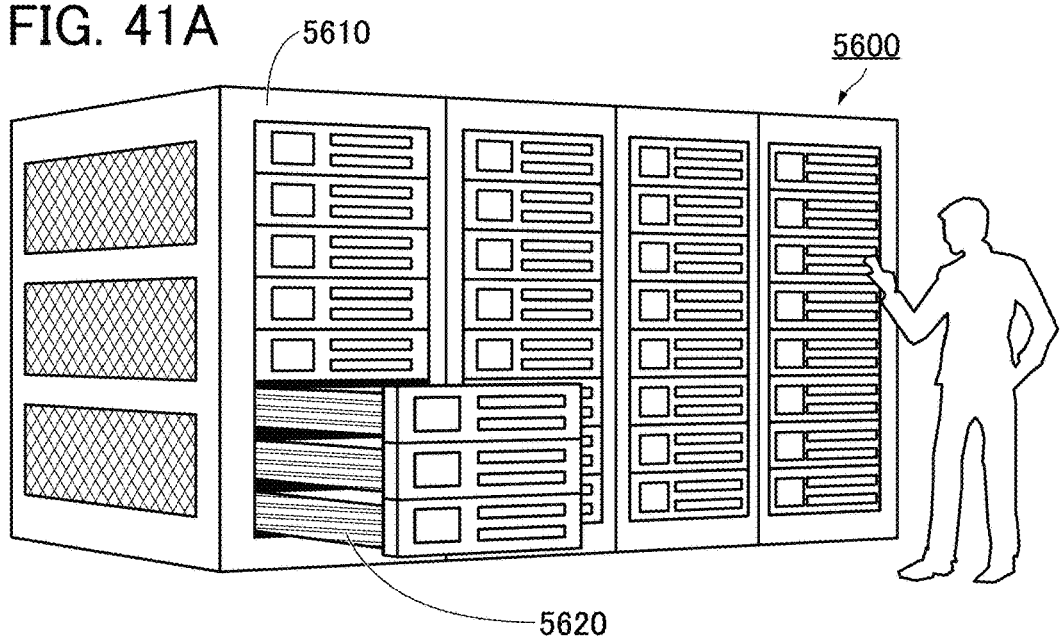
FIG. 41A to FIG. 41C are diagrams illustrating examples of electronic devices.

A computer 5600 illustrated in FIG. 41A is an example of a large computer. In the computer 5600, a plurality of rack mount computers 5620 are stored in a rack 5610.

Figure 41B:
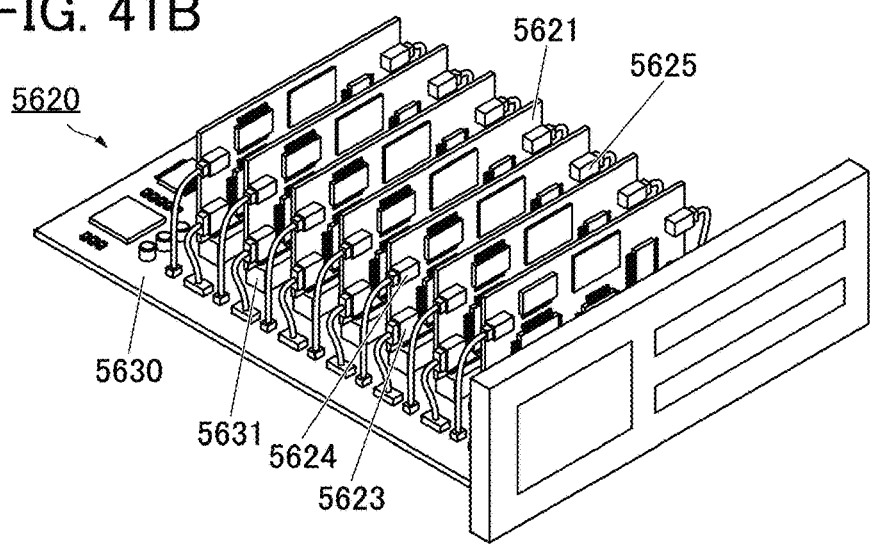

The computer 5620 can have a structure in a perspective view illustrated in FIG. 41B, for example. In FIG. 41B, the computer 5620 includes a motherboard 5630, and the motherboard 5630 includes a plurality of slots 5631 and a plurality of connection terminals. A PC card 5621 is inserted in the slot 5631. In addition, the PC card 5621 includes a connection terminal 5623, a connection terminal 5624, and a connection terminal 5625, each of which is connected to the motherboard 5630.

Figure 41C:
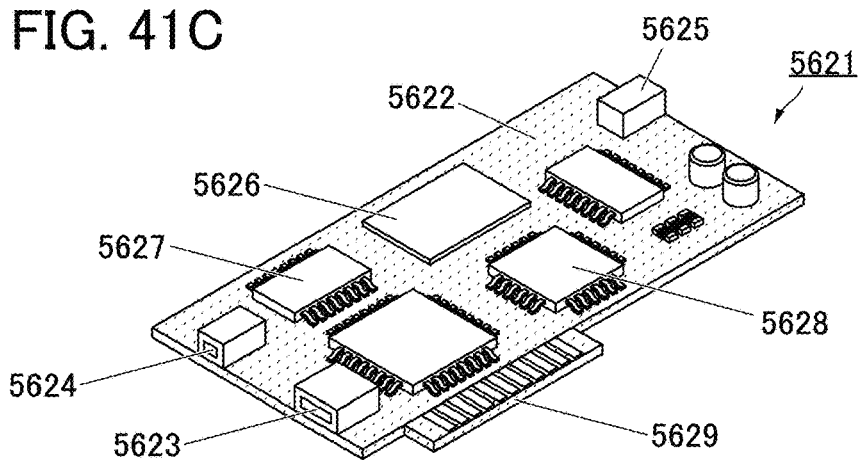

The PC card 5621 illustrated in FIG. 41C is an example of a processing board provided with a CPU, a GPU, a memory device, and the like. The PC card 5621 includes a board 5622. In addition, the board 5622 includes a connection terminal 5623, a connection terminal 5624, a connection terminal 5625, a semiconductor device 5626, a semiconductor device 5627, a semiconductor device 5628, and a connection terminal 5629. Note that FIG. 41C also illustrates semiconductor devices other than the semiconductor device 5626, the semiconductor device 5627, and the semiconductor device 5628, the following description of the semiconductor device 5626, the semiconductor device 5627, and the semiconductor device 5628 is referred to for these semiconductor devices.

The connection terminal 5629 has a shape with which the connection terminal 5629 can be inserted in the slot 5631 of the motherboard 5630, and the connection terminal 5629 functions as an interface for connecting the PC card 5621 and the motherboard 5630. An example of the standard for the connection terminal 5629 is PCIe or the like.

The connection terminal 5623, the connection terminal 5624, and the connection terminal 5625 can serve as, for example, an interface for performing power supply, signal input, or the like to the PC card 5621. As another example, they can serve as an interface for outputting a signal calculated by the PC card 5621. Examples of the standard for each of the connection terminal 5623, the connection terminal 5624, and the connection terminal 5625 include USB (Universal Serial Bus), SATA (Serial ATA), SCSI (Small Computer System Interface), and the like. In the case where video signals are output from the connection terminal 5623, the connection terminal 5624, and the connection terminal 5625, an example of the standard therefor is HDMI (registered trademark) or the like.

The semiconductor device 5626 includes a terminal (not illustrated) for inputting and outputting signals, and when the terminal is inserted in a socket (not illustrated) of the board 5622, the semiconductor device 5626 and the board 5622 can be electrically connected to each other.

The semiconductor device 5627 includes a plurality of terminals, and when the terminals are reflow-soldered, for example, to wirings of the board 5622, the semiconductor device 5627 and the board 5622 can be electrically connected to each other. Examples of the semiconductor device 5627 include an FPGA (Field Programmable Gate Array), a GPU, a CPU, and the like. As the semiconductor device 5627, the electronic component 4730 can be used, for example.

The semiconductor device 5628 includes a plurality of terminals, and when the terminals are reflow-soldered, for example, to wirings of the board 5622, the semiconductor device 5628 and the board 5622 can be electrically connected to each other. An example of the semiconductor device 5628 is a memory device or the like. As the semiconductor device 5628, the electronic component 4700 can be used, for example.

The computer 5600 can also function as a parallel computer. When the computer 5600 is used as a parallel computer, large-scale computation necessary for artificial intelligence learning and inference can be performed, for example.

The semiconductor device according to one embodiment of the present invention is used in a variety of electronic devices or the like described above, so that a reduction in size, an increase in speed, or a reduction in power consumption of the electronic device can be achieved. In addition, since the semiconductor device according to one embodiment of the present invention has low power consumption, heat generation from a circuit can be reduced. Accordingly, it is possible to reduce adverse effects of the heat generation on the circuit itself, a peripheral circuit, and a module. Furthermore, the use of the semiconductor device according to one embodiment of the present invention can achieve an electronic device that operates stably even in a high temperature environment. Thus, the reliability of the electronic devices can be increased.

Figure 42:
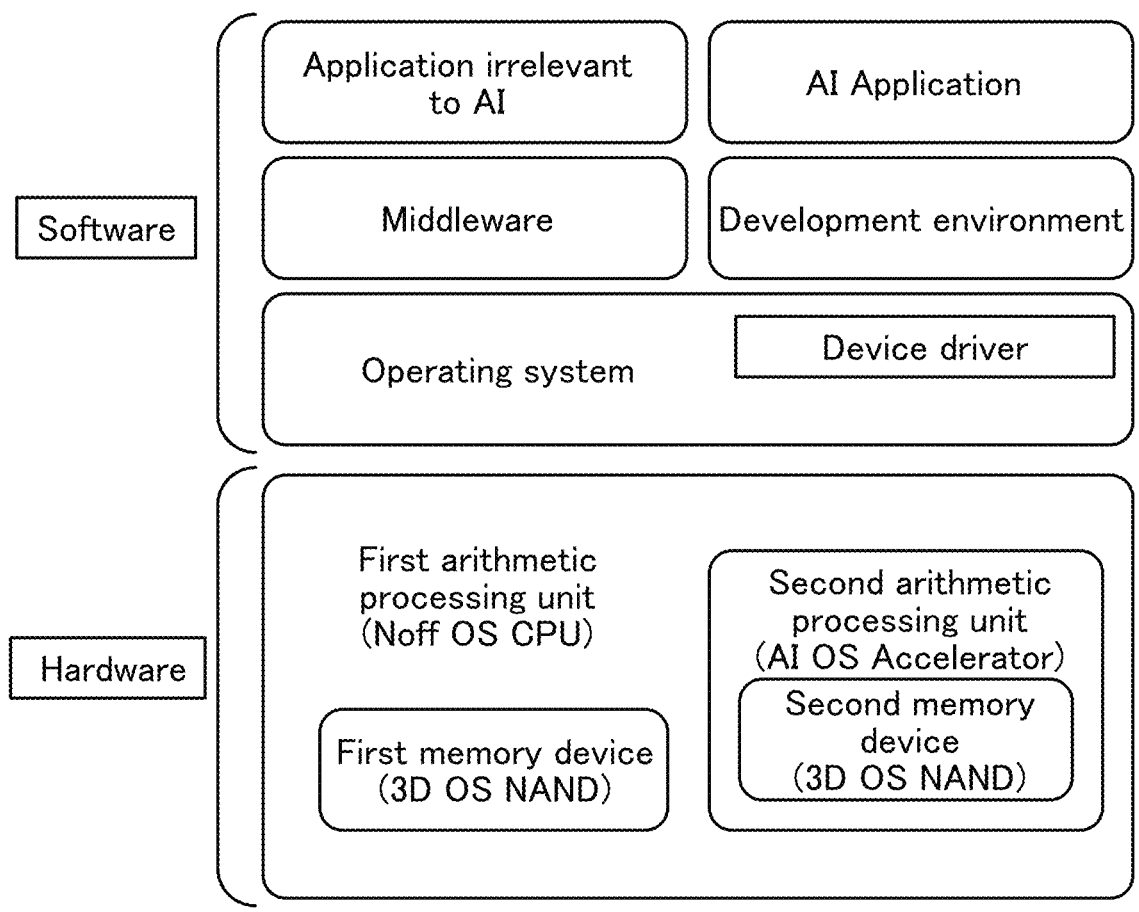
FIG. 42 is a diagram illustrating a structure example of a computer system.

Next, a structure example of a computer system that can be employed for the computer 5600 is described. FIG. 42 is a diagram illustrating a structure example of a computer system 700. The computer system 700 is made of software and hardware. Note that the hardware included in the computer system is sometimes referred to as an information processing device.

Examples of the software included in the computer system 700 include operating systems including device drivers, middleware, a variety of development environments, application programs related to AI (AI Application), and application programs irrelevant to AI (Application).

The device drivers include, for example, application programs for controlling externally connected devices such as an auxiliary memory device, a display device, and a printer.

The hardware included in the computer system 700 includes a first arithmetic processing unit, a second arithmetic processing unit, a first memory device, and the like. In addition, the second arithmetic processing unit includes a second memory device.

As the first arithmetic processing unit, a central processing unit such as an Noff OS CPU is preferably used, for example. The Noff OS CPU includes a memory means using OS transistors (e.g., a nonvolatile memory), and has a function of storing necessary data in the memory means and stopping power supply to the central processing unit when it does not need to operate. The use of the Noff OS CPU as the first arithmetic processing unit can reduce the power consumption of the computer system 700.

As the second arithmetic processing unit, a GPU, an FPGA, or the like can be used, for example. Note that as the second arithmetic processing unit, an AI OS Accelerator is preferably used. The AI OS Accelerator is composed of OS transistors and includes an arithmetic means such as a product-sum operation circuit. The power consumption of the AI OS Accelerator is lower than that of a common GPU or the like. The use of the AI OS Accelerator as the second arithmetic processing unit can reduce the power consumption of the computer system 700.

As the first memory device and the second memory device, the memory device according to one embodiment of the present invention is preferably used. For example, the 3D OS NAND memory device is preferably used. The 3D OS NAND memory device can function as a cache, a main memory, and storage. In addition, the use of the 3D OS NAND memory device facilitates fabrication of a non-von Neumann computer system.

The power consumption of the 3D OS NAND memory device is lower than that of a 3D NAND memory device using Si transistors. The use of the 3D OS NAND memory device as the memory devices can reduce the power consumption of the computer system 700. In addition, the 3D OS NAND memory device can function as a universal memory, so that the number of components included in the computer system 700 can be reduced.

When the semiconductor device constituting the hardware is configured with a semiconductor device including OS transistors, the hardware including the central processing unit, the arithmetic processing unit, and the memory device can be easily monolithic. Making the hardware monolithic facilitates a further reduction in power consumption as well as a reduction in size, weight, and thickness.

This embodiment can be combined as appropriate with any of the other embodiments and the like described in this specification.

Embodiment 7

A normally-off CPU (also referred to as "Noff-CPU") can be achieved using the OS memory described in this specification and the like. Note that the Noff-CPU is an integrated circuit including a normally-off transistor, which is in a non-conducting state (also referred to as an off state) even when gate voltage is 0 V.

In the Noff-CPU, power supply to a circuit that does not need to operate can be stopped so that the circuit can be brought into a standby state. The circuit brought into the standby state because of the stop of power supply does not consume power. Thus, the power usage of the Noff-CPU can be minimized. Moreover, the Noff-CPU can retain information necessary for operation, such as setting conditions, for a long time even when power supply is stopped. The return from the standby state requires only restart of power supply to the circuit and does not require rewriting of setting conditions or the like. In other words, high-speed return from the standby state is possible. As described here, the power consumption of the Noff-CPU can be reduced without a significant decrease in operation speed.

The Noff-CPU can be suitably used for a small-scale system such as an IoT (Internet of Things) end device (also referred to as an "endpoint microcomputer") 803 in the IoT field, for example.

Figure 43:
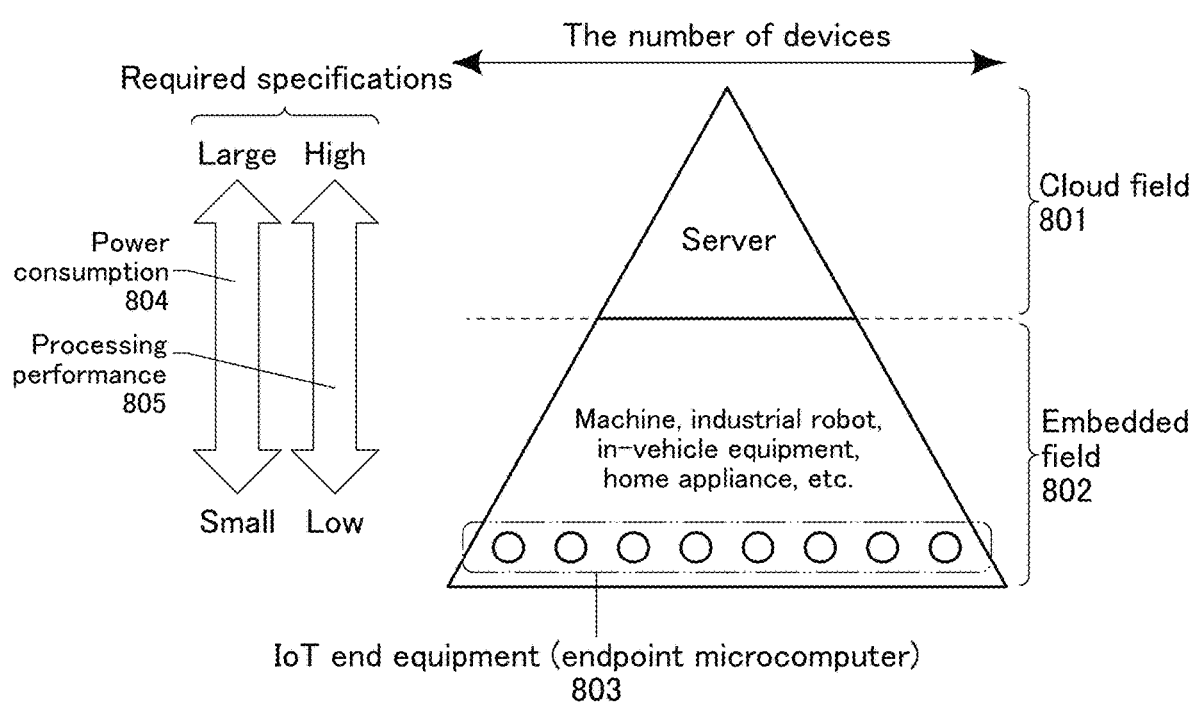
FIG. 43 is a diagram illustrating a hierarchical structure of an IoT network and trends of required specifications.

FIG. 43 shows a hierarchical structure of an IoT network and tendencies of required specifications. FIG. 43 shows power consumption 804 and processing performance 805 as the required specifications. The hierarchical structure of the IoT network is roughly divided into a cloud field 801 at the upper level and an embedded field 802 at the lower level. The cloud field 801 includes a server, for example. The embedded field 802 includes a machine, an industrial robot, an in-vehicle device, and a home appliance, for example.

Higher processing performance is required rather than lower power consumption at the upper level. Thus, a high-performance CPU, a high-performance GPU, a large-scale SoC (System on a Chip), and the like are used in the cloud field 801. Furthermore, lower power consumption is required rather than higher processing performance at the lower level where the number of devices is explosively increased. The semiconductor device according to one embodiment of the present invention can be suitably used for a communication device in the IoT end device that needs to have low power consumption.

Note that an "endpoint" refers to an end region of the embedded field 802. Examples of a device used in the endpoint include microcomputers used in a factory, a home appliance, infrastructure, agriculture, and the like.

Figure 44:
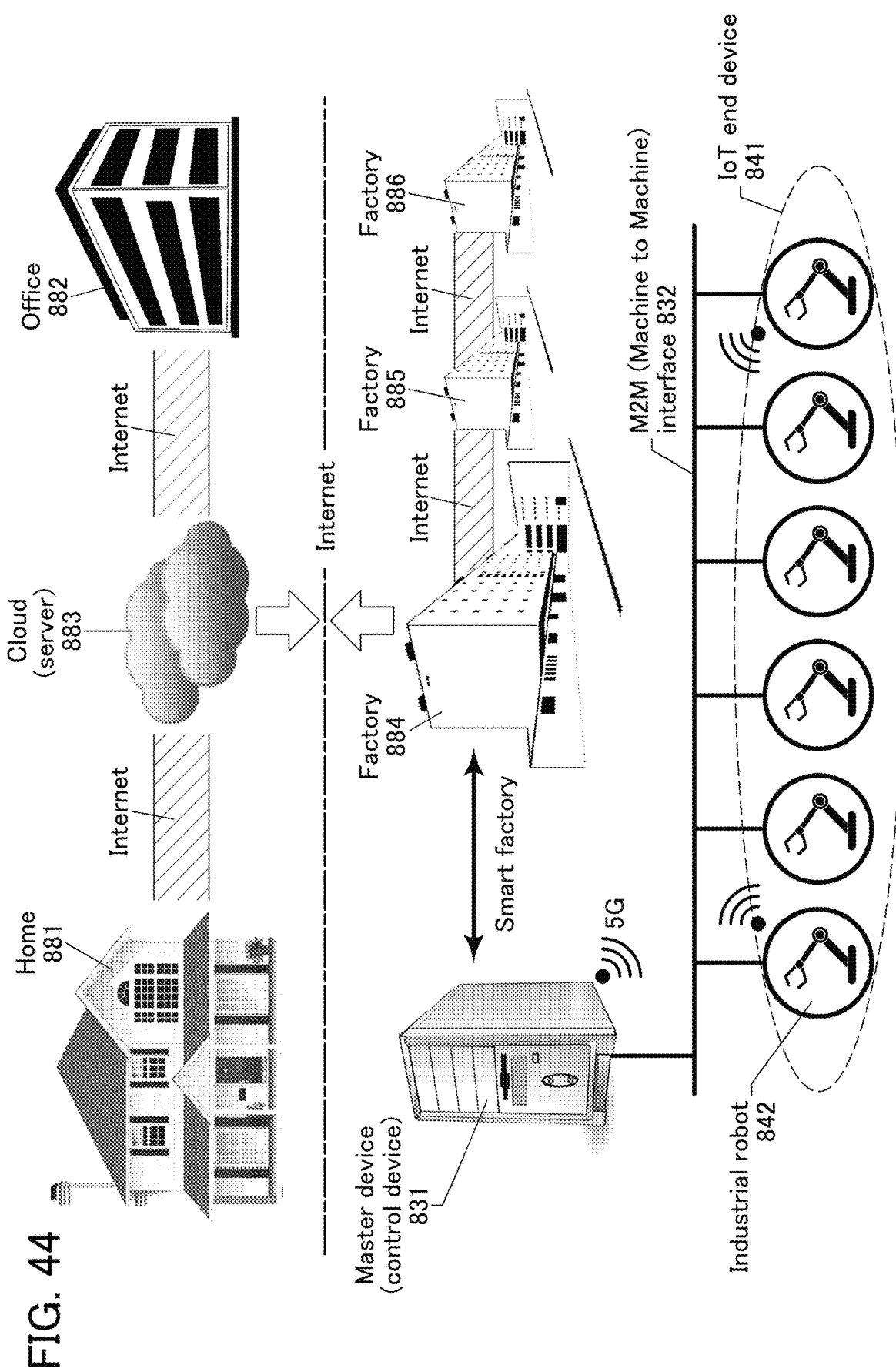
FIG. 44 is an image diagram of factory automation.

FIG. 44 shows an image diagram of factory automation as an application example of the endpoint microcomputer. A factory 884 is connected to a cloud 883 (server) through Internet connection. In addition, the cloud 883 is connected to a home 881 and an office 882 through Internet connection (Internet). The Internet connection may be either wired communication or wireless communication. In the case of wireless communication, for example, wireless communication based on a communication standard such as the fourth-generation mobile communication system (4G) or the fifth-generation mobile communication system (5G) can be performed using the semiconductor device according to one embodiment of the present invention for a communication device. Furthermore, the factory 884 may be connected to a factory 885 and a factory 886 through Internet connection.

The factory 884 includes a master device (control device) 831. The master device 831 is connected to the cloud 883 and has a function of transmitting and receiving information. The master device 831 is also connected to a plurality of industrial robots 842 included in an IoT end device 841 through a M2M (Machine to Machine) interface 832. As the M2M interface 832, for example, industrial Ethernet ("Ethernet" is a registered trademark), which is a kind of wired communication, or local 5G, which is a kind of wireless communication, may be used.

A manager of the factory can know the operation status or the like from the home 881 or the office 882 connected to the factory 884 through the cloud 883. In addition, the manager can check wrong items and part shortage, instruct a storage space, and measure takt time, for example.

In recent years, IoT has been globally introduced into factories, under the name "Smart Factory." Smart Factory has been reported to enable not only simple examination and inspection by an endpoint microcomputer but also detection of failures and prediction of abnormality, for example.

The total power consumption of a small-scale system such as an endpoint microcomputer during operation is often small; thus, the proportion of the power consumption of the CPU tends to be large. For that reason, for a small-scale system such as an endpoint microcomputer, a power reduction effect in a standby operation by the Noff-CPU becomes large. Meanwhile, although the embedded field of IoT sometimes requires quick response, the use of the Noff-CPU achieves high-speed return from a standby state.

Note that this embodiment can be combined as appropriate with any of the other embodiments, Example, and the like described in this specification.

EXAMPLE

The write operation and the erase operation of the memory string according to one embodiment of the present invention are examined by device simulation.

Figure 45:
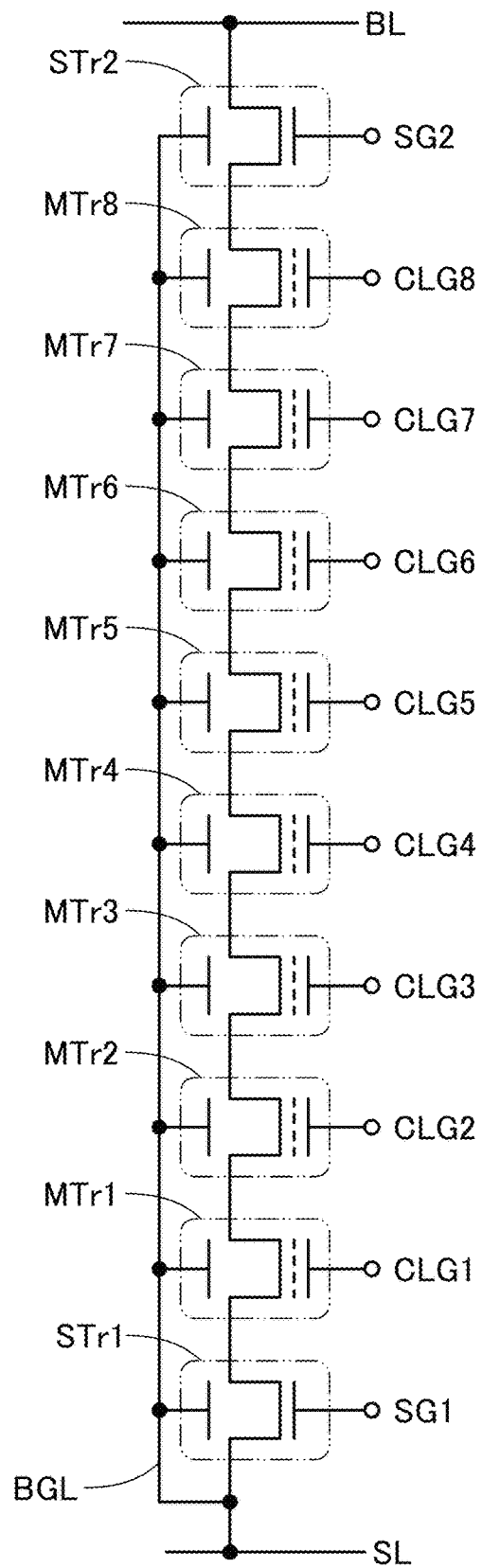
FIG. 45 is an equivalent circuit diagram of a memory string assumed in device simulation.

FIG. 45 is an equivalent circuit of a memory string MS assumed in device simulation. The memory string MS has a structure where a transistor STr1, transistors MTr1 to MTr8, and a transistor STr2 are connected in series. A gate of the transistor STr1 is electrically connected to a terminal SG1, gates of the transistors MTr1 to MTr8 are electrically connected to terminals CLG1 to CLG8, respectively, and a gate of the transistor STr2 is electrically connected to a terminal SG2. In addition, of both ends of the memory string MS, the end on the transistor STr2 side is connected to the wiring BL functioning as a bit line, and the end on the transistor STr1 side is connected to the wiring SL functioning as a source line. All transistors included in the memory string MS each include a back gate BG, and the back gate BG is electrically connected to the wiring SL.

Note that the structure of the memory string MS described in this example corresponds to the structure of the memory string 100A described in the above embodiment. In the memory string MS, the transistors STr1 and STr2 correspond to the transistor TrS1 and the transistor TrS2, respectively. Thus, the transistor STr1 and the transistor STr2 function as selection transistors. The transistors MTr1 to MTr8 correspond to the transistor Tr_1 to the transistor Tr_8, respectively. Accordingly, the transistors MTr1 to MTr8 function as memory cells (also referred to as "memory transistors").

Figure 46:
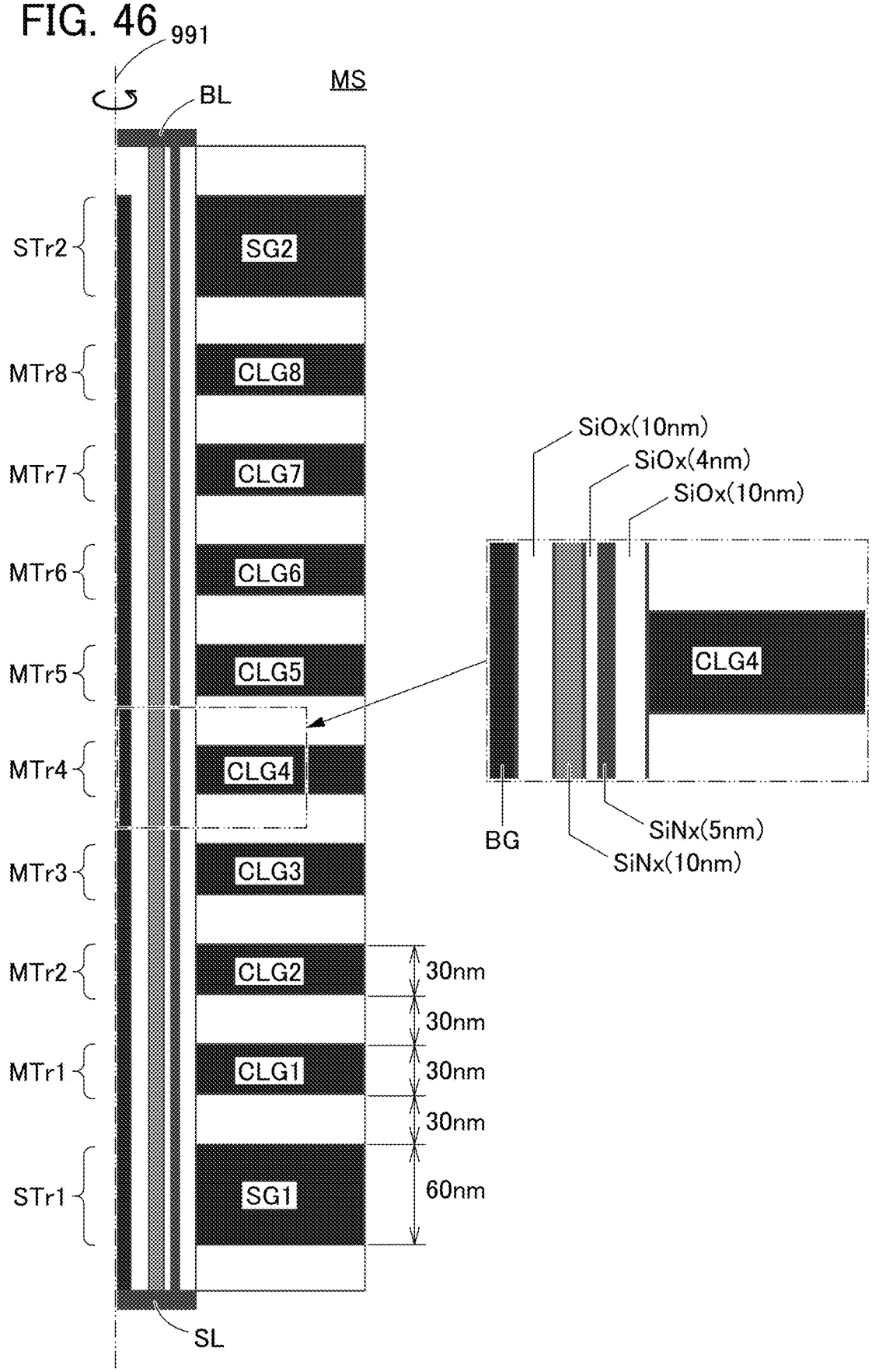
FIG. 46 is a cross-sectional view of the memory string assumed in the device simulation.

FIG. 46 is a cross-sectional view of the memory string MS assumed in the device simulation. TCAD Sentaurus of Synopsys Inc. was used for the device simulation. With the use of a Sentaurus cylindrical command, a cylindrical structure was assumed in which a two-dimensional structure illustrated in FIG. 46 was rotated 360° with an axis 991 used as a central axis.

For a semiconductor where a channel of a transistor included in the memory string MS is formed, an In—Ga—Zn oxide (IGZO) is assumed. In addition, the donor concentration of IGZO is assumed to be $1 \times 10^{17}$ cm$^{-3}$.

An enlarged view of part of the memory string MS is illustrated in FIG. 46. The memory string MS includes SiO$_x$ (4 nm) that functions as a tunnel layer, SiN$_x$ (5 nm) that functions as a charge accumulation layer, and SiO$_x$ (10 nm) that functions as a block layer.

In this example, the channel length (also referred to as "L") of each of the transistors MTr1 to MTr8 is assumed to be 30 nm. The channel length L of each of the transistors STr1 and STr2 is assumed to be 60 nm.

The work function of each of the gates SG1, SG2, and CG1 to CGT8 is assumed to be 4.6 eV, and an ohmic contact is assumed to be made between IGZO and each of the wiring BL and the source line SL. The other parameters and physical property values assumed in the device simulation are shown in Table 1.

TABLE 1

| | IGZO | SiOx | SiNx |
|---|---|---|---|
| Eg [eV] | 3 | 9 | 5 |
| Electron affinity [eV] | 4.6 | 0.9 | 1.9 |
| Relative permittivity | 15 | 3.9 | 7.5 |
| Electron mobility [cm$^2$/Vs] | 10 | — | 1.0E−0.5 |
| Hole mobility [cm$^2$/Vs] | 0.01 | — | 1.0E−0.5 |
| Nc [1/cm$^3$] | 5.0E+18 | — | 2.5E+19 |
| Nv [1/cm$^3$] | 5.0E+18 | — | 2.5E+19 |

<Simulation of Data Write Operation and Erase Operation>

Figure 47A:
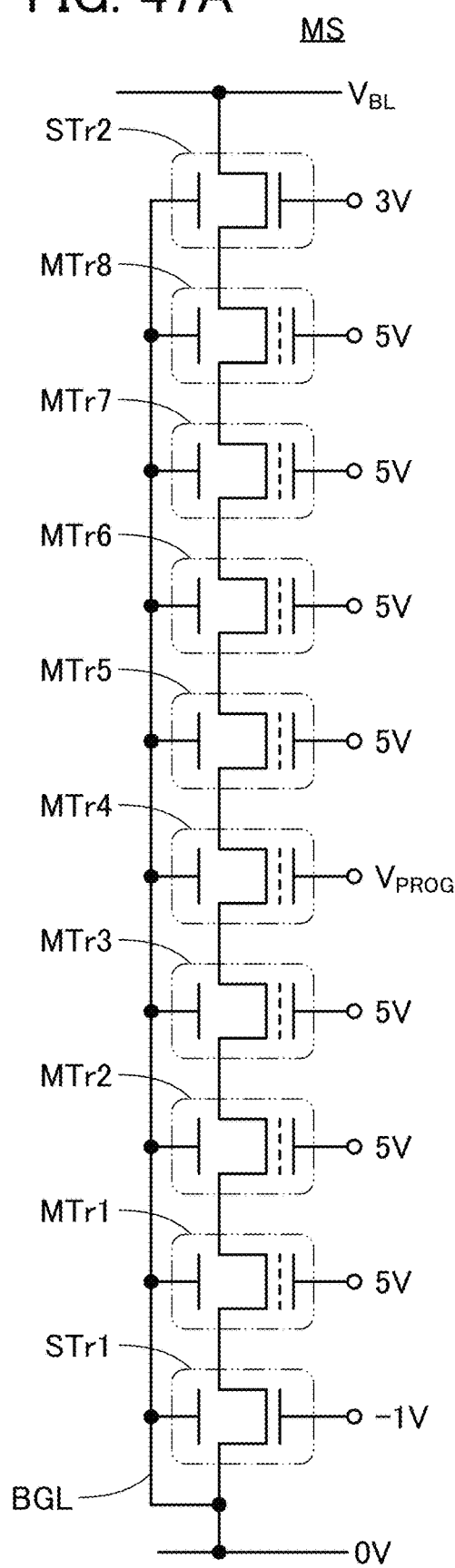
FIG. 47A is a circuit diagram for describing a write operation.
Figure 47B:
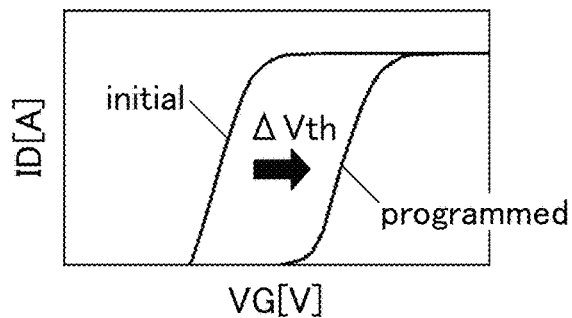
FIG. 47B is a diagram for describing changes in the threshold voltage of a memory transistor before and after writing.

FIG. 47A is an equivalent circuit of the memory string MS. FIG. 47A shows voltage in the write operation. In FIG. 47A, VPROG represents write voltage. The time for applying $V_{PROG}$ is 0.3 milliseconds. In this example, negative charge is written to the charge accumulation layer of the transistor MTr4, and the threshold voltage change (ΔVth) of the transistor MTr4 before (initial) and after (programmed) the writing is calculated (see FIG. 47B).

Figure 48A:
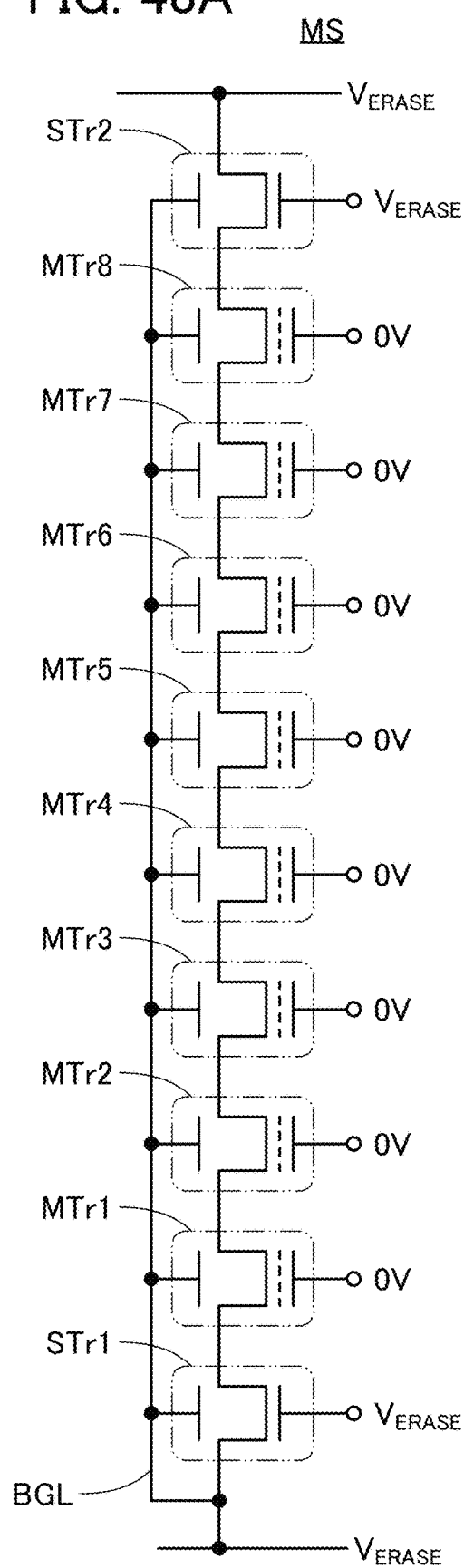
FIG. 48A is a circuit diagram for describing an erase operation.
Figure 48B:
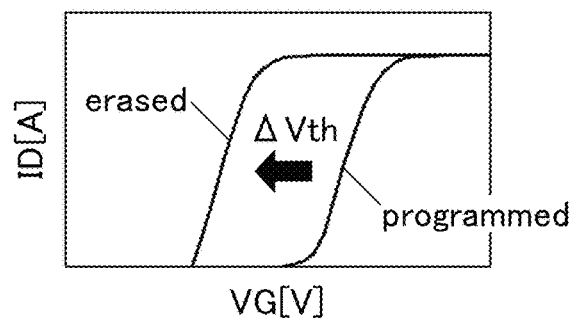
FIG. 48B is a diagram for describing changes in the threshold voltage of the memory transistor before and after erasing.

FIG. 48A is an equivalent circuit of the memory string MS. FIG. 48A shows voltage in the erase operation. In FIG. 48A, VERASE represents erase voltage. The time for applying VERASE is 3 milliseconds. In this example, negative charge in the charge accumulation layer of the transistor MTr4 is assumed in advance, and the threshold voltage change (ΔVth) of the transistor MTr4 before (programmed) and after (erased) erasing is calculated (FIG. 48B).

Figure 49A:
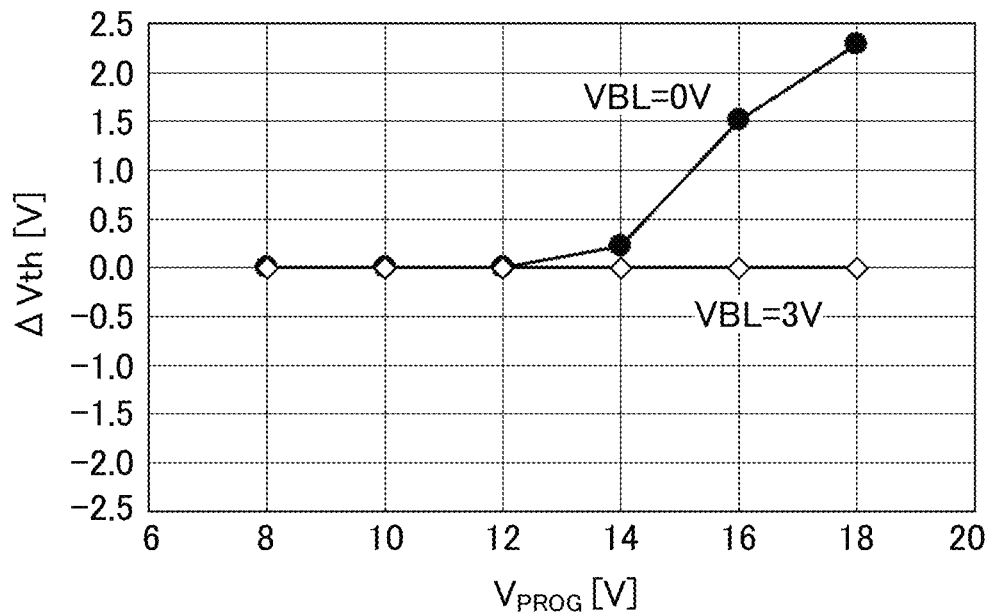
FIG. 49A and FIG. 49B are graphs showing calculation results of the device simulation.

FIG. 49A shows simulation results of the write operation. The horizontal axis in FIG. 49A represents $V_{PROG}$ in FIG. 47A, and the vertical axis represents ΔVth in FIG. 47B. In addition, FIG. 49A shows calculation results in the case where the potential (VBL) of the wiring BL is 0 V (VBL=0V) and 3 V (VBL=3 V). VBL=0V corresponds to data "1" writing, and VBL=3V corresponds to data "0" writing.

From FIG. 49A, in the case of VBL=0 V, it can be confirmed that ΔVth shifts in the positive direction in accordance with the value of $V_{PROG}$ when $V_{PROG}$ exceeds 12 V. In contrast, in the case of VBL=3 V, it can be confirmed that ΔVth does not shift regardless of the value of $V_{PROG}$.

That is, it can be confirmed that data "1" is written to the transistor MTr4 when VBL=0 V, and data "0" is written to the transistor MTr4 when VBL=3 V.

Figure 49B:
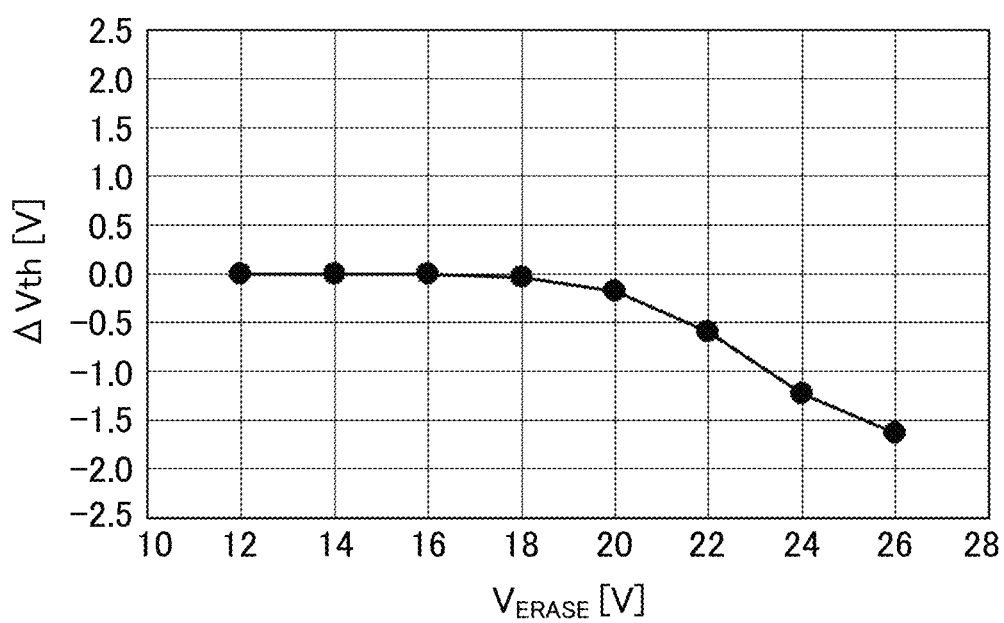

FIG. 49B shows simulation results of the erase operation. In FIG. 49B, the horizontal axis represents $V_{ERASE}$ in FIG. 48A, and the vertical axis represents ΔVth in FIG. 48B.

From FIG. 49B, it can be confirmed that ΔVth shifts in the negative direction in accordance with the value of $V_{ERASE}$ when $V_{ERASE}$ exceeds 18 V. That is, erasing of charge written to the transistor MTr4 can be confirmed.

Accordingly, from the results of the device simulation shown in this example, it can be confirmed that data writing and erasing are performed correctly in the memory string according to one embodiment of the present invention.

REFERENCE NUMERALS

100: memory string, 101: conductor, 102: insulator, 103: conductor, 104: conductor, 105: insulator, 106: conductor, 107: insulator, 108: conductor, 109: wiring, 110: structure body, 111: insulator, 112: semiconductor, 113: insulator, 114: functional layer, 115: insulator, 121: insulator, 122: conductor, 123: insulator, 124: conductor, 125: conductor, 126: insulator, 131: central axis, 136: insulator

The invention claimed is:

1. A semiconductor device comprising:
a first conductor extending in a first direction; and
a structure body extending in a second direction,
wherein the structure body comprises a second conductor, an oxide semiconductor, a functional layer, a first insulator, a second insulator, and a third insulator,
wherein the second conductor is electrically connected to the oxide semiconductor,
wherein in an intersection portion of the first conductor and the structure body, the first insulator, the oxide semiconductor, the second insulator, the functional layer, and the third insulator are concentrically placed outside the second conductor, and
wherein in the intersection portion, the third insulator is thicker than the second insulator.

2. The semiconductor device according to claim 1, wherein the first direction is a direction orthogonal to the second direction.

3. The semiconductor device according to claim 1, wherein the intersection portion functions as a memory cell.

4. The semiconductor device according to claim 1, wherein the functional layer functions as a charge accumulation layer.

5. The semiconductor device according to claim 1, wherein the functional layer is an insulator.

6. The semiconductor device according to claim 5, wherein the functional layer contains nitrogen.

7. The semiconductor device according to claim 1, wherein the functional layer is a semiconductor.

8. The semiconductor device according to claim 1, wherein the functional layer contains silicon.

9. The semiconductor device according to claim 1, wherein the oxide semiconductor contains at least one of indium and zinc.

10. An electronic device comprising:
the semiconductor device according to claim 1; and
at least one of an operation switch, a battery, and a display portion.

11. A semiconductor device comprising:
n-layer first conductors extending in a first direction, where n is an integer greater than or equal to 2; and
a structure body extending in a second direction,
wherein the structure body comprises a second conductor, an oxide semiconductor, a functional layer, a first insulator, a second insulator, and a third insulator,
wherein the second conductor is electrically connected to the oxide semiconductor,
wherein in each of intersection portions of the n-layer first conductors and the structure body, the first insulator, the oxide semiconductor, the second insulator, the functional layer, and the third insulator are concentrically placed outside the second conductor, and
wherein in each of the intersection portions, the third insulator is thicker than the second insulator.

12. The semiconductor device according to claim 11, wherein the first direction is a direction orthogonal to the second direction.

13. The semiconductor device according to claim 11, wherein the intersection portion functions as a memory cell.

14. The semiconductor device according to claim 11, wherein the functional layer functions as a charge accumulation layer.

15. The semiconductor device according to claim 11, wherein the functional layer is an insulator.

16. The semiconductor device according to claim 15, wherein the functional layer contains nitrogen.

17. The semiconductor device according to claim 11, wherein the functional layer is a semiconductor.

18. The semiconductor device according to claim 11, wherein the functional layer contains silicon.

19. The semiconductor device according to claim 11, wherein the oxide semiconductor contains at least one of indium and zinc.

20. An electronic device comprising:
the semiconductor device according to claim 2; and
at least one of an operation switch, a battery, and a display portion.

21. A driving method of a semiconductor device comprising:
n-layer first conductors extending in a first direction, where n is an integer greater than or equal to 2; and
a structure body extending in a second direction,
wherein the structure body comprises a second conductor, an oxide semiconductor, a functional layer, a first insulator, a second insulator, and a third insulator,
wherein the second conductor is electrically connected to the oxide semiconductor, wherein in each of intersection portions of the n-layer first conductors and the structure body, the first insulator, the oxide semiconductor, the second insulator, the functional layer, and the third insulator are concentrically placed outside the second conductor, the method comprising:

a first operation of supplying a first potential to the n-layer first conductors and supplying a second potential to the second conductor; and a second operation of supplying a third potential to an i-th-layer first conductor, where i is an integer greater than or equal to 1 and less than or equal to n, supplying a fourth potential to each of the n-layer first conductors excluding the i-th-layer first conductor, and supplying the first potential to the second conductor, wherein the second operation is performed after the first operation.

22. The driving method of the semiconductor device according to claim 21, wherein a potential difference between the first potential and the second potential is greater than or equal to 2 times and less than or equal to 6 times a potential difference between the first potential and the fourth potential, and wherein a potential difference between the first potential and the third potential is greater than or equal to 2 times and less than or equal to 4 times the potential difference between the first potential and the fourth potential.

\* \* \* \* \*